United States Patent
Chou et al.

(10) Patent No.: US 11,912,816 B2
(45) Date of Patent: Feb. 27, 2024

(54) POLYMER AND LIGHT-EMITTING DEVICE

(71) Applicant: INDUSTRIAL TECHNOLOGY RESEARCH INSTITUTE, Hsinchu (TW)

(72) Inventors: Chin-Hui Chou, Zhudong Township (TW); Han-Cheng Yeh, Taipei (TW); Jia-Lun Liou, Zhubei (TW); Mei-Rurng Tseng, Zhubei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 317 days.

(21) Appl. No.: 17/243,088

(22) Filed: Apr. 28, 2021

(65) Prior Publication Data
US 2022/0372211 A1  Nov. 24, 2022

(51) Int. Cl.
*C08G 61/12* (2006.01)
*C08G 61/02* (2006.01)
(Continued)

(52) U.S. Cl.
CPC ............. *C08G 61/12* (2013.01); *C08G 61/02* (2013.01); *H10K 85/1135* (2023.02);
(Continued)

(58) Field of Classification Search
CPC ................... C08G 61/12; C08G 61/02; C08G 2261/3162; C08G 2261/76;
(Continued)

(56) References Cited

U.S. PATENT DOCUMENTS

| 8,580,393 B2 | 11/2013 | Mizuki et al. |
| 9,159,927 B2 | 10/2015 | Johansson et al. |

(Continued)

FOREIGN PATENT DOCUMENTS

| CN | 105885020 A | 8/2016 |
| CN | 107926094 A | 4/2018 |

(Continued)

OTHER PUBLICATIONS

Office Action dated Oct. 5, 2021 in corresponding TW application No. 110115290.

(Continued)

*Primary Examiner* — Shane Fang
(74) *Attorney, Agent, or Firm* — Birch, Stewart, Kolasch & Birch, LLP

(57) ABSTRACT

A polymer and a light-emitting device employing the same are provided. The polymer includes a first repeat unit with a structure represented by Formula (I):

Formula (I)

(Continued)

wherein the definitions of $R^1$, $R^2$, $A^1$, $A^2$, $A^3$, and $Z^1$ and n are as defined in the specification. At least one of $A^1$, $A^2$, and $A^3$ is not hydrogen.

16 Claims, 1 Drawing Sheet

(51) Int. Cl.
- *H10K 85/10* (2023.01)
- *H10K 50/11* (2023.01)
- *H10K 101/10* (2023.01)
- *H10K 101/40* (2023.01)

(52) U.S. Cl.
CPC ............... *C08G 2261/3142* (2013.01); *C08G 2261/3162* (2013.01); *C08G 2261/3241* (2013.01); *C08G 2261/3243* (2013.01); *C08G 2261/411* (2013.01); *C08G 2261/95* (2013.01); *H10K 50/11* (2023.02); *H10K 2101/10* (2023.02); *H10K 2101/40* (2023.02)

(58) Field of Classification Search
CPC ........ C08G 2261/95; C08G 2261/3142; C08G 2261/3241; C08G 2261/3243; C08G 2261/411; H10K 85/1135; H10K 2101/10; H10K 2101/40; H10K 50/11; C08L 79/02; H01L 51/0039

See application file for complete search history.

(56) References Cited

U.S. PATENT DOCUMENTS

| | | | |
|---|---|---|---|
| 9,318,715 | B2 | 4/2016 | Wang |
| 10,270,035 | B2 | 4/2019 | Iida et al. |
| 10,439,140 | B2 | 10/2019 | Radu et al. |
| 10,636,973 | B2 | 4/2020 | Takahiro et al. |
| 2011/0017983 | A1* | 1/2011 | Mizuki ............... H10K 85/113 528/380 |
| 2013/0150527 | A1 | 6/2013 | Schulte et al. |
| 2014/0151677 | A1 | 6/2014 | Shiomi et al. |
| 2016/0133842 | A1 | 5/2016 | Fujiyama et al. |
| 2021/0288258 | A1* | 9/2021 | Tsuji ..................... C09K 11/06 |

FOREIGN PATENT DOCUMENTS

| | | |
|---|---|---|
| CN | 108003365 A | 5/2018 |
| CN | 108431173 A | 8/2018 |
| CN | 110760056 A | 2/2020 |
| CN | 110760164 A | 2/2020 |
| CN | 111029474 A | 4/2020 |
| KR | 10-2012-0052063 A | 5/2012 |
| KR | 20190048103 A | 5/2019 |
| TW | I500653 B | 9/2015 |
| TW | I677515 B | 11/2019 |
| WO | WO 2019/128762 A1 | 7/2019 |

OTHER PUBLICATIONS

Chinese Office Action and Search Report dated Jul. 24, 2023 for Application No. 202110488829.0.

* cited by examiner

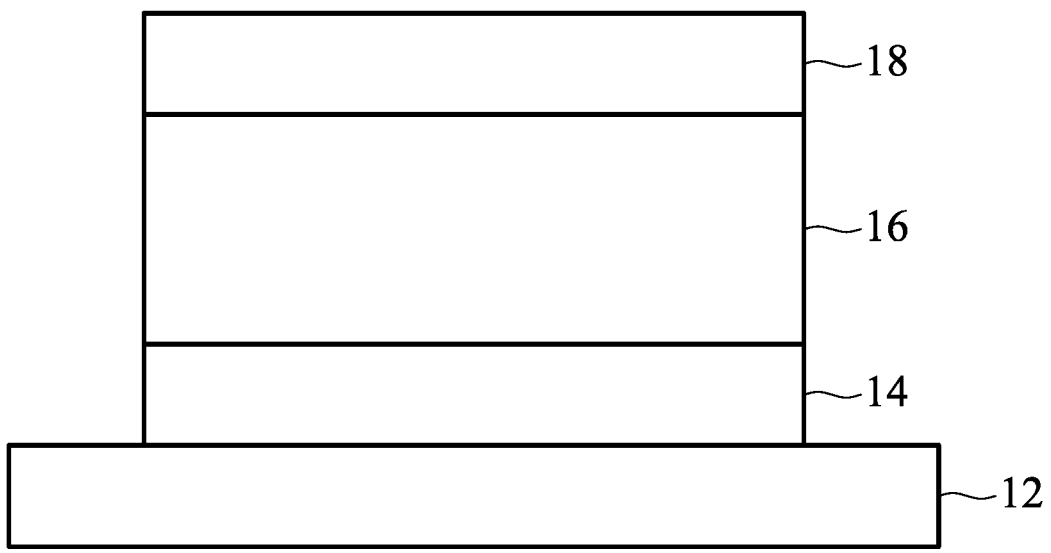

POLYMER AND LIGHT-EMITTING DEVICE

TECHNICAL FIELD

The disclosure relates to a polymer and a light-emitting device.

BACKGROUND

Organic electroluminescent devices have superior characteristics, such as low driving voltage (e.g., 10V or less), wide viewing angles, rapid response time and high contrast, making them preferable to liquid-crystal displays (LCDs), plasma display panels (PDPs) and inorganic electroluminescent display devices. Based on these advantages, organic electroluminescent devices can be used as pixels in graphic displays, television image displays and surface light sources. In addition, organic electroluminescent devices can be fabricated on transparent flexible substrates, which can reduce thickness and weight and have good color representation. In recent years, organic electroluminescent devices have come to be used widely in flat panel displays (FPDs).

In organic electroluminescent device, the active layer (containing a light-emitting material) is sandwiched between a hole transport layer and an electron transport layer, and an anode and a cathode are attached to the outside of the active layer (light-emitting layer). This element utilizes light emission accompanying exciton deactivation caused by recombination of holes and electrons.

In general, conventional hole transport layer is made of small molecule materials, and the hole transport layer of small molecule material is generally fabricated by way of vacuum evaporation. However, 95% of the organic electroluminescent materials are deposited on the chamber wall of the manufacturing equipment used to manufacture the OLED, such that only 5% of the organic electroluminescent materials are coated on a substrate after the manufacturing process is completed, resulting in a high cost. In addition, due to the poor solvent resistance of the film formed by small molecule materials, small molecule materials are difficult to be layered via a wet process. Further, in comparison with devices fabricated via a vacuum evaporation, devices fabricated via a wet process exhibits poor drive stability and efficiency.

Therefore, for the organic electroluminescent technique, a new charge transport material, which are suitable for use in a wet process, is still called for to solve the problem described above.

SUMMARY

According to embodiments of the disclosure, the disclosure provides a polymer, and the polymer includes a first repeating unit, wherein the first repeating unit has a structure represented by Formula (I):

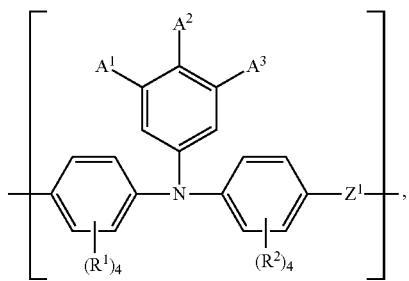

Formula (I)

wherein $A^1$, $A^2$ and $A^3$ can be independently hydrogen,

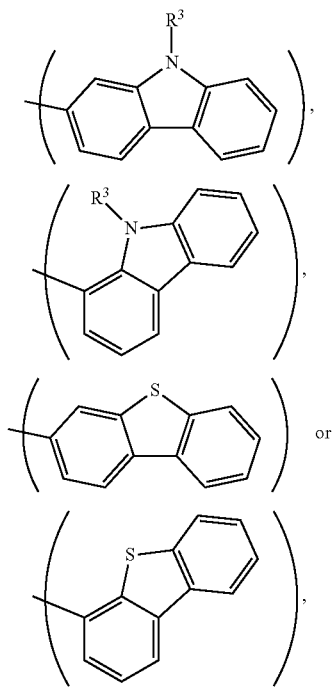

and at least one of $A^1$, $A^2$ and $A^3$ is not hydrogen; $R^1$ and $R^2$ are independently hydrogen, halogen, or $C_{1-2}$ alkyl group; $R^3$ is hydrogen, phenyl group, biphenyl group, naphthyl group; $Z^1$ is

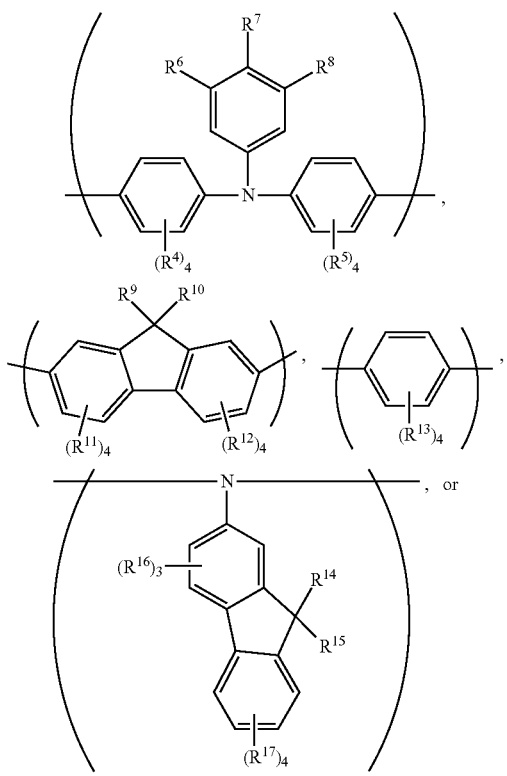

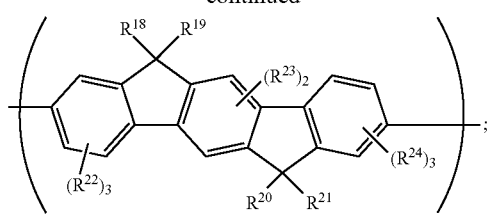

$R^4$, $R^5$, $R^{11}$, $R^{12}$, $R^{16}$, $R^{17}$, $R^{22}$, $R^{23}$ and $R^{24}$ can be independently hydrogen, halogen, or $C_{1-2}$ alkyl group; $R^6$, $R^7$ and $R^8$ are independently hydrogen,

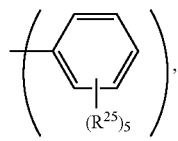

$C_{3-10}$ alkyl group, or $C_{2-10}$ alkenyl group, and at least one of $R^6$, $R^7$ and $R^8$ is not hydrogen; $R^9$ and $R^{10}$ are independently hydrogen, $C_{3-10}$ alkyl group, or $C_{2-10}$ alkenyl group, and at least one of $R^9$ and $R^{10}$ is not hydrogen; $R^{13}$ is independently hydrogen, $C_{3-10}$ alkyl group, or $C_{2-10}$ alkenyl group, and at least one of $R^{13}$ is not hydrogen; $R^{14}$ and $R^{15}$ are independently hydrogen, $C_{3-10}$ alkyl group, or $C_{2-10}$ alkenyl group, and at least one of $R^{14}$ and $R^{15}$ is not hydrogen; $R^{18}$, $R^{19}$, $R^{20}$ and $R^{21}$ are independently hydrogen, $C_{3-10}$ alkyl group, or $C_{2-10}$ alkenyl group, and at least one of $R^{18}$, $R^{19}$, $R^{20}$, and $R^{21}$ is not hydrogen; and $R^{25}$ is independently hydrogen, $C_{3-10}$ alkyl group, or $C_{2-10}$ alkenyl group, and at least one of $R^{25}$ is not hydrogen.

According to embodiments of the disclosure, the polymer of the disclosure can further include a second repeating unit, wherein the second repeating unit has a structure represented by Formula (II):

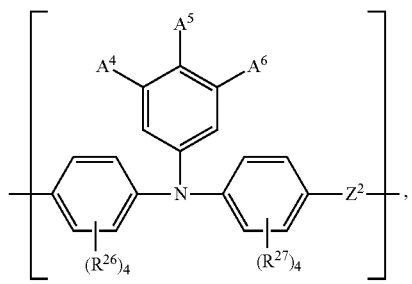

Formula (II)

wherein $A^4$, $A^5$ and $A^6$ can be independently hydrogen,

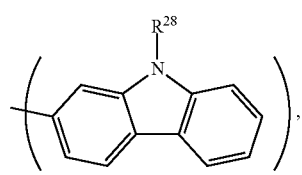

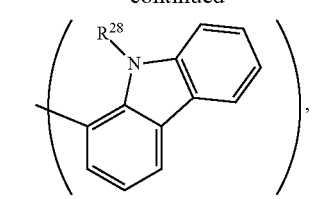

and at least one of $A^4$, $A^5$ and $A^6$ is not hydrogen; $R^{26}$ and $R^{27}$ are independently hydrogen, halogen, or $C_{1-2}$ alkyl group; $R^{28}$ is hydrogen, phenyl group, biphenyl group, naphthyl group; $Z^2$ is

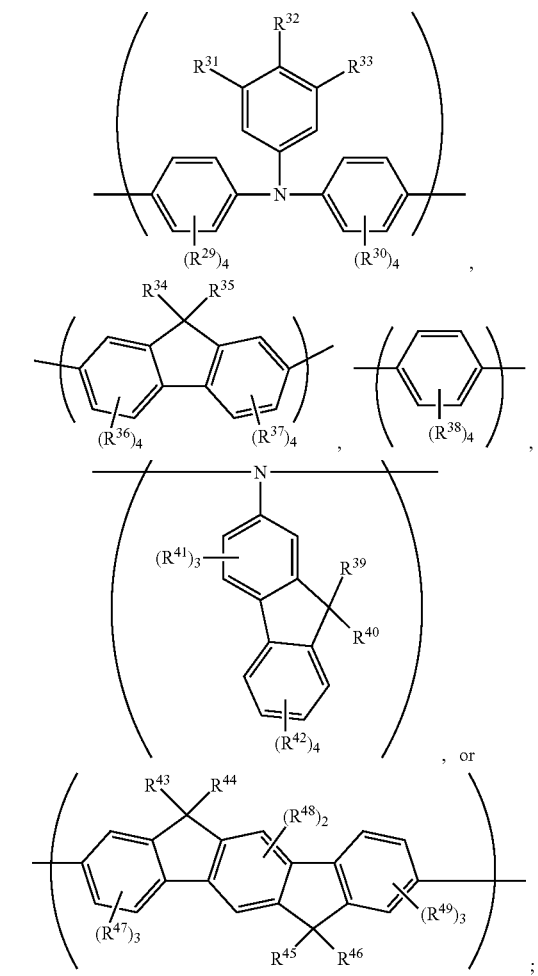

$R^{29}$, $R^{30}$, $R^{36}$, $R^{37}$, $R^{41}$, $R^{42}$, $R^{47}$, $R^{48}$ and $R^{49}$ are independently hydrogen, halogen, or $C_{1-2}$ alkyl group; $R^{31}$, $R^{32}$ and $R^{33}$ are independently hydrogen,

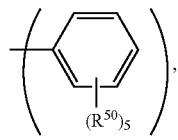

$C_{3-10}$ alkyl group, or $C_{2-10}$ alkenyl group, and at least one of $R^{31}$, $R^{32}$ and $R^{33}$ is not hydrogen; $R^{34}$ and $R^{35}$ are independently hydrogen, $C_{3-10}$ alkyl group, or $C_{2-10}$ alkenyl group, and at least one of $R^{34}$ and $R^{35}$ is not hydrogen; $R^{38}$ are independently hydrogen, $C_{3-10}$ alkyl group, or $C_{2-10}$ alkenyl group, and at least one of $R^{38}$ is not hydrogen; $R^{39}$ and $R^{40}$ are independently hydrogen, $C_{3-10}$ alkyl group, or $C_{2-10}$ alkenyl group, and at least one of $R^{39}$ and $R^{40}$ is not hydrogen; $R^{43}$, $R^{44}$, $R^{45}$ and $R^{46}$ are independently hydrogen, $C_{3-10}$ alkyl group, or $C_{2-10}$ alkenyl group, and at least one of $R^{43}$, $R^{44}$, $R^{45}$ and $R^{46}$ is not hydrogen; and $R^{50}$ is independently hydrogen, $C_{3-10}$ alkyl group, or $C_{2-10}$ alkenyl group, and at least one of $R^{50}$ is not hydrogen. Herein, the first repeating unit is distinct from the second repeating unit.

According to another embodiment of the disclosure, the disclosure provides a light-emitting device. The device includes a pair of electrodes and a light-emitting element disposed between the electrodes, wherein the light-emitting element includes aforementioned polymer.

A detailed description is given in the following embodiments.

BRIEF DESCRIPTION OF THE DRAWINGS

The FIGURE is a cross-sectional view of the light-emitting device according to an embodiment of the disclosure.

DETAILED DESCRIPTION

Polymer

According to embodiments of the disclosure, the polymer of the disclosure has a specific first repeating unit. The main structure of the first repeating unit may additionally have a fluorene moiety, benzene moiety, 6,12-dihydroindeno[1,2-B]fluorene moiety, or amine moiety having carbazolyl group, besides at least one triarylamine moiety. In addition, the triarylamine moiety main structure of the first repeating unit can also have a dibenzothiophenyl group, or carbazolyl group. As a result, the polymer of the disclosure can serve as charge transport material used in the light-emitting device, enhancing the luminescent efficiency of the light-emitting device. In addition, according to embodiments of the disclosure, the solubility of the polymer of the disclosure can be improved, due to the introduction of a fluorene moiety, benzene moiety, 6,12-dihydroindeno[1,2-b]fluorene moiety, or amine moiety with carbazolyl group having long-chain alkyl group or alkenyl group (such as an alkyl group or alkenyl group which has a carbon atom number greater than or equal to three). Thus, the concentration and surface tension of the solution including the polymer can be modified. As a result, the polymer of the disclosure is suitable for forming a layer via a wet process, and meets the requirements of high resolution ink-jet printing (i.e. the polymer of the disclosure is suitable for forming a layer used in light-emitting device via high resolution ink-jet printing). Furthermore, According to embodiments of the disclosure, the polymer of the disclosure can further have a second repeating unit (wherein the first repeating unit is distinct from the second repeating unit) in order to adjust the optoelectronic properties of the polymer (such as energy gap (Es), triplet state energy level ($E_T$), highest occupied molecular orbital (HOMO) energy level, and lowest unoccupied molecular orbital (LUMO) energy level), thereby facilitating the polymer to be suitable for use in concert with other light emitting material.

According to embodiments of the disclosure, the polymer includes a first repeating unit, wherein the first repeating unit has a structure represented by Formula (I):

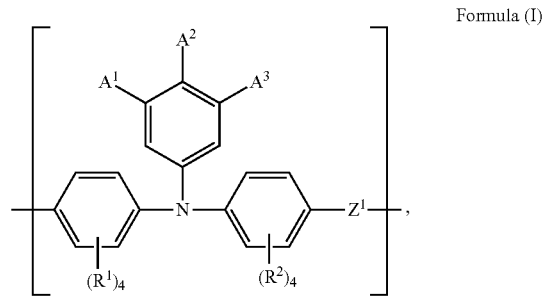

Formula (I)

wherein $A^1$, $A^2$ and $A^3$ can be independently hydrogen,

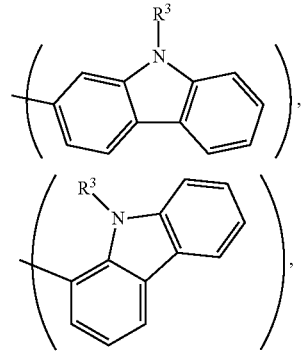

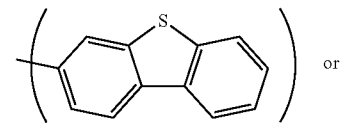

or

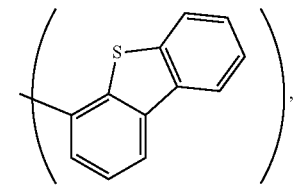

and at least one of $A^1$, $A^2$ and $A^3$ is not hydrogen; $R^1$ and $R^2$ are independently hydrogen, halogen, or $C_{1-2}$ alkyl group; $R^3$ is hydrogen, phenyl group, biphenyl group, naphthyl group; $Z^1$ is

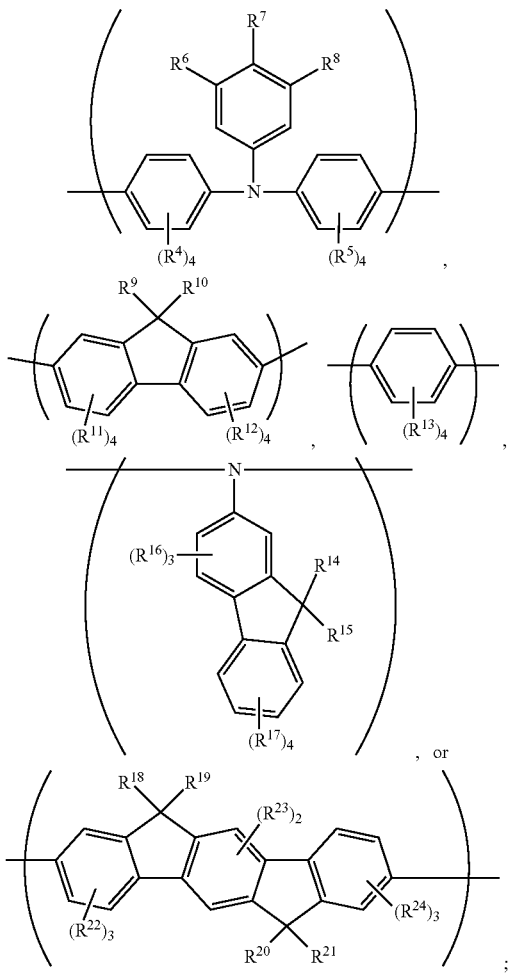

$R^4$, $R^5$, $R^{11}$, $R^{12}$, $R^{16}$, $R^{17}$, $R^{22}$, $R^{23}$ and $R^{24}$ can be independently hydrogen, halogen, or $C_{1-2}$ alkyl group; $R^6$, $R^7$ and $R^8$ are independently hydrogen,

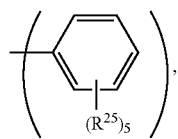

$C_{3-10}$ alkyl group, or $C_{2-10}$ alkenyl group, and at least one of $R^6$, $R^7$ and $R^8$ is not hydrogen; $R^9$ and $R^{10}$ are independently hydrogen, $C_{3-10}$ alkyl group, or $C_{2-10}$ alkenyl group, and at least one of $R^9$ and $R^{10}$ is not hydrogen; $R^{13}$ is independently hydrogen, $C_{3-10}$ alkyl group, or $C_{2-10}$ alkenyl group, and at least one of $R^{13}$ is not hydrogen; $R^{14}$ and $R^{15}$ are independently hydrogen, $C_{3-10}$ alkyl group, or $C_{2-10}$ alkenyl group, and at least one of $R^{14}$, $R^{15}$ is not hydrogen; $R^{18}$, $R^{19}$, $R^{20}$ and $R^{21}$ are independently hydrogen, $C_{3-10}$ alkyl group, or $C_{2-10}$ alkenyl group, and at least one of $R^{18}$, $R^{19}$, $R^{20}$ and $R^{21}$ is not hydrogen; and $R^{25}$ is independently hydrogen, $C_{3-10}$ alkyl group, or $C_{2-10}$ alkenyl group.

According to embodiments of the disclosure, $C_{1-2}$ alkyl group can be methyl or ethyl. According to embodiments of the disclosure, $C_{3-10}$ alkyl group can be a linear or branched alkyl group. For example, $C_{3-10}$ alkyl group can be propyl, butyl, pentyl, hexyl, heptyl, octyl, nonyl, decyl, or isomers thereof. According to embodiments of the disclosure, halogen can be fluorine, chlorine, bromine, or iodine. According to embodiments of the disclosure, $C_{2-10}$ alkenyl group can be a linear or branched alkenyl group. For example, $C_{2-10}$ alkenyl group can be vinyl, propenyl, butenyl, pentenyl, hexenyl, heptenyl, octenyl, nonenyl, decenyl, or isomers thereof.

According to embodiments of the disclosure, $R^1$, $R^2$, $R^4$, $R^5$, $R^{11}$, $R^{12}$, $R^{16}$, $R^{17}$, $R^{22}$, $R^{23}$ and $R^{24}$ can be independently hydrogen, methyl, ethyl, or fluorine. $R^6$, $R^7$ and $R^8$ are independently hydrogen,

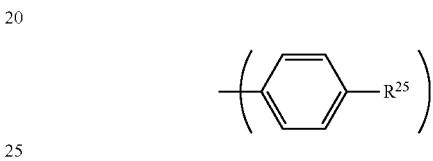

($R^{25}$ is $C_{3-10}$ alkyl group, or $C_{2-10}$ alkenyl group), $C_{3-10}$ alkyl group, or $C_{2-10}$ alkenyl group, and at least one of $R^6$, $R^7$ and $R^8$ is not hydrogen. $R^9$, $R^{10}$, $R^{13}$, $R^{14}$, $R^{15}$, $R^{18}$, $R^{19}$, $R^{20}$ and $R^{21}$ are independently hydrogen, $C_{3-10}$ alkyl group, or $C_{2-10}$ alkenyl group, and at least one of $R^9$ and $R^{10}$ is not hydrogen; at least one of $R^{13}$ is not hydrogen; at least one of $R^{14}$ and $R^{15}$ is not hydrogen; and at least one of $R^{18}$, $R^{19}$, $R^{20}$ and $R^{21}$ is not hydrogen.

According to embodiments of the disclosure, $Z^1$ of the first repeating unit can have at least one long-chain alkyl group or alkenyl group (such as $C_{3-10}$ alkyl group or $C_{2-10}$ alkenyl group) in order to enhance the solubility of the polymer of the disclosure, thereby facilitating the polymer to be suitable for forming a layer via a wet process.

According to embodiments of the disclosure, the first repeating unit can be

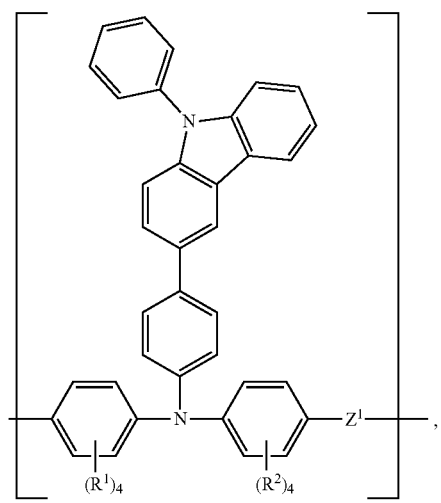

9
-continued

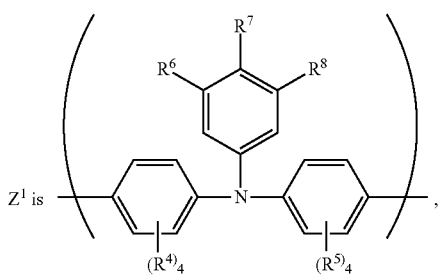

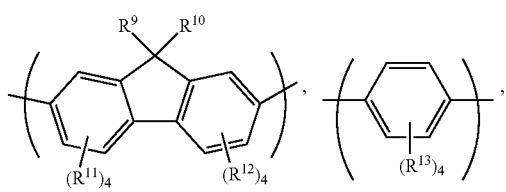

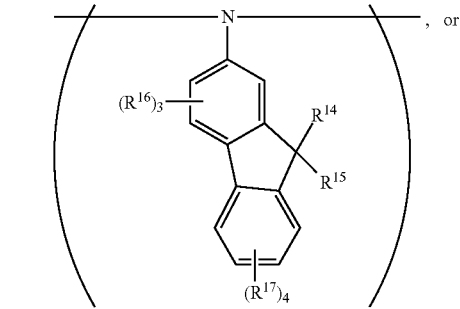, or

10
-continued

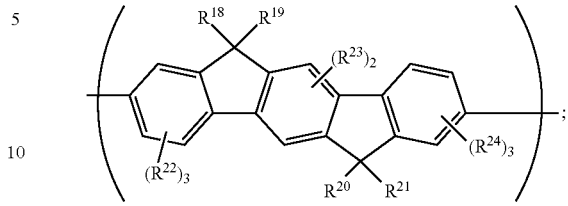

$R^1$ and $R^2$ are independently hydrogen, halogen, or $C_{1-2}$ alkyl group; $R^4$, $R^5$, $R^{11}$, $R^{12}$, $R^{16}$, $R^{17}$, $R^{22}$, $R^{23}$ and $R^{24}$ are independently hydrogen, halogen, or $C_{1-2}$ alkyl group; $R^6$, $R^7$ and $R^8$ are independently hydrogen,

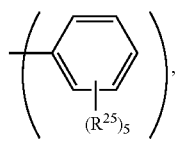

$C_{3-10}$ alkyl group, or $C_{2-10}$ alkenyl group, and at least one of $R^6$, $R^7$ and $R^8$ is not hydrogen; $R^9$ and $R^{10}$ are independently hydrogen, $C_{3-10}$ alkyl group, or $C_{2-10}$ alkenyl group, and at least one of $R^9$ and $R^{10}$ is not hydrogen; $R^{13}$ is independently hydrogen, $C_{3-10}$ alkyl group, or $C_{2-10}$ alkenyl group, and at least one of R13 is not hydrogen; $R^{14}$ and $R^{15}$ are independently hydrogen, $C_{3-10}$ alkyl group, or $C_{2-10}$ alkenyl group, and at least one of $R^{14}$ and $R^{15}$ is not hydrogen; $R^{18}$, $R^{19}$, $R^{20}$ and $R^{21}$ are independently hydrogen, $C_{3-10}$ alkyl group, or $C_{2-10}$ alkenyl group, and at least one of $R^{18}$, $R^{19}$, $R^{20}$ and $R^{21}$ is not hydrogen; and $R^{25}$ is independently hydrogen, $C_{3-10}$ alkyl group, or $C_{2-10}$ alkenyl group, and at least one of $R^{25}$ is not hydrogen. According to embodiments of the disclosure, the first repeating unit can be

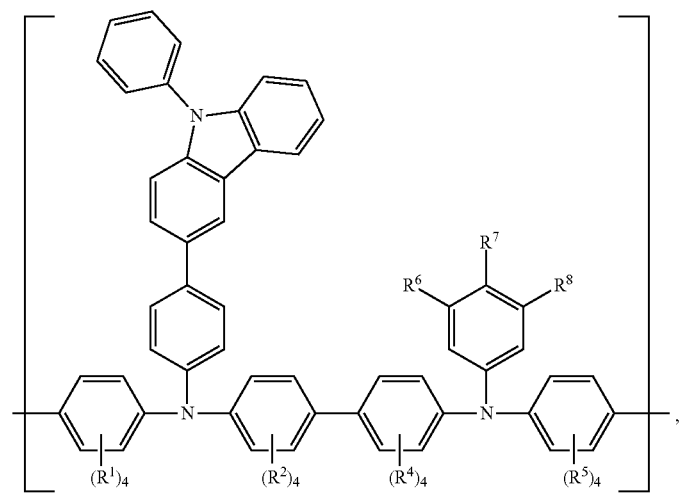

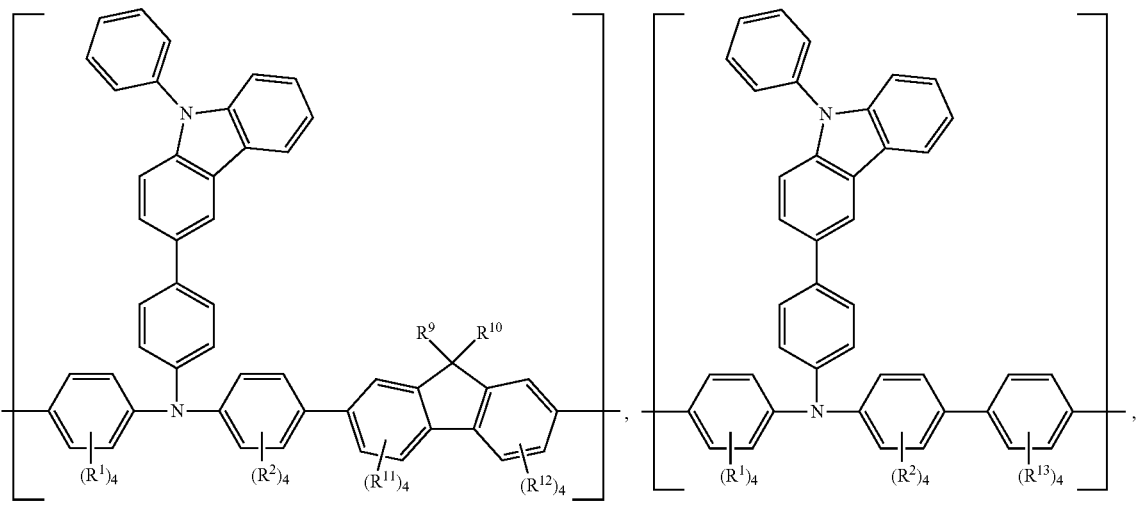
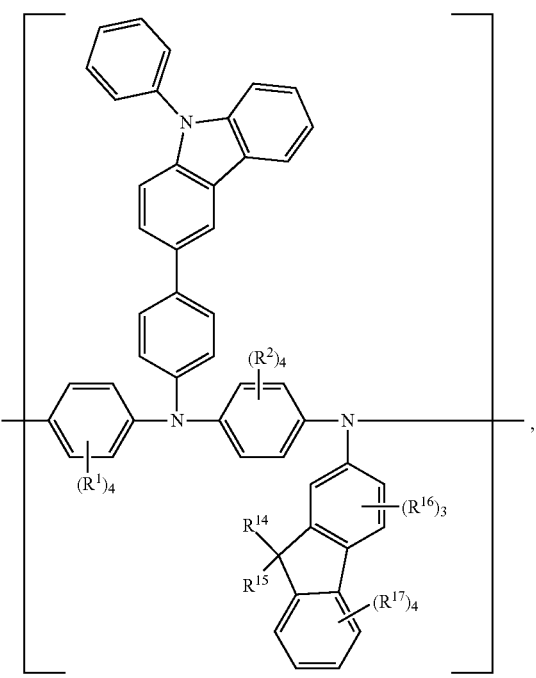
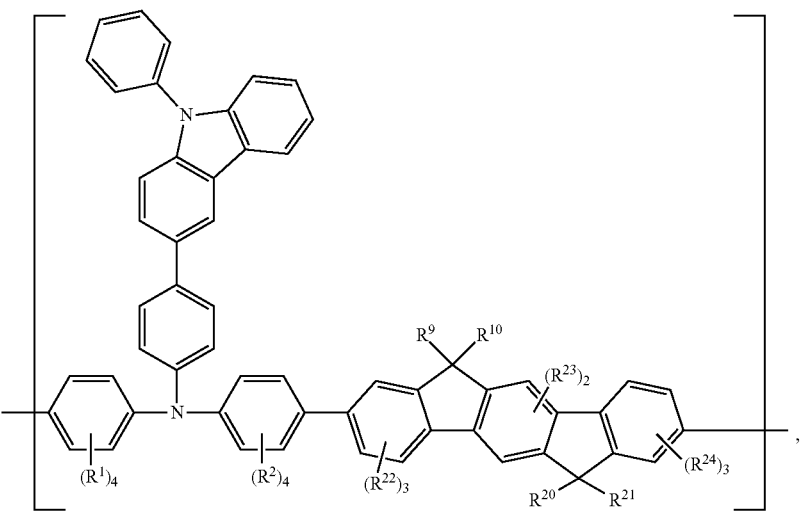

wherein $R^1$ and $R^2$ are independently hydrogen, halogen, or $C_{1-2}$ alkyl group; $R^4$, $R^5$, $R^{11}$, $R^{12}$, $R^{16}$, $R^{17}$, $R^{22}$, $R^{23}$ and $R^{24}$ are independently hydrogen, halogen, or $C_{1-2}$ alkyl group; $R^6$, $R^7$ and $R^8$ are independently hydrogen,

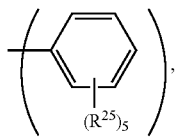

$C_{3-10}$ alkyl group, or $C_{2-10}$ alkenyl group, and at least one of $R^6$, $R^7$ and $R^8$ is not hydrogen; $R^9$ and $R^{10}$ are independently hydrogen, $C_{3-10}$ alkyl group, or $C_{2-10}$ alkenyl group, and at least one of $R^9$ and $R^{10}$ is not hydrogen; $R^{13}$ is independently hydrogen, $C_{3-10}$ alkyl group, or $C_{2-10}$ alkenyl group, and at least one of $R^{13}$ is not hydrogen; $R^{14}$ and $R^{15}$ are independently hydrogen, $C_{3-10}$ alkyl group, or $C_{2-10}$ alkenyl group, and at least one of $R^{14}$ and $R^{15}$ is not hydrogen; $R^{18}$, $R^{19}$, $R^{20}$ and $R^{21}$ are independently hydrogen, $C_{3-10}$ alkyl group, or $C_{2-10}$ alkenyl group, and at least one of $R^{18}$, $R^{19}$, $R^{20}$ and $R^{21}$ is not hydrogen; and $R^{25}$ is independently hydrogen, $C_{3-10}$ alkyl group, or $C_{2-10}$ alkenyl group, and at least one of $R^{25}$ is not hydrogen.

According to embodiments of the disclosure, the first repeating unit can be

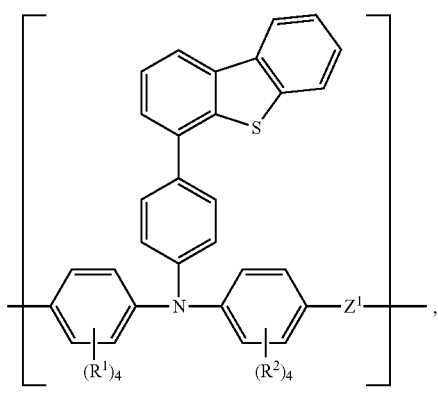

$Z^1$ is

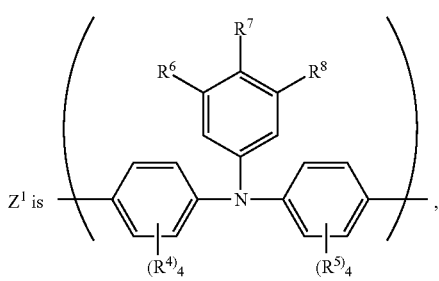

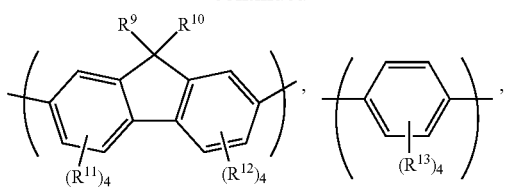

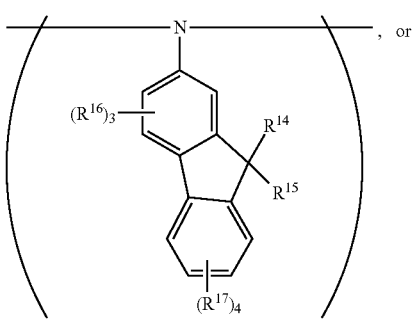

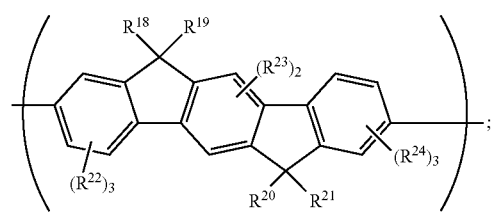

$R^1$ and $R^2$ are independently hydrogen, halogen, or $C_{1-2}$ alkyl group; $R^4$, $R^5$, $R^{11}$, $R^{12}$, $R^{16}$, $R^{17}$, $R^{22}$, $R^{23}$ and $R^{24}$ are independently hydrogen, halogen, or $C_{1-2}$ alkyl group; $R^6$, $R^7$ and $R^8$ are independently hydrogen,

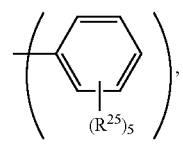

$C_{3-10}$ alkyl group, or $C_{2-10}$ alkenyl group, and at least one of $R^6$, $R^7$ and $R^8$ is not hydrogen; $R^9$ and $R^{10}$ are independently hydrogen, $C_{3-10}$ alkyl group, or $C_{2-10}$ alkenyl group, and at least one of $R^9$ and $R^{10}$ is not hydrogen; $R^{13}$ is independently hydrogen, $C_{3-10}$ alkyl group, or $C_{2-10}$ alkenyl group, and at least one of $R^{13}$ is not hydrogen; $R^{14}$ and $R^{15}$ are independently hydrogen, $C_{3-10}$ alkyl group, or $C_{2-10}$ alkenyl group, and at least one of $R^{14}$ and $R^{15}$ is not hydrogen; $R^{18}$, $R^{19}$, $R^{20}$ and $R^{21}$ are independently hydrogen, $C_{3-10}$ alkyl group, or $C_{2-10}$ alkenyl group, and at least one of $R^{18}$, $R^{19}$, $R^{20}$ and $R^{21}$ is not hydrogen; and $R^{25}$ is independently hydrogen, $C_{3-10}$ alkyl group, or $C_{2-10}$ alkenyl group, and at least one of $R^{25}$ is not hydrogen. According to embodiments of the disclosure, the first repeating unit can be

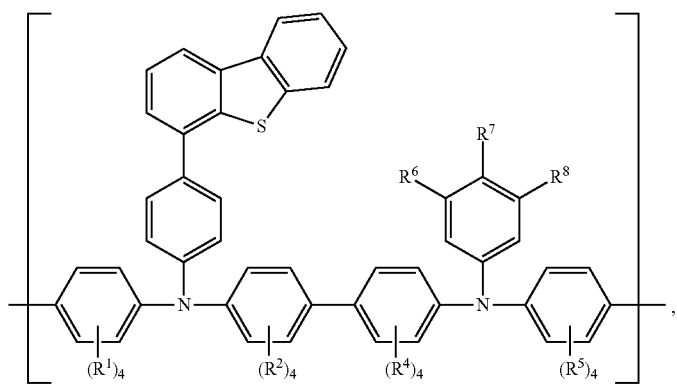
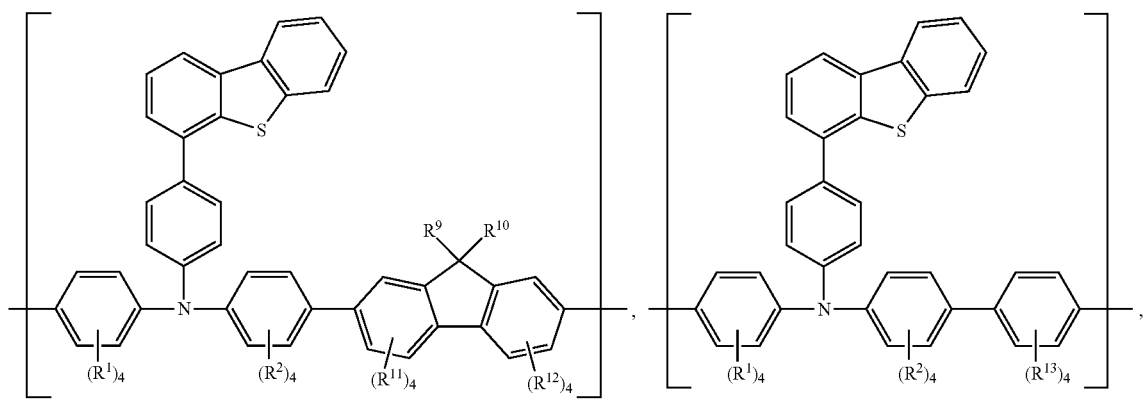
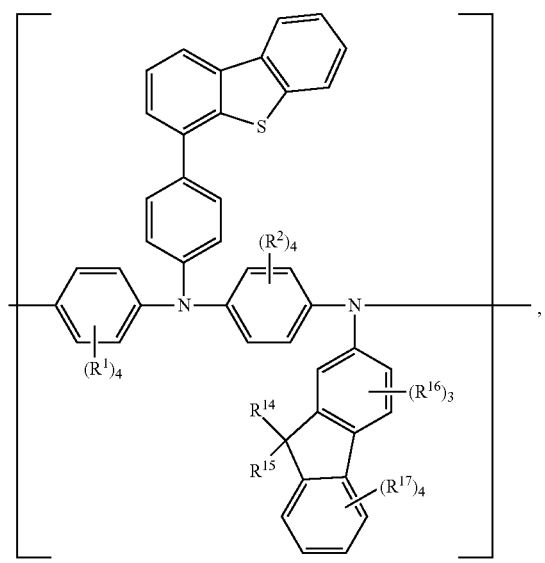

-continued

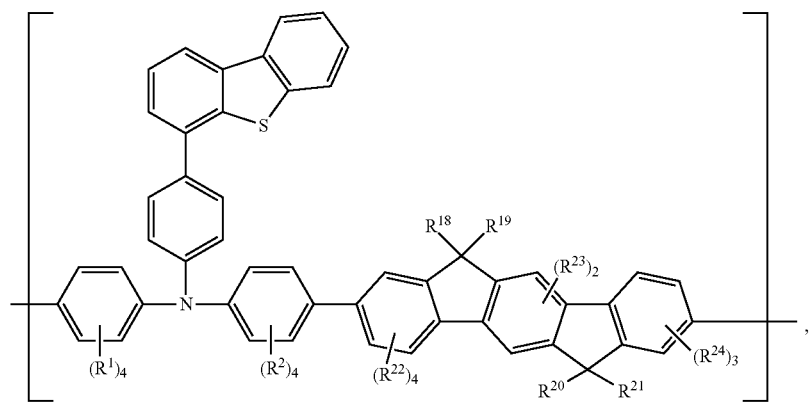

wherein $R^1$ and $R^2$ are independently hydrogen, halogen, or $C_{1-2}$ alkyl group; $R^4$, $R^5$, $R^{11}$, $R^{12}$, $R^{16}$, $R^{17}$, $R^{22}$, $R^{23}$ and $R^{24}$ are independently hydrogen, halogen, or $C_{1-2}$ alkyl group; $R^6$, $R^7$ and $R^8$ are independently hydrogen,

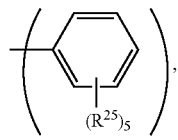

$C_{3-10}$ alkyl group, or $C_{2-10}$ alkenyl group, and at least one of $R^6$, $R^7$ and $R^8$ is not hydrogen; R9 and R10 are independently hydrogen, $C_{3-10}$ alkyl group, or $C_{2-10}$ alkenyl group, and at least one of R9 and R10 is not hydrogen; $R^{13}$ is independently hydrogen, $C_{3-10}$ alkyl group, or $C_{2-10}$ alkenyl group, and at least one of $R^{13}$ is not hydrogen; $R^{14}$ and $R^{15}$ are independently hydrogen, $C_{3-10}$ alkyl group, or $C_{2-10}$ alkenyl group, and at least one of $R^{14}$ and $R^{15}$ is not hydrogen; $R^{18}$, $R^{19}$, $R^{20}$ and $R^{21}$ are independently hydrogen, $C_{3-10}$ alkyl group, or $C_{2-10}$ alkenyl group, and at least one of $R^{18}$, $R^{19}$, $R^{20}$ and $R^{21}$ is not hydrogen; and $R^{25}$ is independently hydrogen, $C_{3-10}$ alkyl group, or $C_{2-10}$ alkenyl group, and at least one of $R^{25}$ is not hydrogen.

According to embodiments of the disclosure, the first repeating unit can be

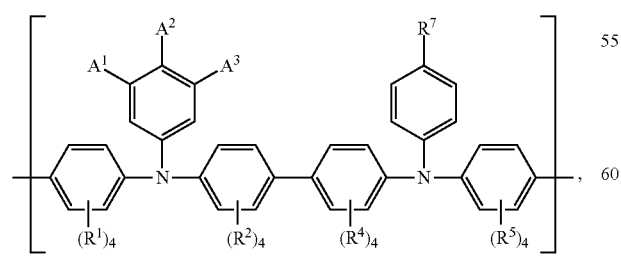

$A^1$, $A^2$ and $A^3$ can be independently hydrogen,

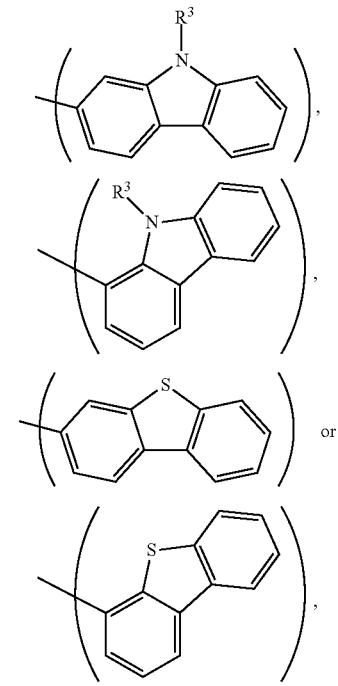

and at least one of $A^1$, $A^2$ and $A^3$ is not hydrogen; $R^1$ and $R^2$ are independently hydrogen, halogen, or $C_{1-2}$ alkyl group; $R^3$ is hydrogen, phenyl group, biphenyl group, naphthyl group; $R^4$ and $R^5$ are independently hydrogen, halogen, or $C_{1-2}$ alkyl group; $R^7$ is

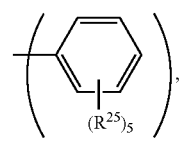

$C_{3-10}$ alkyl group, or $C_{2-10}$ alkenyl group; and $R^{25}$ is independently hydrogen, $C_{3-10}$ alkyl group, or $C_{2-10}$ alkenyl group, and at least one of $R^{25}$ is not hydrogen.

According to embodiments of the disclosure, the first repeating unit can be

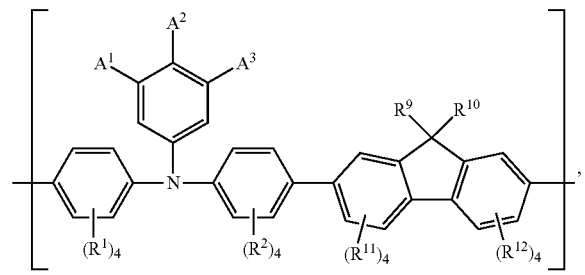

$A^1$, $A^2$ and $A^3$ can be independently hydrogen,

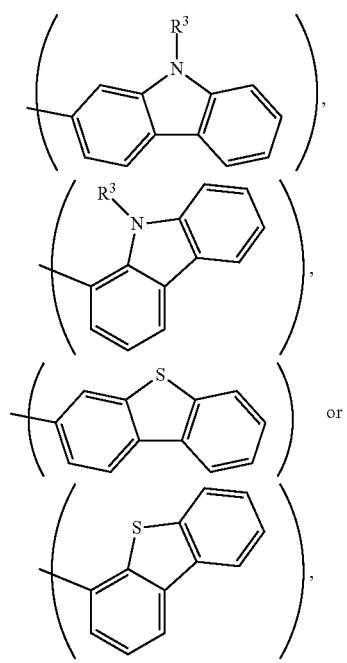

and at least one of $A^1$, $A^2$ and $A^3$ is not hydrogen; $R^1$ and $R^2$ are independently hydrogen, halogen, or $C_{1-2}$ alkyl group; $R^3$ is hydrogen, phenyl group, biphenyl group, naphthyl group; $R^{11}$ and $R^{12}$ are independently hydrogen, halogen, or $C_{1-2}$ alkyl group; and R9 and R10 are independently $C_{3-10}$ alkyl group, or $C_{2-10}$ alkenyl group.

According to embodiments of the disclosure, the first repeating unit can be

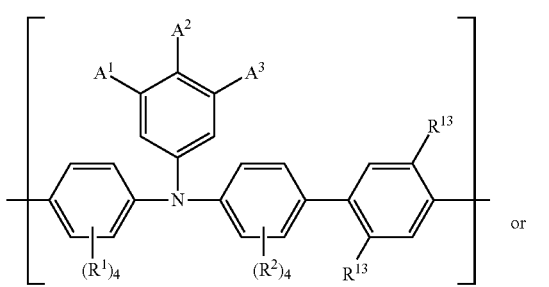

or

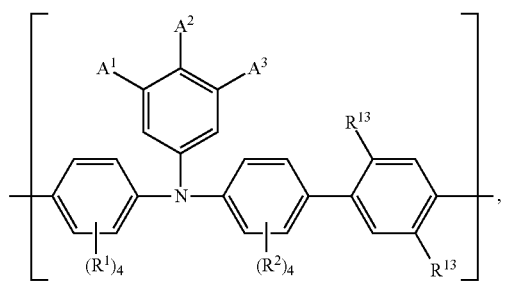

$A^1$, $A^2$ and $A^3$ can be independently hydrogen

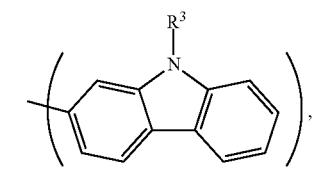

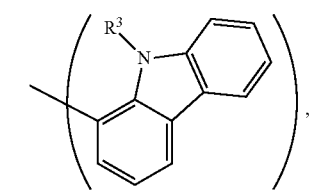

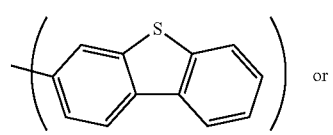

or

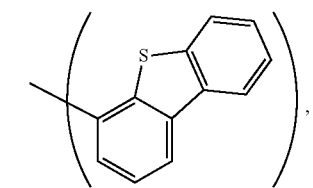

and at least one of $A^1$, $A^2$ and $A^3$ is not hydrogen; $R^1$ and $R^2$ are independently hydrogen, halogen, or $C_{1-2}$ alkyl group; $R^3$ is hydrogen, phenyl group, biphenyl group, naphthyl group; and $R^{13}$ is independently $C_{3-10}$ alkyl group, or $C_{2-10}$ alkenyl group.

According to embodiments of the disclosure, first repeating unit can be

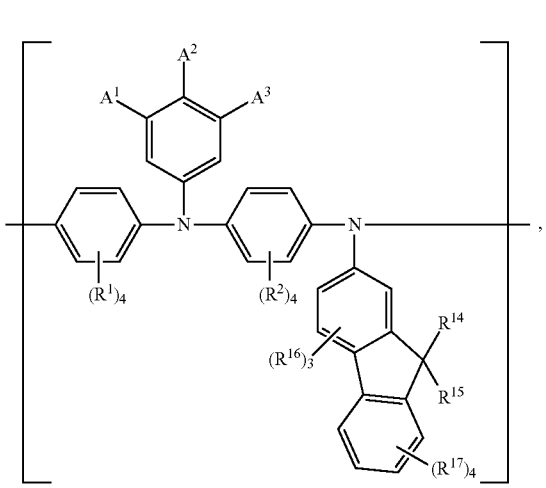

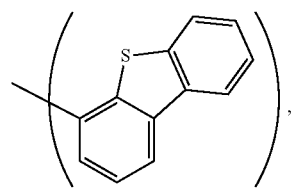

and at least one of $A^1$, $A^2$ and $A^3$ is not hydrogen; $R^1$ and $R^2$ are independently hydrogen, halogen, or $C_{1-2}$ alkyl group; $R^3$ is hydrogen, phenyl group, biphenyl group, naphthyl group; $R^{16}$ and $R^{17}$ are independently hydrogen, halogen, or $C_{1-2}$ alkyl group; and $R^{14}$ and $R^{15}$ are independently $C_{3-10}$ alkyl group, or $C_{2-10}$ alkenyl group.

According to embodiments of the disclosure, first repeating unit can be

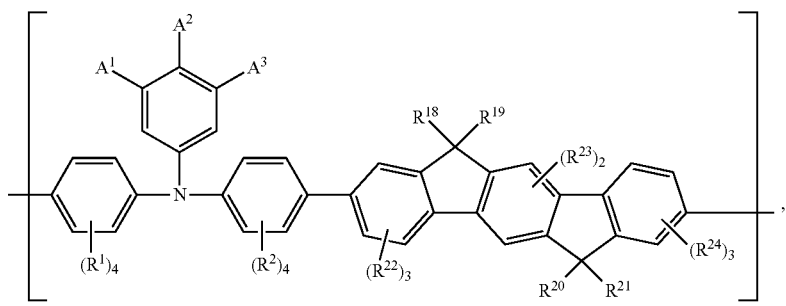

$A^1$, $A^2$ and $A^3$ can be independently hydrogen $A^1$, $A^2$ and $A^3$ can be independently hydrogen,

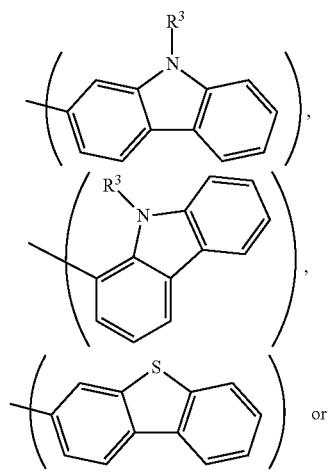

or

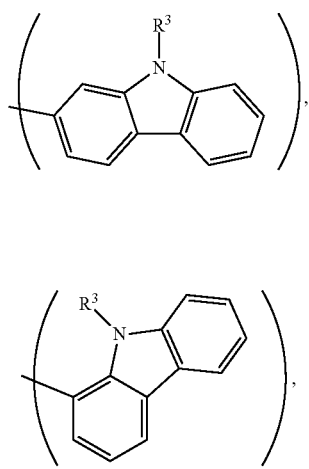

-continued

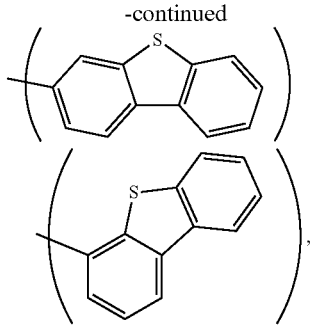
or

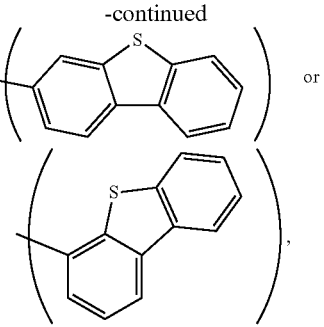
, and at least one of $A^1$, $A^2$ and $A^3$ is not hydrogen; and $R^2$ are independently hydrogen, halogen, or $C_{1-2}$ alkyl group; $R^3$ is hydrogen, phenyl group, biphenyl group, naphthyl group; $R^{22}$, $R^{23}$ and $R^{24}$ are independently hydrogen, halogen, or $C_{1-2}$ alkyl group; and $R^{18}$, $R^{19}$, $R^{20}$ and $R^{21}$ are independently hydrogen, $C_{3-10}$ alkyl group, or $C_{2-10}$ alkenyl group, and at least one of $R^{18}$, $R^{19}$, $R^{20}$ and $R^{21}$ is not hydrogen.

According to embodiments of the disclosure, the number of the first repeating unit of the polymer can be 2 to 2,000 (such as 2 to 1,800, 5 to 1,500, 10 to 1,200, 20 to 1,000, 50 to 800, or 100 to 500). According to embodiments of the disclosure, the polymer can have a weight average molecular weight (Mw) of about 1,000 to 100,000, such as 2,000 to 80,000, or 3,000 to 60,000. The weight average molecular weight (Mw) of the oligomer or polymer of the disclosure can be determined by gel permeation chromatography (GPC) based on a polystyrene calibration curve.

According to embodiments of the disclosure, the polymer further includes a second repeating unit, wherein the second repeating unit has a structure represented by Formula (II):

Formula (II)

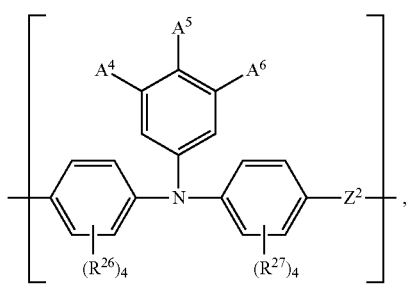

wherein $A^4$, $A^5$ and $A^6$ can be independently hydrogen,

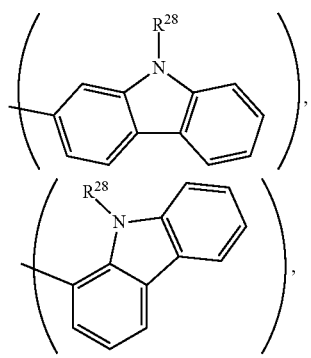
,

-continued

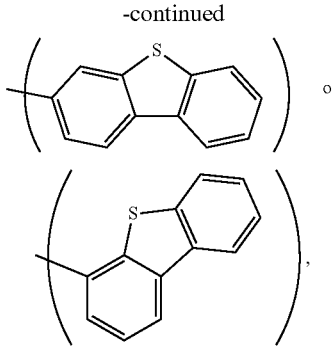
or

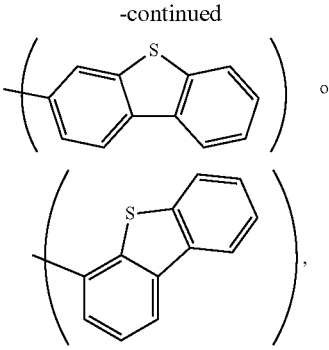
, and at least one of $A^4$, $A^5$ and $A^6$ is not hydrogen; $R^{26}$ and $R^{27}$ are independently hydrogen, halogen, or $C_{1-2}$ alkyl group; $R^{28}$ is hydrogen, phenyl group, biphenyl group, naphthyl group; $Z^2$ is

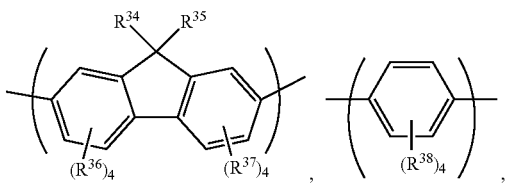
,

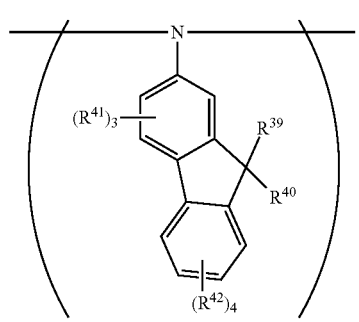
, or

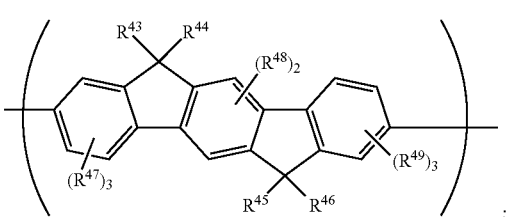
;

$R^{29}$, $R^{30}$, $R^{36}$, $R^{37}$, $R^{41}$, $R^{42}$, $R^{47}$, $R^{48}$ and $R^{49}$ are independently hydrogen, halogen, or $C_{1-2}$ alkyl group; $R^{31}$, $R^{32}$ and $R^{33}$ are independently hydrogen,

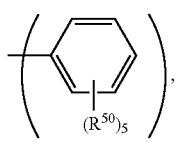

$C_{3-10}$ alkyl group, or $C_{2-10}$ alkenyl group, and at least one of $R^{31}$, $R^{32}$ and $R^{33}$ is not hydrogen; $R^{34}$ and $R^{35}$ are independently hydrogen, $C_{3-10}$ alkyl group, or $C_{2-10}$ alkenyl group, and at least one of $R^{34}$ and $R^{35}$ is not hydrogen; $R^{38}$ are independently hydrogen, $C_{3-10}$ alkyl group, or $C_{2-10}$ alkenyl group, and at least one of $R^{38}$ is not hydrogen; $R^{39}$ and $R^{40}$ are independently hydrogen, $C_{3-10}$ alkyl group, or $C_{2-10}$ alkenyl group, and at least one of $R^{14}$ and $R^{15}$ is not hydrogen; $R^{43}$, $R^{44}$, $R^{45}$ and $R^{46}$ are independently hydrogen, $C_{3-10}$ alkyl group, or $C_{2-10}$ alkenyl group, and at least one of $R^{43}$, $R^{44}$, $R^{45}$ and $R^{46}$ is not hydrogen; and $R^{50}$ is independently hydrogen, $C_{3-10}$ alkyl group, or $C_{2-10}$ alkenyl group, and at least one of $R^{50}$ is not hydrogen, wherein the second repeating unit is distinct from the first repeating unit.

According to embodiments of the disclosure, the amount ratio of the first repeating unit to the second repeating unit can be 1:99 to 99:1, such as: 1:9, 1:8, 1:7, 1:6, 1:5, 1:4, 1:3, 1:2, 1:1, 2:1, 3:1, 4:1, 5:1, 6:1, 7:1, 8:1, or 9:1.

According to embodiments of the disclosure, the number of the second repeating unit in the polymer is 2 to 2,000 (such as 2 to 1,800, 5 to 1,500, 10 to 1,200, 20 to 1,000, 50 to 800, or 100 to 500). According to embodiments of the disclosure, the first repeating unit and the second repeating unit are arranged in a random or block fashion. According to embodiments of the disclosure, the weight average molecular weight (Mw) of the polymer can be about 1,000 to 100,000, such as 2,000 to 80,000, or 3,000 to 60,000. The weight average molecular weight (Mw) of the oligomer or polymer of the disclosure can be determined by gel permeation chromatography (GPC) based on a polystyrene calibration curve.

According to embodiments of the disclosure, the first repeating unit is and the second repeating unit is

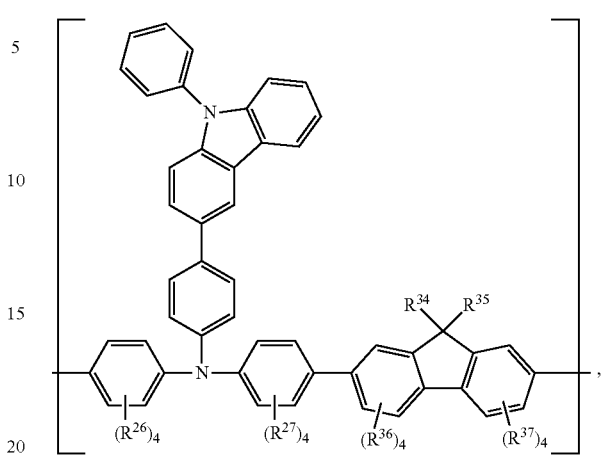

$R^1$, $R^2$, $R^4$ and $R^5$ are independently hydrogen, halogen, or $C_{1-2}$ alkyl group; $R^6$, $R^7$ and $R^8$ are independently hydrogen,

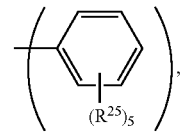

$C_{3-10}$ alkyl group, or $C_{2-10}$ alkenyl group, and at least one of $R^6$, $R^7$ and $R^8$ is not hydrogen; $R^{25}$ is independently hydrogen, $C_{3-10}$ alkyl group, or $C_{2-10}$ alkenyl group, and at least one of $R^{25}$ is not hydrogen; $R^{26}$, $R^{27}$, $R^{36}$ and $R^{37}$ are independently hydrogen, halogen, or $C_{1-2}$ alkyl group; and $R^{34}$ and $R^{35}$ are independently hydrogen, $C_{3-10}$ alkyl group, or $C_{2-10}$ alkenyl group, and at least one of $R^{34}$ and $R^{35}$ is not hydrogen.

According to embodiments of the disclosure, the first repeating unit is

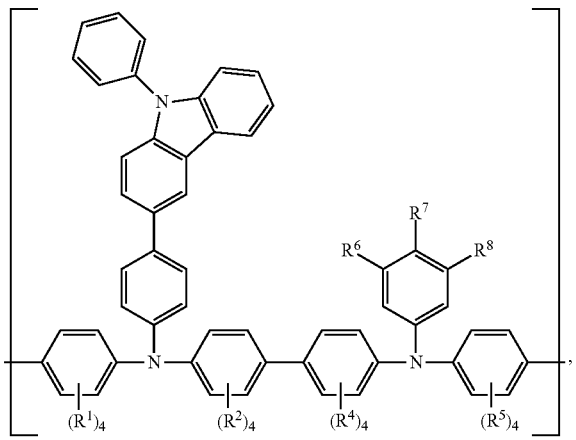

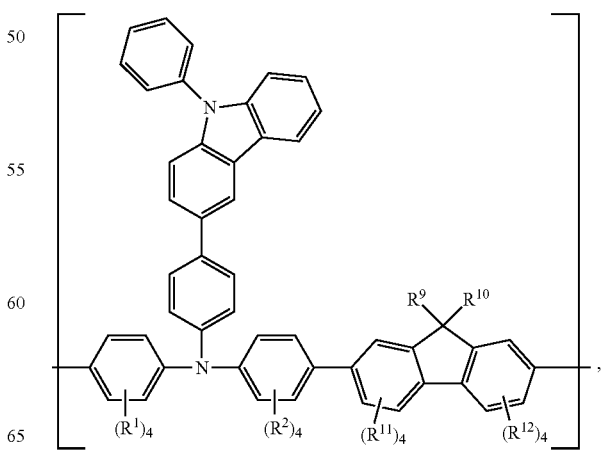

and the second repeating unit is

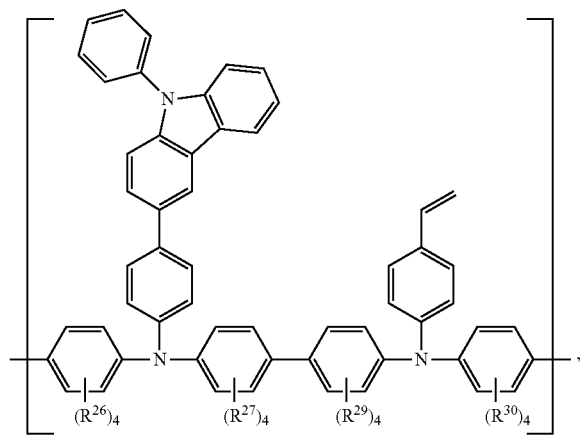

wherein $R^1$, $R^2$, $R^{11}$ and $R^{12}$ are independently hydrogen, halogen, or $C_{1-2}$ alkyl group; $R^9$ and $R^{10}$ are independently hydrogen, $C_{3-10}$ alkyl group, or $C_{2-10}$ alkenyl group, and at least one of $R^9$ and $R^{10}$ is not hydrogen; and $R^{26}$, $R^{27}$, $R^{29}$ and $R^{30}$ are independently hydrogen, halogen, or $C_{1-2}$ alkyl group.

According to embodiments of the disclosure, the first repeating unit is

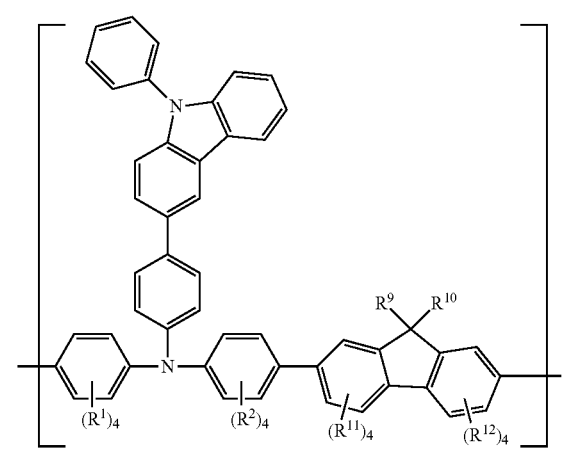

and the second repeating unit is

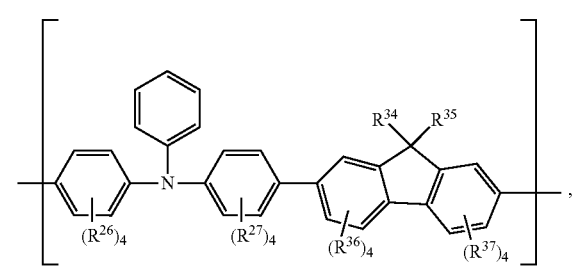

wherein $R^1$, $R^2$, $R^{11}$ and $R^{12}$ are independently hydrogen, halogen, or $C_{1-2}$ alkyl group; $R^9$ and $R^{10}$ are independently hydrogen, $C_{3-10}$ alkyl group, or $C_{2-10}$ alkenyl group, and at least one of $R^9$ and $R^{10}$ is not hydrogen; $R^{26}$, $R^{27}$, $R^{36}$ and $R^{37}$ are independently hydrogen, halogen, or $C_{1-2}$ alkyl group; and $R^{34}$ and $R^{35}$ are independently hydrogen, $C_{3-10}$ alkyl group, or $C_{2-10}$ alkenyl group, and at least one of $R^{34}$ and $R^{35}$ is not hydrogen.

According to embodiments of the disclosure, the first repeating unit is

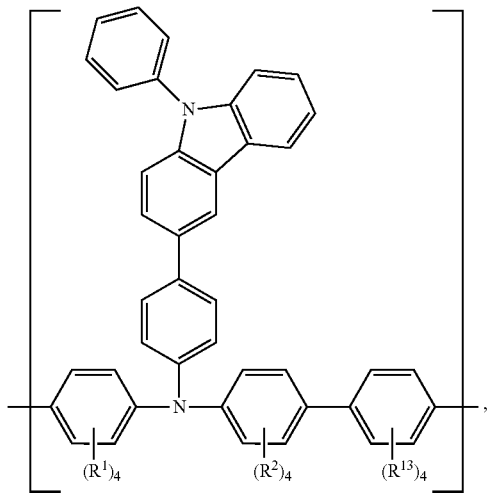

and the second repeating unit is

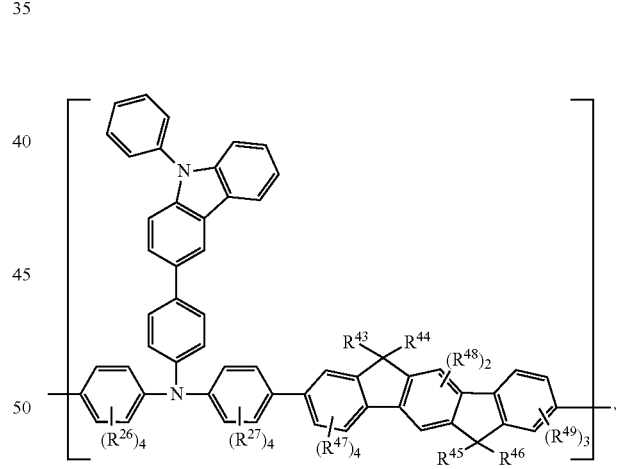

wherein $R^1$ and $R^2$ are independently hydrogen, halogen, or $C_{1-2}$ alkyl group; $R^{13}$ is independently hydrogen, $C_{3-10}$ alkyl group, or $C_{2-10}$ alkenyl group, and at least one of $R^{13}$ is not hydrogen; $R^{26}$, $R^{27}$, $R^{47}$, $R^{48}$ and $R^{49}$ are independently hydrogen, halogen, or $C_{1-2}$ alkyl group; and $R^{43}$, $R^{44}$, $R^{45}$ and $R^{46}$ are independently hydrogen, $C_{3-10}$ alkyl group, or $C_{2-10}$ alkenyl group, and at least one of $R^{43}$, $R^{44}$, $R^{45}$ and $R^{46}$ is not hydrogen.

According to embodiments of the disclosure, the first repeating unit is

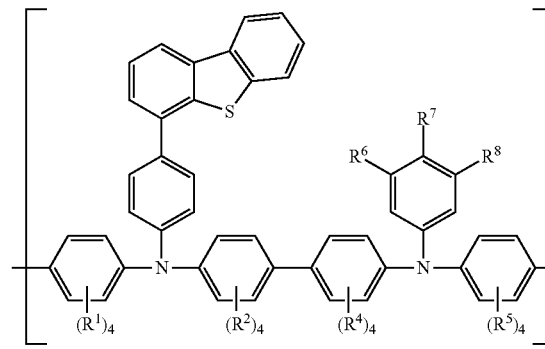

and the second repeating unit is

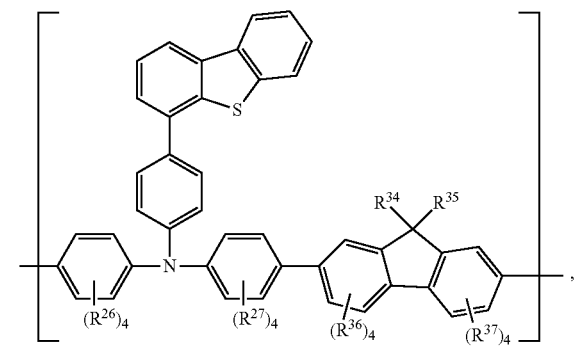

wherein $R^1$, $R^2$, $R^4$ and $R^5$ are independently hydrogen, halogen, or $C_{1-2}$ alkyl group; $R^6$, $R^7$ and $R^8$ are independently hydrogen,

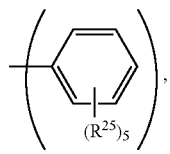

$C_{3-10}$ alkyl group, or $C_{2-10}$ alkenyl group, and at least one of $R^6$, $R^7$ and $R^8$ is not hydrogen; $R^{25}$ is independently hydrogen, $C_{3-10}$ alkyl group, or $C_{2-10}$ alkenyl group, and at least one of $R^{25}$ is not hydrogen; $R^{26}$, $R^{27}$, $R^{36}$ and $R^{37}$ are independently hydrogen, halogen, or $C_{1-2}$ alkyl group; and $R^{34}$ and $R^{35}$ are independently hydrogen, $C_{3-10}$ alkyl group, or $C_{2-10}$ alkenyl group, and at least one of $R^{34}$ and $R^{35}$ is not hydrogen.

According to embodiments of the disclosure, the first repeating unit is

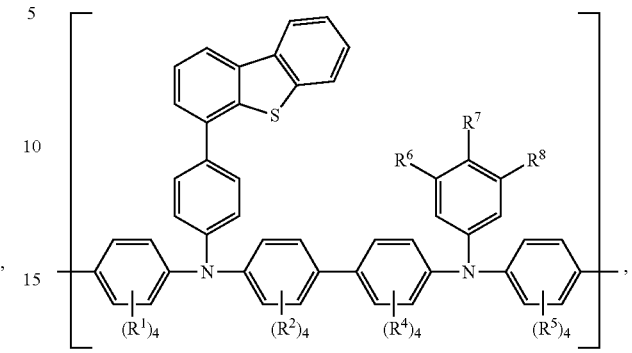

and the second repeating unit is

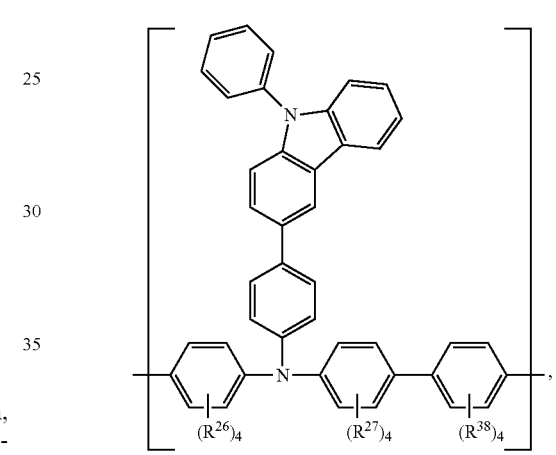

wherein $R^1$, $R^2$, $R^4$ and $R^5$ are independently hydrogen, halogen, or $C_{1-2}$ alkyl group; $R^6$, $R^7$ and $R^8$ are independently hydrogen,

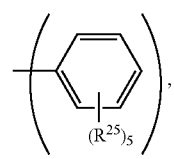

$C_{3-10}$ alkyl group, or $C_{2-10}$ alkenyl group, and at least one of $R^6$, $R^7$ and $R^8$ is not hydrogen; $R^{25}$ is independently hydrogen, $C_{3-10}$ alkyl group, or $C_{2-10}$ alkenyl group, and at least one of $R^{25}$ is not hydrogen; and $R^{38}$ is independently hydrogen, $C_{3-10}$ alkyl group, or $C_{2-10}$ alkenyl group, and at least one of $R^{38}$ is not hydrogen.

According to embodiments of the disclosure, the first repeating unit is

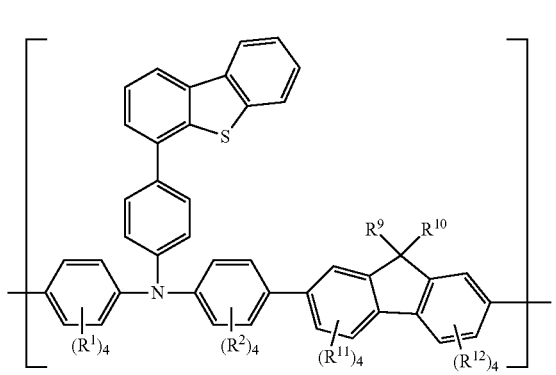

and the second repeating unit is

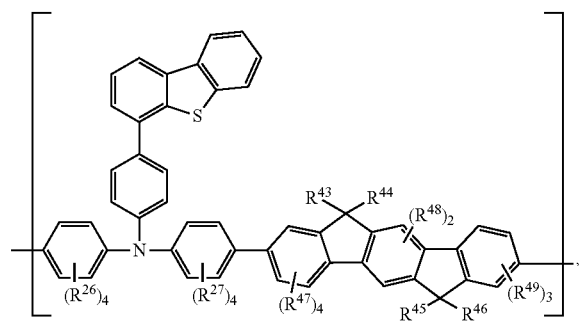

wherein $R^1$, $R^2$, $R^{11}$ and $R^{12}$ are independently hydrogen, halogen, or $C_{1-2}$ alkyl group; $R^9$ and $R^{10}$ are independently hydrogen, $C_{3-10}$ alkyl group, or $C_{2-10}$ alkenyl group, and at least one of $R^9$ and $R^{10}$ is not hydrogen; $R^{26}$, $R^{27}$, $R^{47}$, $R^{48}$ and $R^{49}$ are independently hydrogen, halogen, or $C_{1-2}$ alkyl group; and $R^{43}$ and $R^{44}$, $R^{45}$ and $R^{46}$ are independently hydrogen, $C_{3-10}$ alkyl group, or $C_{2-10}$ alkenyl group, and at least one of $R^{43}$, $R^{44}$, $R^{45}$ and $R^{46}$ is not hydrogen.

According to embodiments of the disclosure, first repeating unit is

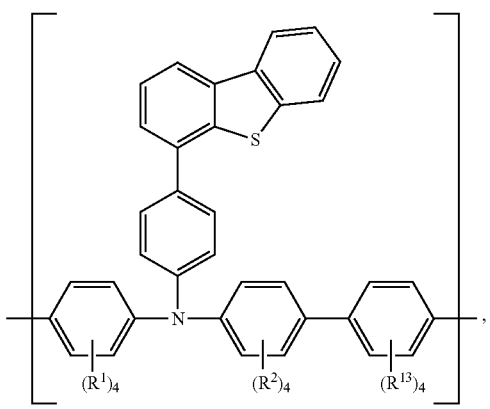

and the second repeating unit is

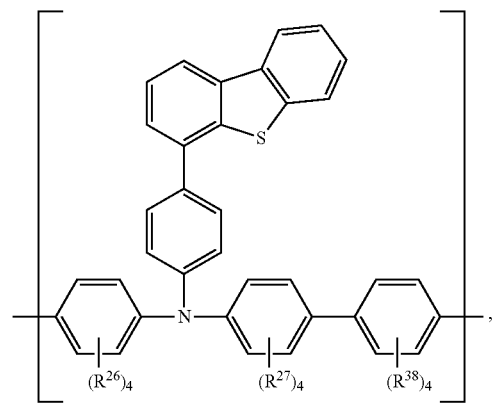

wherein $R^1$ and $R^2$ are independently hydrogen, halogen, or $C_{1-2}$ alkyl group; $R^{13}$ is independently hydrogen, $C_{3-10}$ alkyl group, or $C_{2-10}$ alkenyl group, and at least one of $R^{13}$ is not hydrogen; $R^{26}$ and $R^{27}$ are independently hydrogen, halogen, or $C_{1-2}$ alkyl group; and $R^{38}$ is independently hydrogen, $C_{3-10}$ alkyl group, or $C_{2-10}$ alkenyl group, and at least one of $R^{38}$ is not hydrogen.

According to embodiments of the disclosure, the disclosure also provides a method for preparing a polymer, and the method can include following steps. First, at least one first monomer and at least one second monomer are provided. Next, the first monomer, the second monomer, and a catalyst are dispersed in a solvent to obtain a mixture. Next, the mixture is subjected to a polymerization at 80° C.-150° C. for 1 hour to 24 hours, obtaining the polymer of the disclosure. According to embodiments of the disclosure, during the polymerization, a capping agent (such as phenyl bromide) is added to control the molecular weight and the polydispersity index (PDI) of the polymer.

According to embodiments of the disclosure, the first monomer has a structure represented by Formula (III):

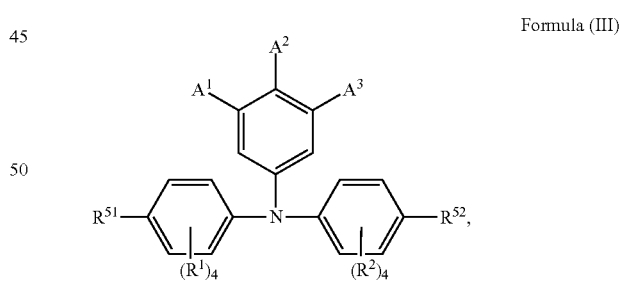

Formula (III)

wherein $A^1$, $A^2$ and $A^3$ can be independently hydrogen,

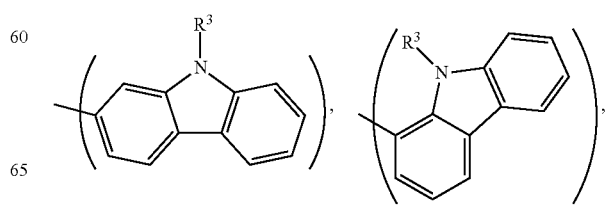

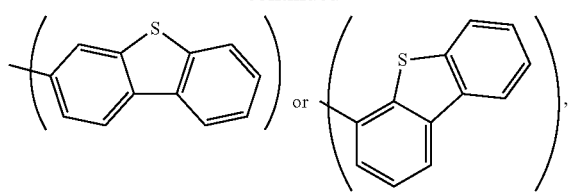

and at least one of $A^1$, $A^2$ and $A^3$ is not hydrogen; $R^1$ and $R^2$ are independently hydrogen, halogen, or $C_{1-2}$ alkyl group; and $R^{51}$ and $R^{52}$ are independently bromine, or pinacolborane group. For example, the first monomer can be

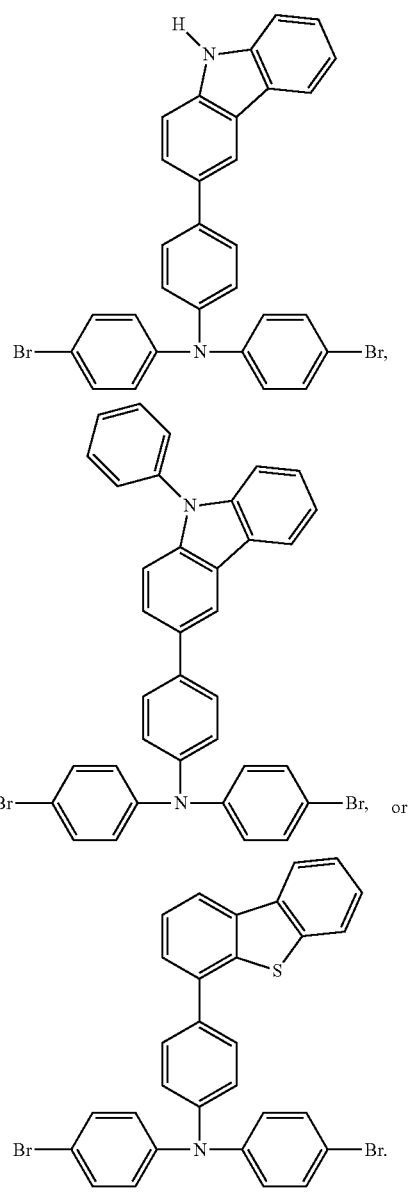

According to embodiments of the disclosure, the second monomer has a structure represented by Formula (IV), Formula (V), Formula (VI), Formula (VII), or Formula (VIII):

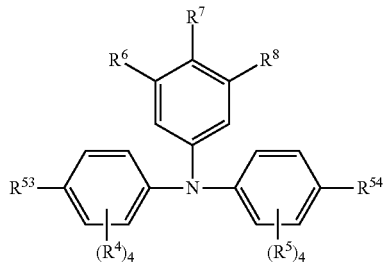

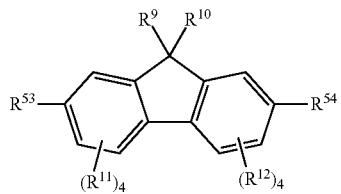

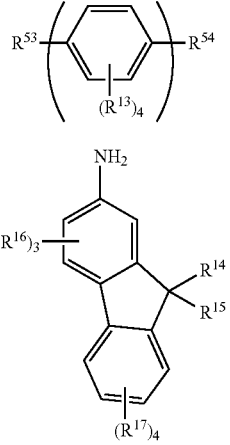

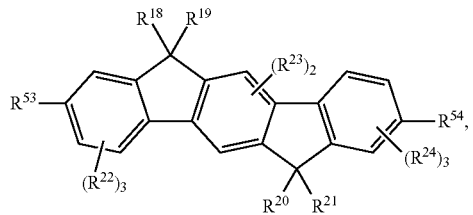

wherein $R^4$, $R^5$, $R^{11}$, $R^{12}$, $R^{16}$, $R^{17}$, $R^{22}$, $R^{23}$ and $R^{24}$ are independently hydrogen, halogen, or $C_{1-2}$ alkyl group; $R^6$, $R^7$ and $R^8$ are independently hydrogen,

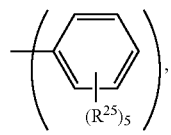

$C_{3-10}$ alkyl group, or $C_{2-10}$ alkenyl group, and at least one of $R^6$, $R^7$ and $R^8$ is not hydrogen; $R^9$ and $R^{10}$ are independently hydrogen, $C_{3-10}$ alkyl group, or $C_{2-10}$ alkenyl group, and at least one of $R^9$ and $R^{10}$ is not hydrogen; $R^{13}$ is independently hydrogen, $C_{3-10}$ alkyl group, or $C_{2-10}$ alkenyl group, and at least one of $R^{13}$ is not hydrogen; $R^{14}$ and $R^{15}$ are independently hydrogen, $C_{3-10}$ alkyl group, or $C_{2-10}$ alkenyl group, and at least one of $R^{14}$ and $R^{15}$ is not hydrogen; $R^{18}$, $R^{19}$, $R^{20}$ and $R^{21}$ are independently hydrogen, $C_{3-10}$ alkyl group, or $C_{2-10}$ alkenyl group, and at least one of $R^{18}$, $R^{19}$, $R^{20}$ and $R^{21}$ is not hydrogen; $R^{25}$ is independently hydrogen, $C_{3-10}$ alkyl group, or $C_{2-10}$ alkenyl group, and at least one of $R^{25}$ is not hydrogen; and $R^{53}$ and $R^{54}$ are independently bromine, or pinacolborane group. For example, the second monomer can be

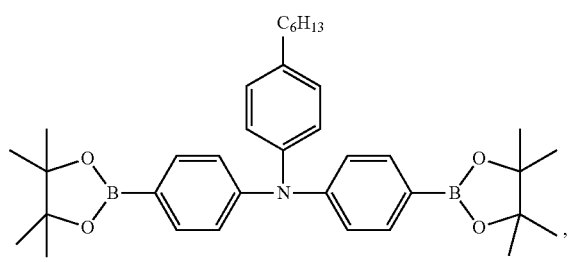

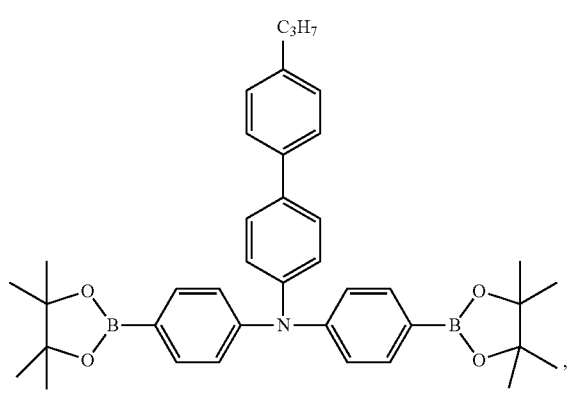

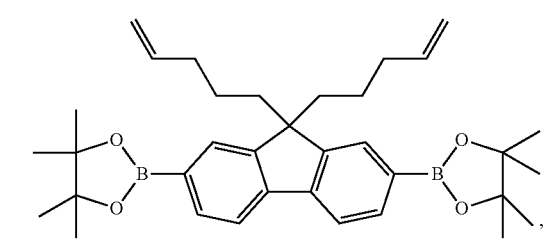

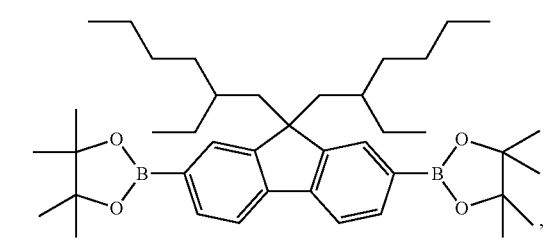

-continued

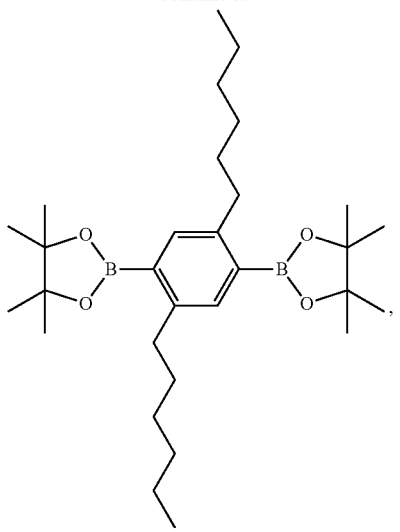

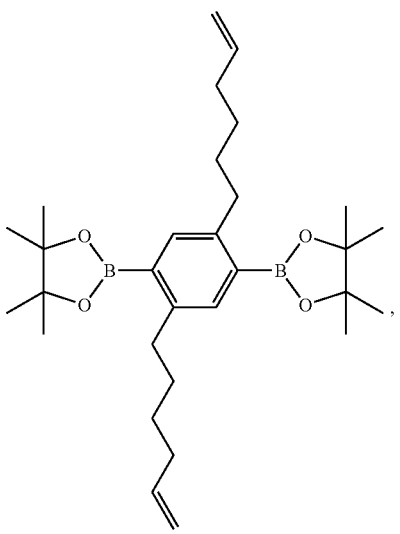

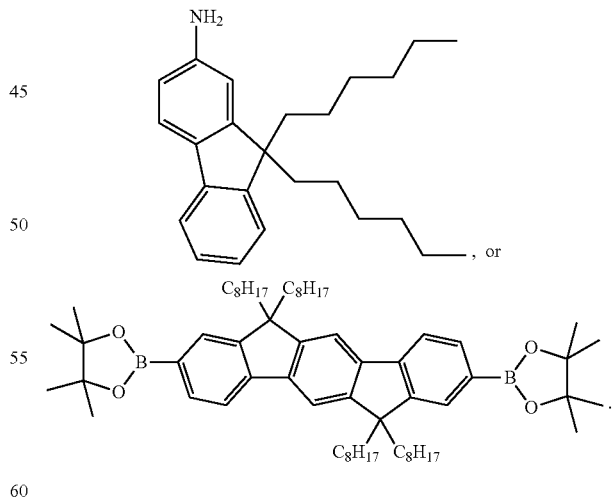

According to embodiments of the disclosure, the molar ratio of the first monomer to the second monomer can be 1:99 to 99:1, such as: 1:9, 1:8, 1:7, 1:6, 1:5, 1:4, 1:3, 1:2, 1:1, 2:1, 3:1, 4:1, 5:1, 6:1, 7:1, 8:1, or 9:1.

The repeating units of polymer of Examples in the disclosure are shown in Table 1.

TABLE 1

| | first repeating unit | second repeating unit |
|---|---|---|
| Example 1/ Polymer (I) | (structure) | — |
| Example 2/ Polymer (II) | (structure) | (structure) |
| Example 3/ Polymer (III) | (structure) | (structure) |

TABLE 1-continued
| | first repeating unit | second repeating unit |
|---|---|---|
| Example 4/ Polymer (IV) | 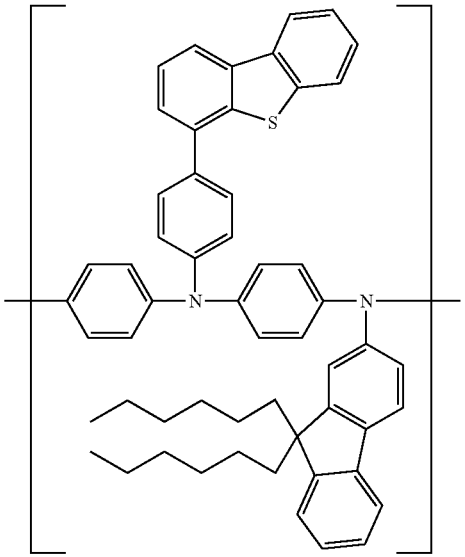 | — |
| Example 5/ Polymer (V) | 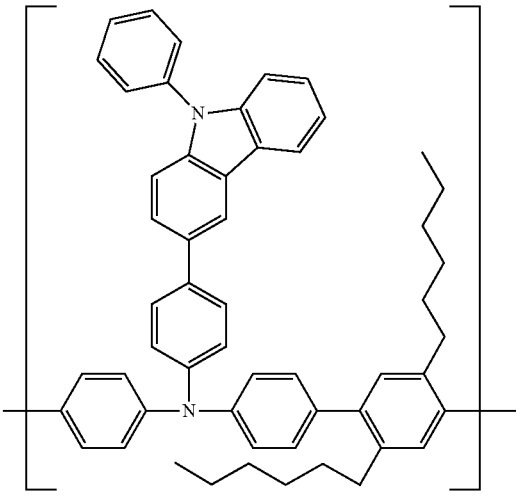 | — |
| Example 6/ polymer (VI) | 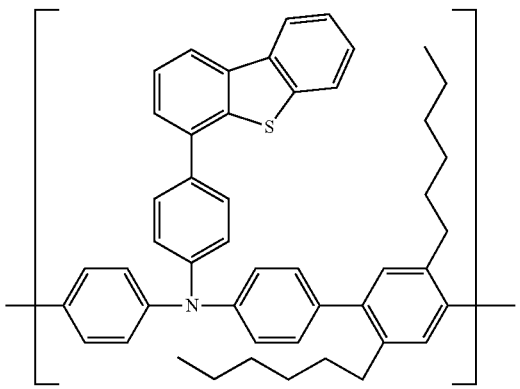 | — |

TABLE 1-continued

|  | first repeating unit | second repeating unit |
|---|---|---|
| Example 7/ Polymer (VII) | | |
| Example 8/ Polymer (VIII) | | |
| Example 9/ Polymer (IX) | | |
| Example 10/ Polymer (X) | | — |

TABLE 1-continued
| | first repeating unit | second repeating unit |
|---|---|---|
| Example 11/ polymer (XI) | 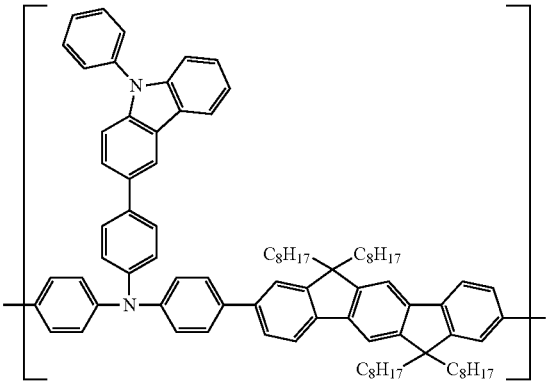 | 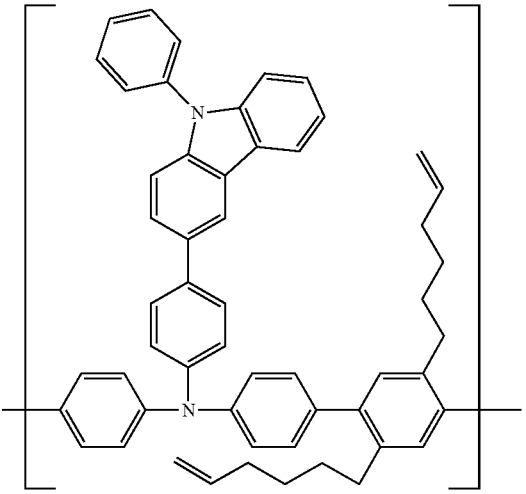 |
| Example 12/ Polymer (XII) | 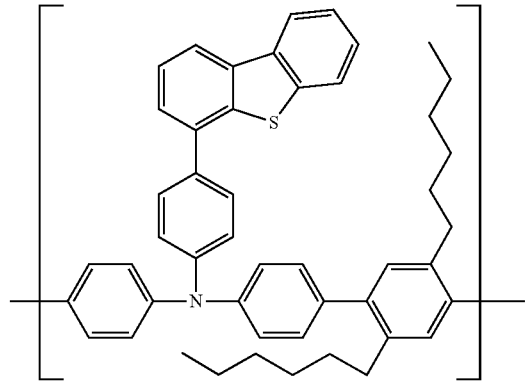 | 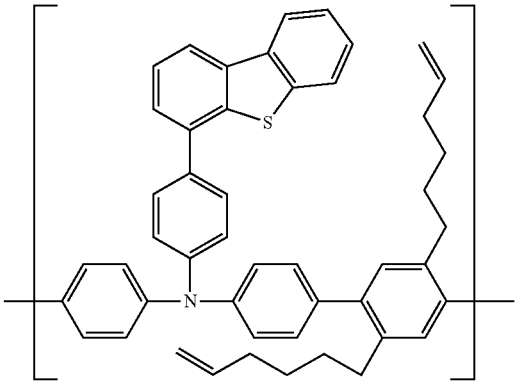 |
| Example 13/ Polymer (XIII) | 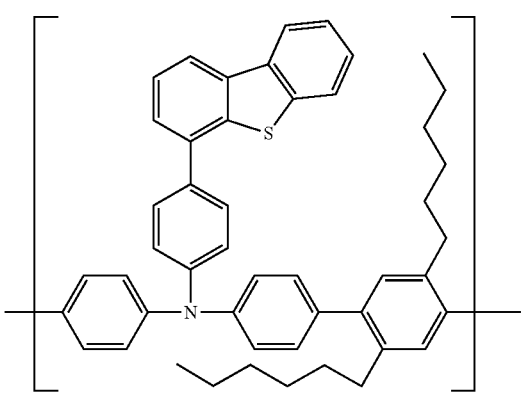 | 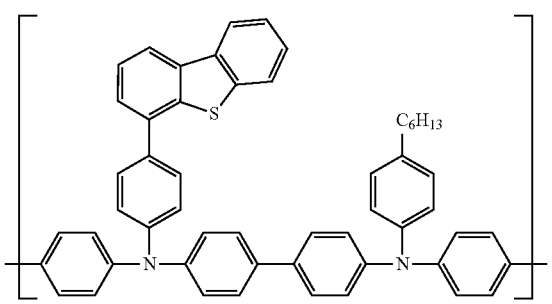 |

TABLE 1-continued

| | first repeating unit | second repeating unit |
|---|---|---|
| Example 14/ Polymer (XIV) | | |
| Example 15/ Polymer (XV) | | |

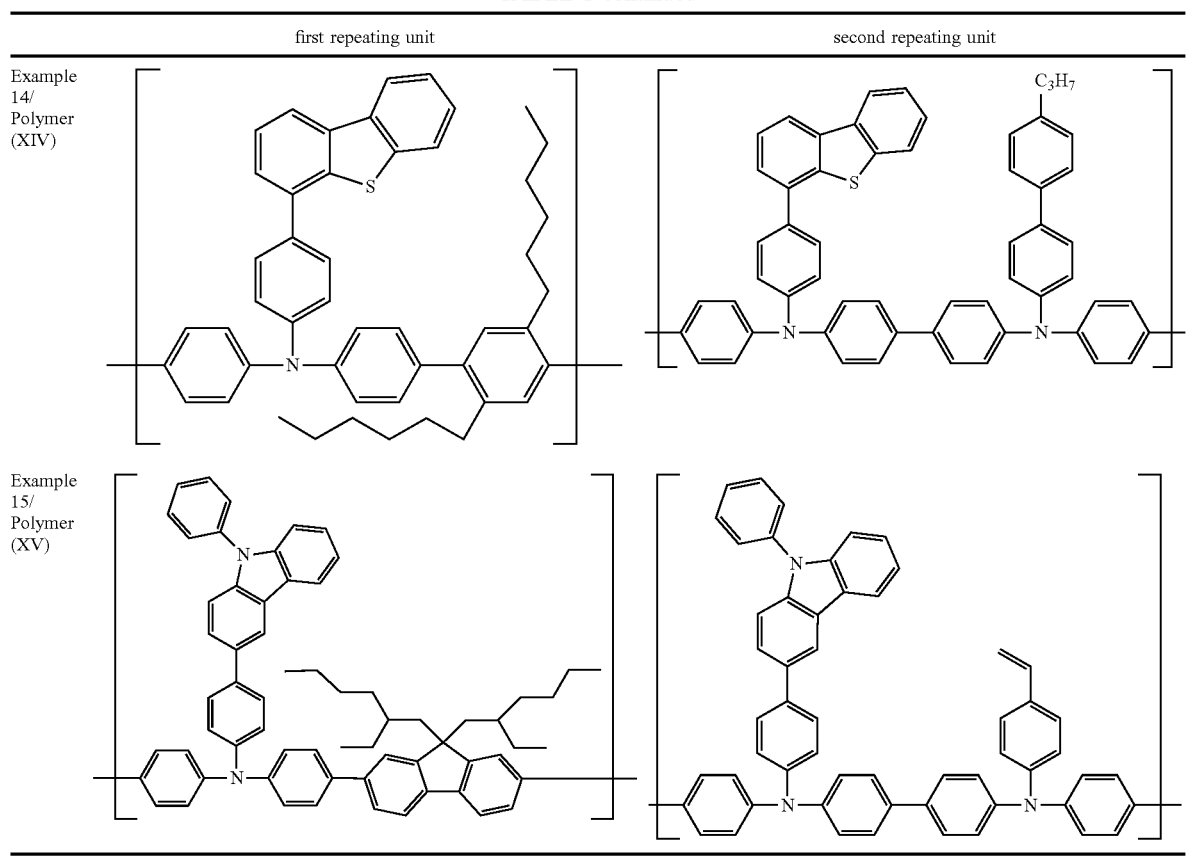

In addition, the number average molecular weight (Mn), weight average molecular weight (Mw), polydispersity index (PDI), triplet state energy level (ET), highest occupied molecular orbital (HOMO) energy level, and lowest unoccupied molecular orbital (LUMO) energy level of the polymers are shown in Table 2.

TABLE 2

| | number ratio of the first repeating unit to the second repeating unit | number average molecular weight (Mn) | weight average molecular weight (Mw) | polydispersity index (PDI) | triplet state energy level (eV) | highest occupied molecular orbital (HOMO) energy level (eV) | lowest unoccupied molecular orbital (LUMO) energy level (eV) |
|---|---|---|---|---|---|---|---|
| Example 1/ Polymer (I) | — | 11619 | 25566 | 2.20 | 2.24 | −5.53 | −2.65 |
| Example 2/ Polymer (II) | 2:3 | 3568 | 6858 | 1.92 | 2.26 | −5.37 | −2.64 |
| Example 3/ Polymer (III) | 2:3 | 3109 | 6116 | 1.97 | 2.27 | −5.34 | −2.42 |
| Example 4/ Polymer (IV) | — | 2983 | 6544 | 2.19 | 2.48 | −5.01 | −2.04 |
| Example 5/ Polymer (V) | — | 4568 | 9148 | 2.00 | 2.41 | −5.58 | −2.50 |
| Example 6/ polymer (VI) | — | 5175 | 9422 | 1.82 | 2.42 | −5.49 | −2.31 |
| Example 7/ Polymer (VII) | 3:2 | 2796 | 4638 | 1.66 | 2.33 | −5.20 | −2.30 |

TABLE 2-continued

| | number ratio of the first repeating unit to the second repeating unit | number average molecular weight (Mn) | weight average molecular weight (Mw) | polydispersity index (PDI) | triplet state energy level (eV) | highest occupied molecular orbital (HOMO) energy level (eV) | lowest unoccupied molecular orbital (LUMO) energy level (eV) |
|---|---|---|---|---|---|---|---|
| Example 8/ Polymer (VIII) | 2:3 | 8381 | 17224 | 2.06 | 2.22 | −5.41 | −2.54 |
| Example 9/ Polymer (IX) | 4:1 | 8550 | 48037 | 5.62 | 2.42 | −5.16 | 2.27 |
| Example 10/ Polymer (X) | — | 8136 | 16331 | 2.01 | 2.16 | −5.49 | −2.69 |
| Example 11/ polymer (XI) | 4:1 | 7839 | 17346 | 2.21 | 2.15 | −5.47 | −2.66 |
| Example 12/ Polymer (XII) | 4:1 | 7427 | 12944 | 1.74 | 2.4 | −5.51 | −2.39 |
| Example 13/ Polymer (XIII) | 2:3 | 4035 | 8076 | 2.00 | 2.33 | −5.35 | −2.40 |
| Example 14/ Polymer (XIV) | 2:3 | 6057 | 12925 | 2.13 | 2.34 | −5.33 | −2.35 |
| Example 15/ Polymer (XV) | 2:3 | 6775 | 13934 | 2.06 | 2.71 | −5.36 | −2.51 |

In order to clearly illustrate the method for preparing the polymer of the disclosure, the preparation of polymers disclosed in Examples 1-8, 12 and 13 are described in detail below.

Preparation of Monomer (I)

Compound (1) (27.1 mmol) was dissolved in tetrahydrofuran (THF) (36.4 mL), obtaining a first solution. Next, n-butyl lithium (n-BuLi) (29.9 mmol) was added into the first solution at −78° C., and the result was stirred at room temperature for 3 hours, obtaining a second solution. Next, Compound (2) (85.5 mmol) was added into the second solution at −78° C., and the result was stirred at room temperature for 16 hours, obtaining a third solution. Next, a hydrochloric acid aqueous solution (10%) was added into the third solution, such that the third solution had a pH value about 2. After reacting for 2 hours, the obtained solution was poured into hexane (500 mL) and a precipitate was formed. After filtration, Compound (3) was obtained. The synthesis pathway of the above reaction was as follows:

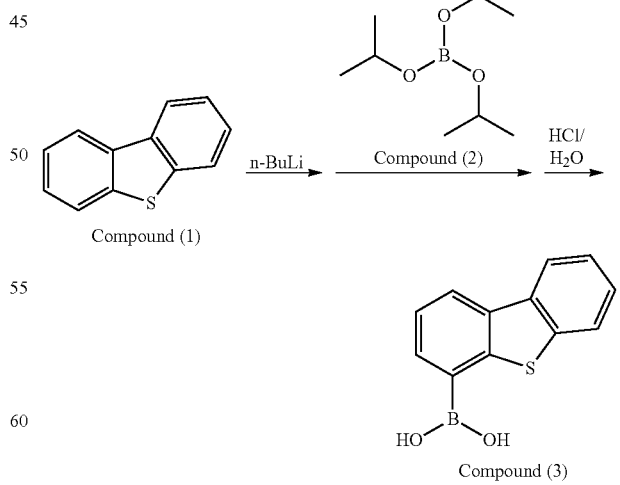

Next, Compound (3) (6.94 mmol), Compound (4) (6.94 mmol), tetrakis(triphenylphosphine)palladium (Pd(PPh$_3$)$_4$) (0.42 mmol), potassium carbonate (K$_2$CO$_3$) (2.88 g, 20.83 mmol), toluene (24 mL), ethanol (3.2 mL), and water (9.2 mL) were mixed, obtaining a first solution. Next, the first solution was stirred at 80° C. for 16 hours, obtaining a second solution. Next, the second solution was extracted with dichloromethane (DCM) and water, and then the organic phase was collected. Next, the organic phase was dehydrated with magnesium sulfate, concentrated and purified with column chromatography (with n-hexane as the extraction solvent), obtaining Compound (5). The synthesis pathway of the above reaction was as follows:

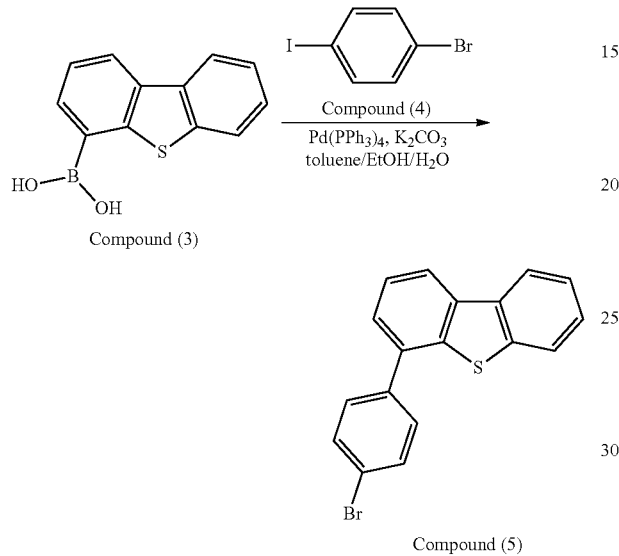

Next, Compound (5) (1.70 mmol), Compound (6) (1.70 mmol), tris(dibenzylideneacetone) dipalladium (Pd$_2$(dba)$_3$) (0.05 mmol), tri-tert-butylphosphonium tetrafluoroborate (P(tBu)$_3$HBF$_4$) (0.10 mmol), sodium tert-butoxide (NaOtBu) (2.03 mmol), and toluene (8.5 mL) were mixed, obtaining a first solution. Next, the first solution was stirred at 80° C. for 16 hours, obtaining a second solution. Next, the second solution was extracted with dichloromethane (DCM) and water, and then the organic phase was collected. Next, the organic phase was dehydrated with magnesium sulfate and then concentrated. Next, the result was purified with column chromatography (with n-hexane/ethyl acetate as the extraction solvent) and subjected to a recrystallization with hexane, obtaining Compound (7).

The synthesis pathway of the above reaction was as follows:

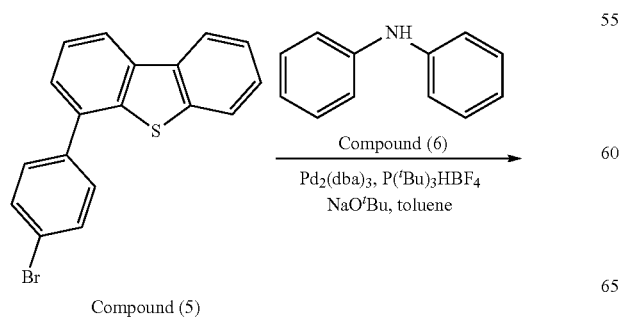

-continued

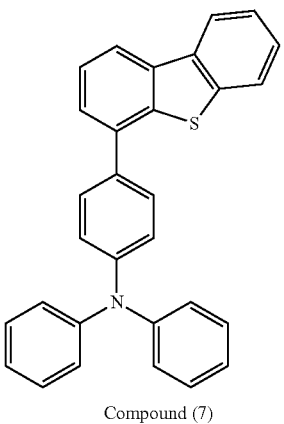

Next, Compound (7) (3.58 mmol) was dissolved in dimethylformamide (DMF) (27.4 mL), obtaining a first solution. Next, N-bromosuccinimide (NBS) (7.34 mmol) was dissolved in dimethylformamide (DMF) (6.24 mL), obtaining a second solution. Next, after cooling the first solution to 0° C., the second solution was added dropwisely into the first solution. After the reaction was complete, water was added into the result to precipitate a solid. After filtering and drying, Monomer (I) was obtained. The synthesis pathway of the above reaction was as follows:

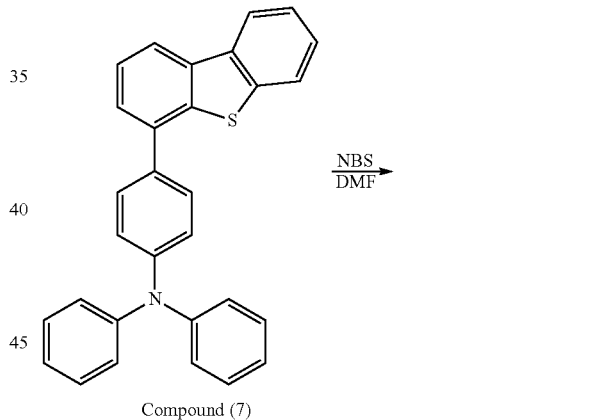

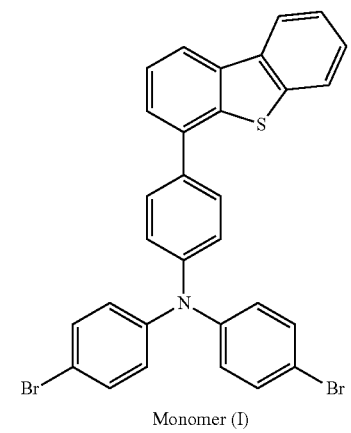

Preparation of Monomer (II)

Next, Compound (8) (3.1 mmol), Compound (9) (3.25 mmol), tetrakis(triphenylphosphine)palladium (Pd(PPh₃)₄) (0.10 mmol), potassium carbonate (K₂CO₃) (9.29 mmol), toluene (10.7 mL), ethanol (1 mL), and water (4.1 mL) were mixed, obtaining a first solution. Next, the first solution was stirred at 80° C. for 16 hours, obtaining a second solution. Next, the second solution was extracted with dichloromethane (DCM) and water, and then the organic phase was collected. Next, the organic phase was dehydrated with magnesium sulfate, concentrated and purified with column chromatography (with n-hexane as the extraction solvent), obtaining compound (10). The synthesis pathway of the above reaction was as follows:

Next, Compound (10) (2.06 mmol) was dissolved in dimethylformamide (DMF) (40 mL), obtaining a first solution. Next, N-bromosuccinimide (NBS) (4.11 mmol) was dissolved in dimethylformamide (DMF) (20 mL), obtaining a second solution. Next, after cooling the first solution to 0° C., the second solution was added dropwisely into the first solution. After the reaction was complete, the result was extracted with dichloromethane (DCM) and water, and then the organic phase was collected. Next, the organic phase was dehydrated with magnesium sulfate, concentrated, and purified with column chromatography (with n-hexane/dichloromethane as the extraction solvent), obtaining Monomer (II). The synthesis pathway of the above reaction was as follows:

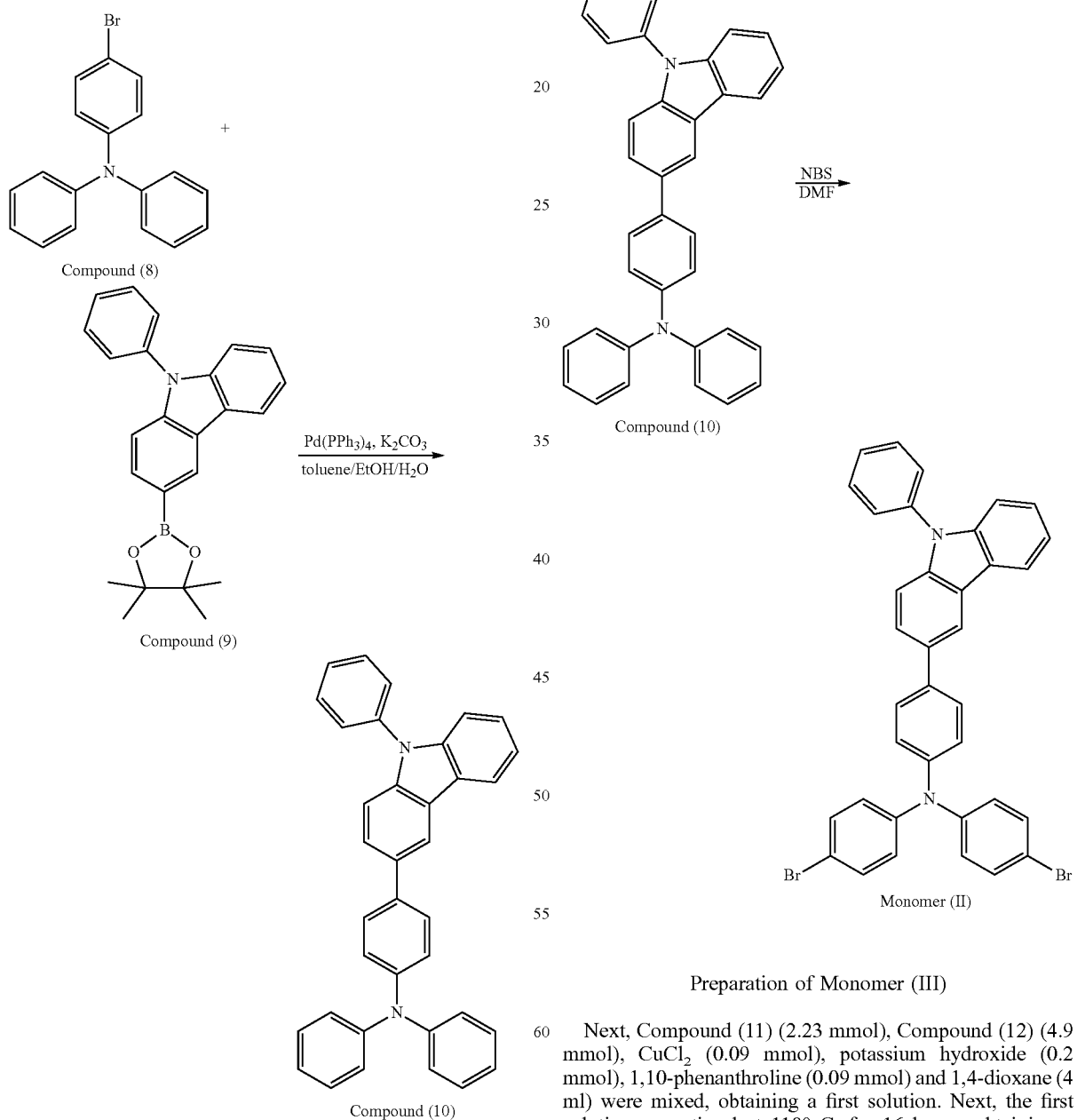

Preparation of Monomer (III)

Next, Compound (11) (2.23 mmol), Compound (12) (4.9 mmol), CuCl₂ (0.09 mmol), potassium hydroxide (0.2 mmol), 1,10-phenanthroline (0.09 mmol) and 1,4-dioxane (4 ml) were mixed, obtaining a first solution. Next, the first solution was stirred at 110° C. for 16 hours, obtaining a second solution. Next, the second solution was extracted with dichloromethane (DCM) and water, and then the organic phase was collected. Next, the organic phase was dehydrated with magnesium sulfate, concentrated and purified with column chromatography (with n-hexane as the extraction solvent), obtaining Compound (13). The synthesis pathway of the above reaction was as follows:

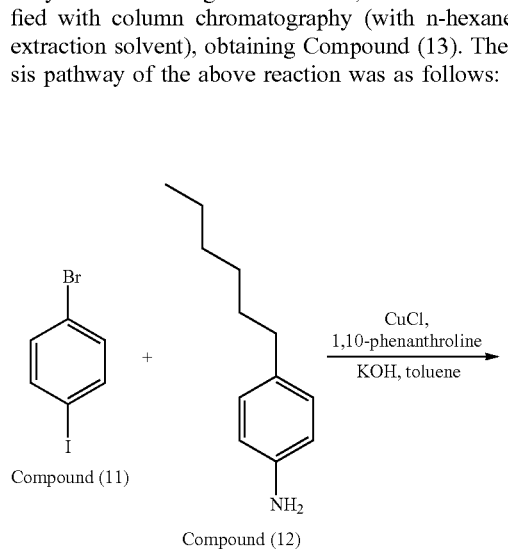

Compound (11) + Compound (12) →(CuCl, 1,10-phenanthroline, KOH, toluene)→

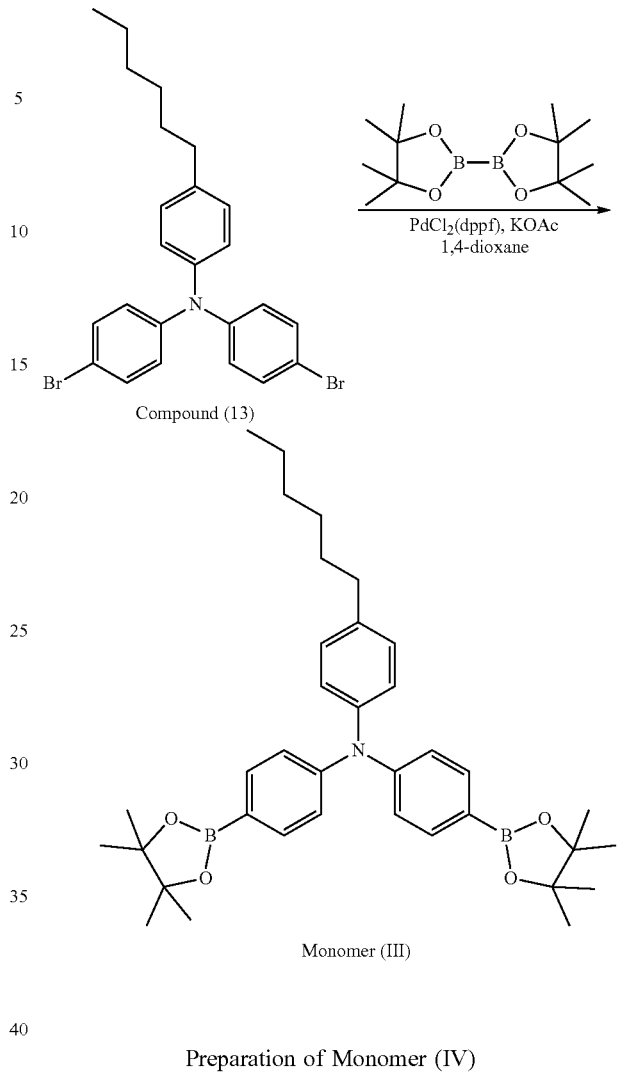

Compound (13)

→(PdCl₂(dppf), KOAc, 1,4-dioxane)→

Monomer (III)

Next, Compound (13) (1 mmol), bis(pinacolato)diboron (2.8 mmol), [1,1'-bis(diphenylphosphino)ferrocene]dichloropalladium (II) (PdCl₂(dppf)) (0.05 mmol), potassium acetate (5.86 mmol) and 1,4-dioxane (10 ml) were mixed, obtaining a first solution. Next, the first solution was stirred at 80° C. for 16 hours, obtaining a second solution. Next, the second solution was extracted with dichloromethane (DCM) and water, and then the organic phase was collected. Next, the organic phase was dehydrated with magnesium sulfate, concentrated and purified with column chromatography (with n-hexane/ethyl acetate as the extraction solvent), obtaining Monomer (III). The synthesis pathway of the above reaction was as follows:

Preparation of Monomer (IV)

Sodium hydroxide (NaOH) (25 g), water (25 ml), 2-ethylhexyl bromide (15.43 mmol), and toluene (25 ml) were mixed, obtaining a first solution. Next, Compound (14) (7.72 mmol) and tetrabutylammonium bromide (Bu₄NBr) (0.6 mmol) was added into the first solution, obtaining a second solution. Next, the second solution was stirred at 120° C. for 16 hours, obtaining a third solution. Next, the organic phase of the third solution was collected and hydrochloric acid aqueous solution (10%) was added into the organic phase to perform a neutralization. Next, the result was extracted with ethyl acetate and water, and then the organic phase was collected. Next, the organic phase was dehydrated with magnesium sulfate, concentrated and purified with column chromatography (with n-hexane as the extraction solvent), obtaining Compound (15). The synthesis pathway of the above reaction was as follows:

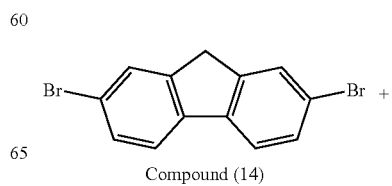

Compound (14)

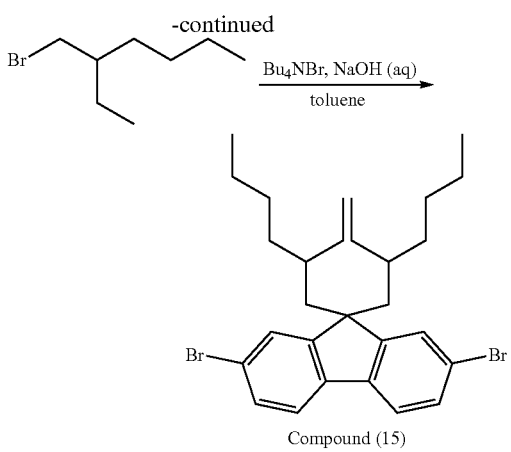

Compound (15)

Next, Compound (15) (0.74 mmol), bis(pinacolato)diboron (2.1 mmol), [1,1'-bis(diphenylphosphino)ferrocene]dichloropalladium (II) (PdCl$_2$(dppf)) (0.04 mmol), potassium acetate (4.36 mmol) and 1,4-dioxane (7.5 ml) were mixed, obtaining a first solution. Next, the first solution was stirred at 80° C. for 16 hours, obtaining a second solution. Next, the result was extracted with ethyl acetate and water, and then the organic phase was collected. Next, the organic phase was dehydrated with magnesium sulfate, concentrated and purified with column chromatography (with n-hexane/ethyl acetate as the extraction solvent), obtaining Monomer (IV). The synthesis pathway of the above reaction was as follows:

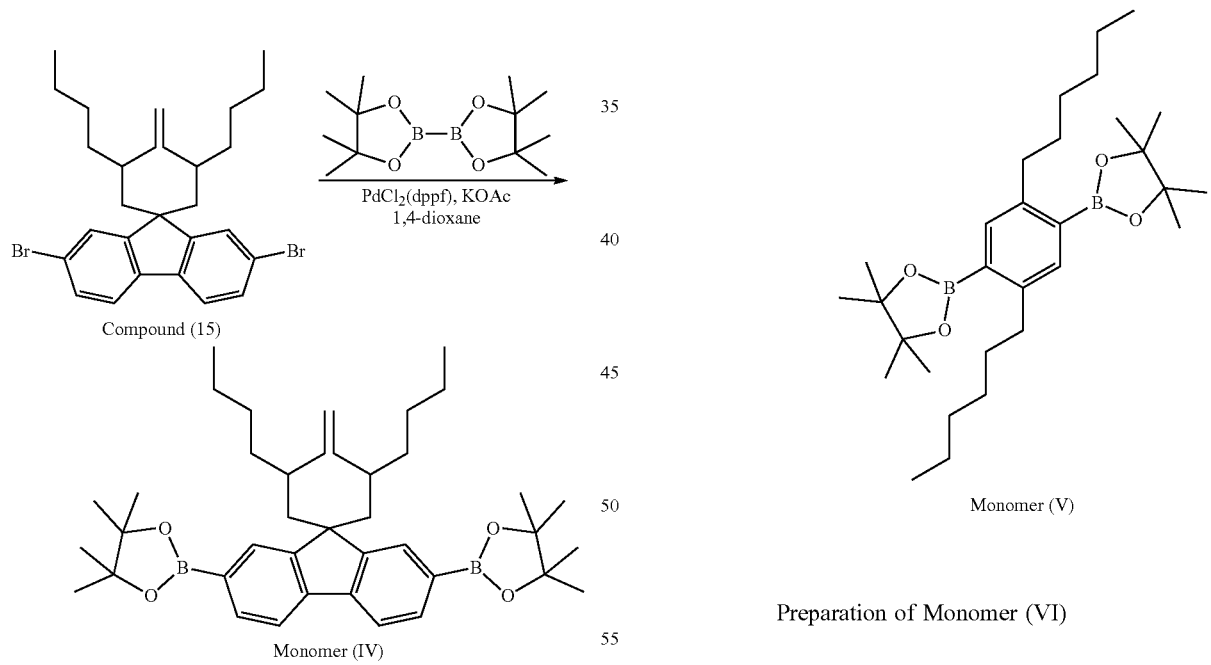

Preparation of Monomer (V)

Compound (16) (0.74 mmol), bis(pinacolato)diboron (2.1 mmol), [1,1'-bis(diphenylphosphino)ferrocene]dichloropalladium (II) (PdCl$_2$(dppf)) (0.04 mmol), potassium acetate (4.36 mmol) and 1,4-dioxane (7.5 ml) were mixed, obtaining a first solution. Next, the first solution was stirred at 80° C. for 16 hours, obtaining a second solution. Next, the result was extracted with ethyl acetate and water, and then the organic phase was collected. Next, the organic phase was dehydrated with magnesium sulfate, concentrated and purified with column chromatography (with n-hexane/ethyl acetate as the extraction solvent), obtaining monomer (V). The synthesis pathway of the above reaction was as follows:

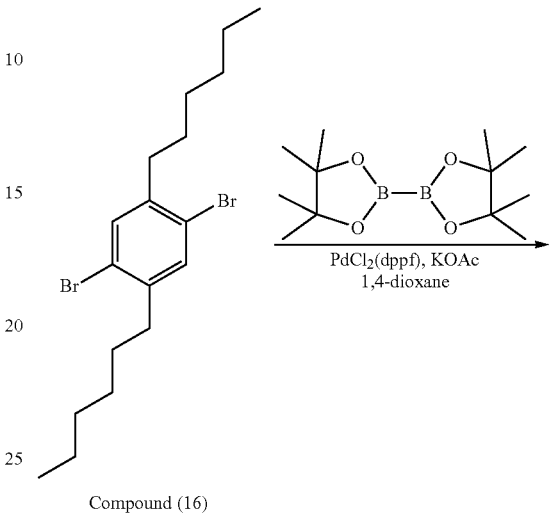

Preparation of Monomer (VI)

Compound (17) (0.74 mmol), bis(pinacolato)diboron (2.1 mmol), [1,1'-bis(diphenylphosphino)ferrocene]dichloropalladium (II) (PdCl$_2$(dppf)) (0.04 mmol), potassium acetate (4.36 mmol) and 1,4-dioxane (7.5 ml) were mixed, obtaining a first solution. Next, the first solution was stirred at 80° C. for 16 hours, obtaining a second solution. Next, the result was extracted with ethyl acetate and water, and then the organic phase was collected. Next, the organic phase was dehydrated with magnesium sulfate, concentrated and purified with column chromatography (with n-hexane/ethyl acetate as the extraction solvent), obtaining Monomer (VI).

The synthesis pathway of the above reaction was as follows:

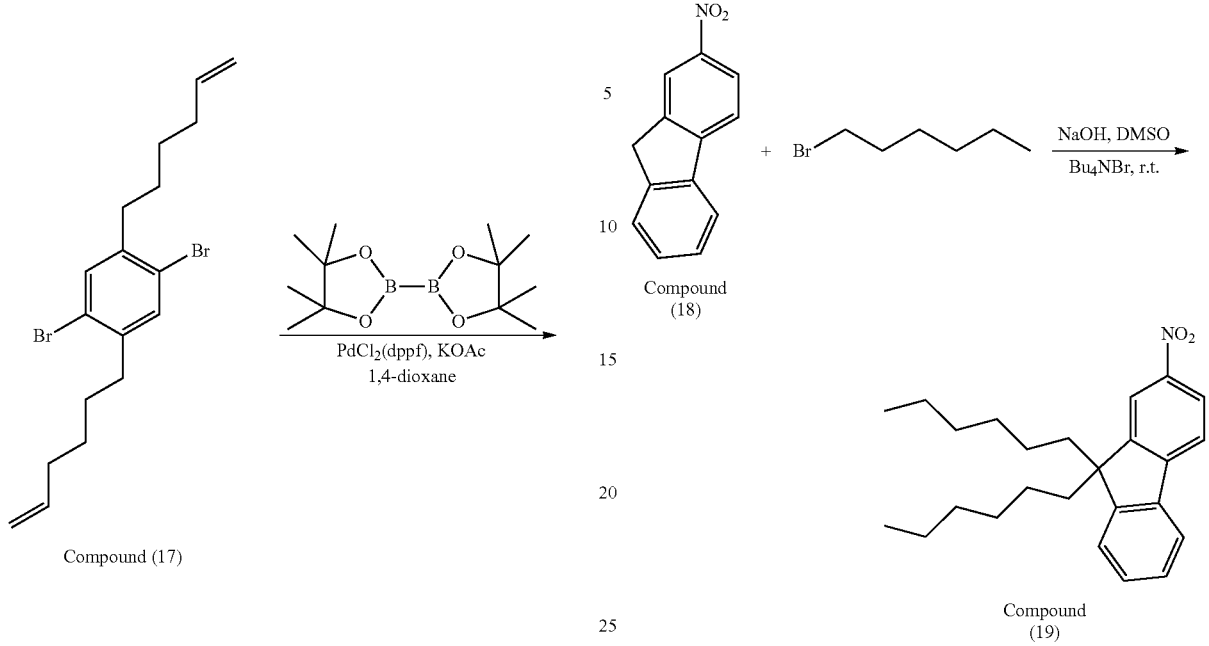

Preparation of Monomer (VII)

Compound (18) (11.7 mmol), bromohexane (35.5 mmol), tetrabutylammonium bromide (Bu₄NBr) (4.95 mmol), dimethyl sulfoxide (DMSO) (DMSO) (22 ml) were mixed, obtaining a first solution. Next, sodium hydroxide aqueous solution (3.5 ml, 17 M) was added into the first solution, obtaining a second solution. Next, the second solution was stirred at room temperature for 3 hours, obtaining a third solution. Next, the third solution was extracted with ethyl acetate and water, and then the organic phase was collected. Next, the organic phase was dehydrated with magnesium sulfate, concentrated and purified with column chromatography (with n-hexane/ethyl acetate as the extraction solvent), obtaining compound (19). The synthesis pathway of the above reaction was as follows:

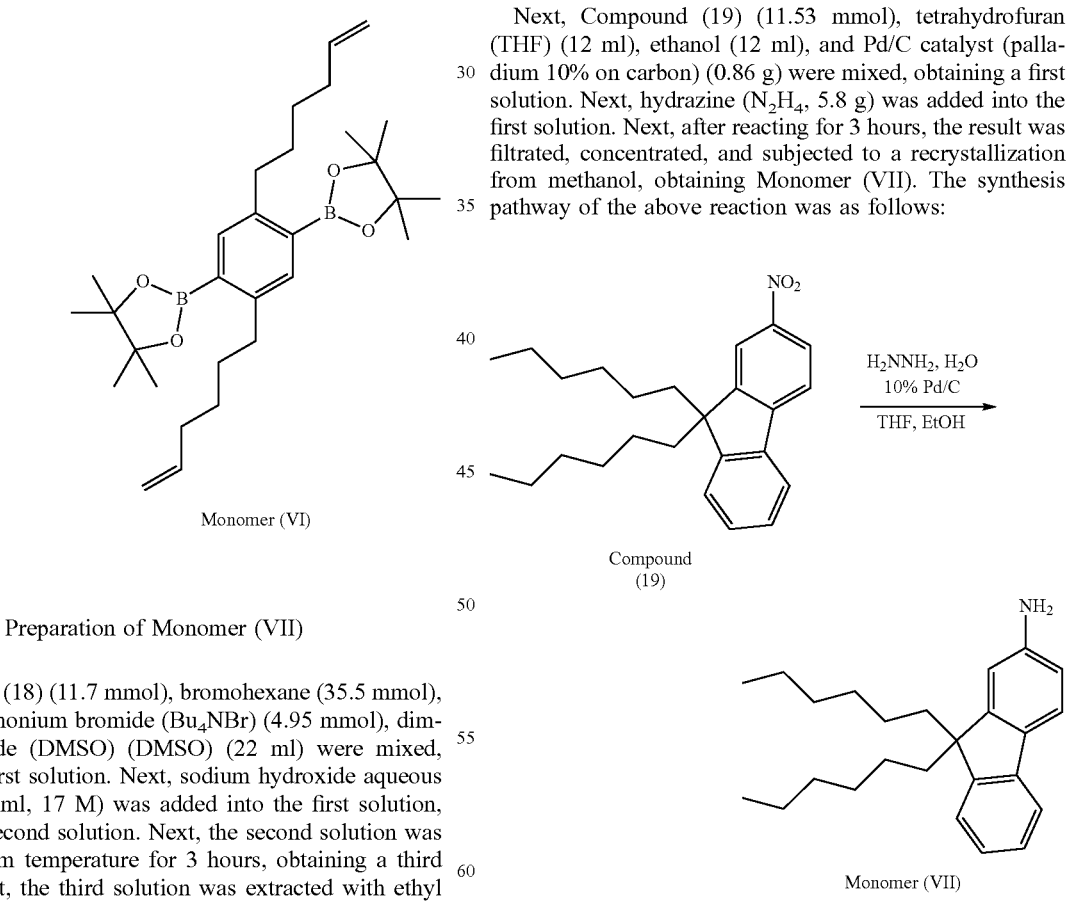

Next, Compound (19) (11.53 mmol), tetrahydrofuran (THF) (12 ml), ethanol (12 ml), and Pd/C catalyst (palladium 10% on carbon) (0.86 g) were mixed, obtaining a first solution. Next, hydrazine (N₂H₄, 5.8 g) was added into the first solution. Next, after reacting for 3 hours, the result was filtrated, concentrated, and subjected to a recrystallization from methanol, obtaining Monomer (VII). The synthesis pathway of the above reaction was as follows:

Preparation of Monomer (VIII)

Next, Compound (20) (0.74 mmol), bis(pinacolato)diboron (2.1 mmol), [1,1'-bis(diphenylphosphino)ferrocene]dichloropalladium (II) (PdCl$_2$(dppf)) (0.04 mmol), potassium acetate (4.36 mmol) and 1,4-dioxane (7.5 ml) were mixed, obtaining a first solution. Next, the first solution was stirred at 80° C. for 16 hours, obtaining a second solution. Next, the result was extracted with ethyl acetate and water, and then the organic phase was collected. Next, the organic phase was dehydrated with magnesium sulfate, concentrated and purified with column chromatography (with n-hexane/ethyl acetate as the extraction solvent), obtaining Monomer (VIII). The synthesis pathway of the above reaction was as follows:

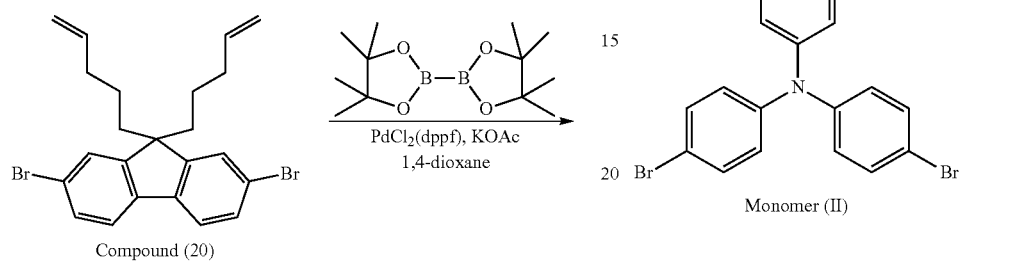

Compound (20) → Monomer (VIII)

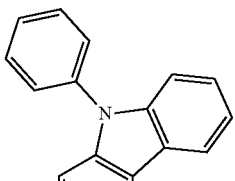

Monomer (II)

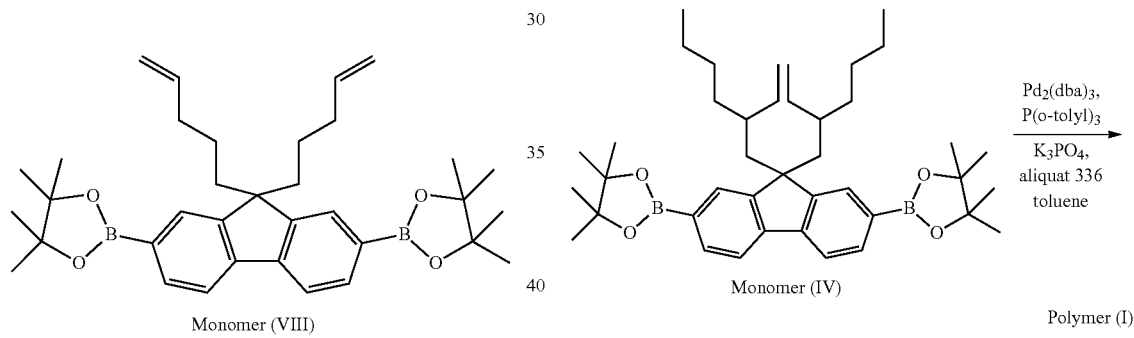

Monomer (IV) → Polymer (I)

Preparation of Polymer (I)

Monomer (II) (0.26 mmol), monomer (IV) (0.27 mmol), tris(dibenzylideneacetone) dipalladium (Pd$_2$(dba)$_3$) (0.008 mmol), tris(ortho-tolyl)phosphine (P(o-tolyl)$_3$) (0.05 mmol), potassium phosphate (K$_3$PO$_4$) (1.03 mmol), and toluene (1.2 mL) were mixed, obtaining a first solution. Next, toluene (1.2 mL), water (1.2 mL), 1,4-dioxane (1.2 mL) and trioctylmethylammonium chloride (Aliquat 336) were added into the first solution, obtaining a second solution. Next, the second solution was stirred at 100° C. for 18 hours, and then bromobenzene was added into the second solution. The result was stirred at 100° C. for 4 hours. After cooling to room temperature, the result was extracted by toluene and water, and then the organic phase was collected. Next, the organic phase was added into methanol to perform a reprecipitation. The precipitate was washed with methanol, acetone and n-hexane. Finally, the result was purified with column chromatography (with toluene as the extraction solvent), obtaining Polymer (I). The synthesis pathway of the above reaction was as follows:

Preparation of Polymer (II)

Monomer (II) (0.26 mmol), monomer (III) (0.17 mmol), monomer (IV) (0.1 mmol), tris(dibenzylideneacetone) dipalladium (Pd$_2$(dba)$_3$) (0.008 mmol), tris(ortho-tolyl)phosphine (P(o-tolyl)$_3$) (0.05 mmol), potassium phosphate (K$_3$PO$_4$) (1.03 mmol), and toluene (1.2 mL) were mixed, obtaining a first solution. Next, toluene (1.2 mL), water (1.2 mL), 1,4-dioxane (1.2 mL) and trioctylmethylammonium chloride (Aliquat 336) were added into the first solution, obtaining a second solution. Next, the second solution was stirred at 100° C. for 18 hours, and then bromobenzene was added into the second solution. The result was stirred at 100° C. for 4 hours. After cooling to room temperature, the result was extracted from toluene and water, and then the organic phase was collected. Next, the organic phase was added into methanol to perform a reprecipitation. The precipitate was washed with methanol, acetone and n-hexane. Finally, the result was purified with column chromatography (with toluene as the extraction solvent), obtaining Polymer (II). The synthesis pathway of the above reaction was as follows:

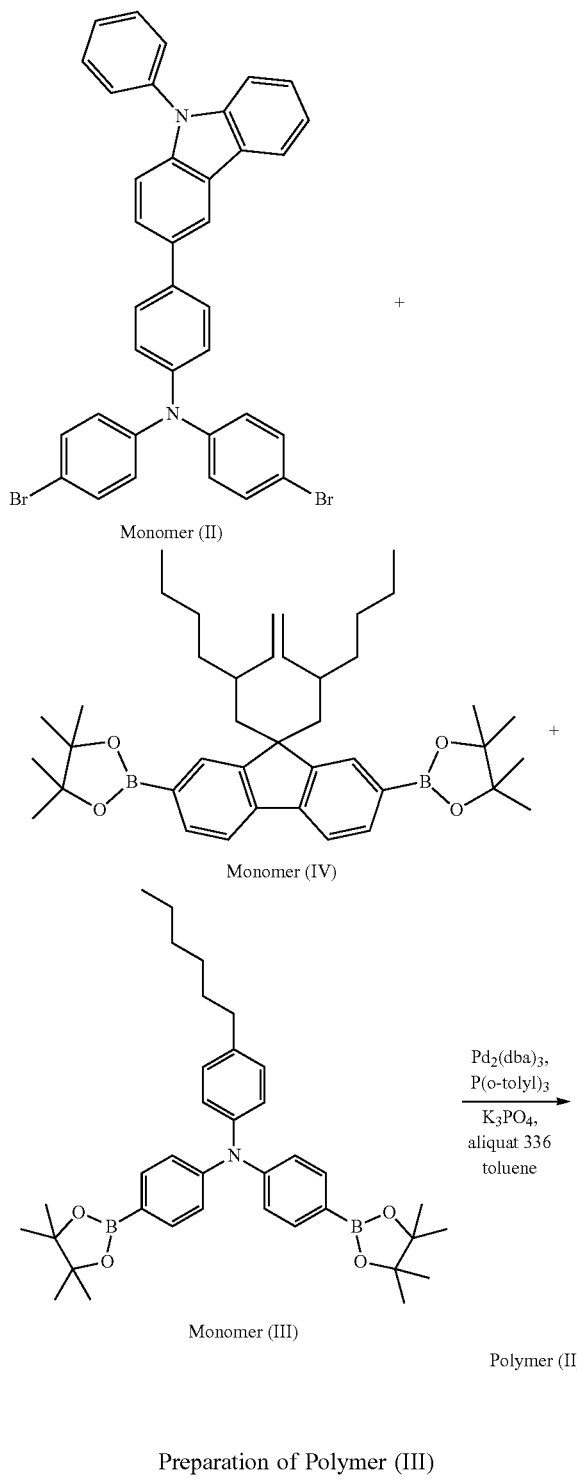

Preparation of Polymer (III)

Monomer (I) (0.26 mmol), Monomer (III) (0.17 mmol), Monomer (IV) (0.1 mmol), tris(dibenzylideneacetone) dipalladium ($Pd_2(dba)_3$) (0.008 mmol), tris(ortho-tolyl) phosphine ($P(o\text{-tolyl})_3$) (0.05 mmol), potassium phosphate ($K_3PO_4$) (1.03 mmol), and toluene (1.2 mL) were mixed, obtaining a first solution. Next, toluene (1.2 mL), water (1.2 mL), 1,4-dioxane (1.2 mL) and trioctylmethylammonium chloride (Aliquat 336) were added into the first solution, obtaining a second solution. Next, the second solution was stirred at 100° C. for 18 hours, and then bromobenzene was added into the second solution. The result was stirred at 100° C. for 4 hours. After cooling to room temperature, the result was extracted from toluene and water, and then the organic phase was collected. Next, the organic phase was added into methanol to perform a reprecipitation. The precipitate was washed with methanol, acetone and n-hexane. Finally, the result was purified with column chromatography (with toluene as the extraction solvent), obtaining Polymer (III).

The synthesis pathway of the above reaction was as follows:

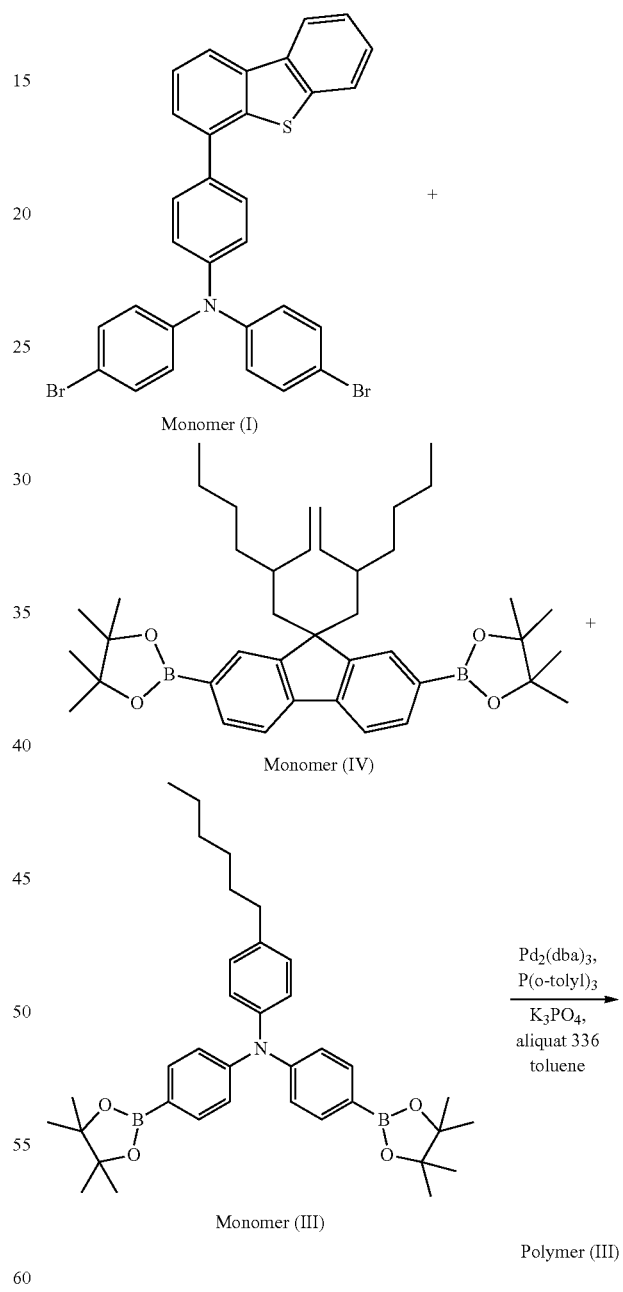

Preparation of Polymer (IV)

Monomer (I) (0.17 mmol), Monomer (VII) (0.18 mmol), tris(dibenzylideneacetone) dipalladium ($Pd_2(dba)_3$) (0.002 mmol), 4-(N,N-dimethylamino)phenyl)di-tert-butyl phosphine (APhos) (0.014 mmol), sodium tert-butoxide (NaOtBu) (0.66 mmol), and toluene (1.8 mL) were mixed, obtaining a first solution. Next, the first solution was stirred at 110° C. for 2 hours, and then bromobenzene was added into the first solution. The result was stirred at 100° C. for 16 hours. After cooling to room temperature, the result was extracted from toluene and water, and then the organic phase was collected. Next, the organic phase was added into methanol to perform a reprecipitation. The precipitate was washed with methanol, acetone and n-hexane. Finally, the result was purified with column chromatography (with toluene as the extraction solvent), obtaining Polymer (IV). The synthesis pathway of the above reaction was as follows:

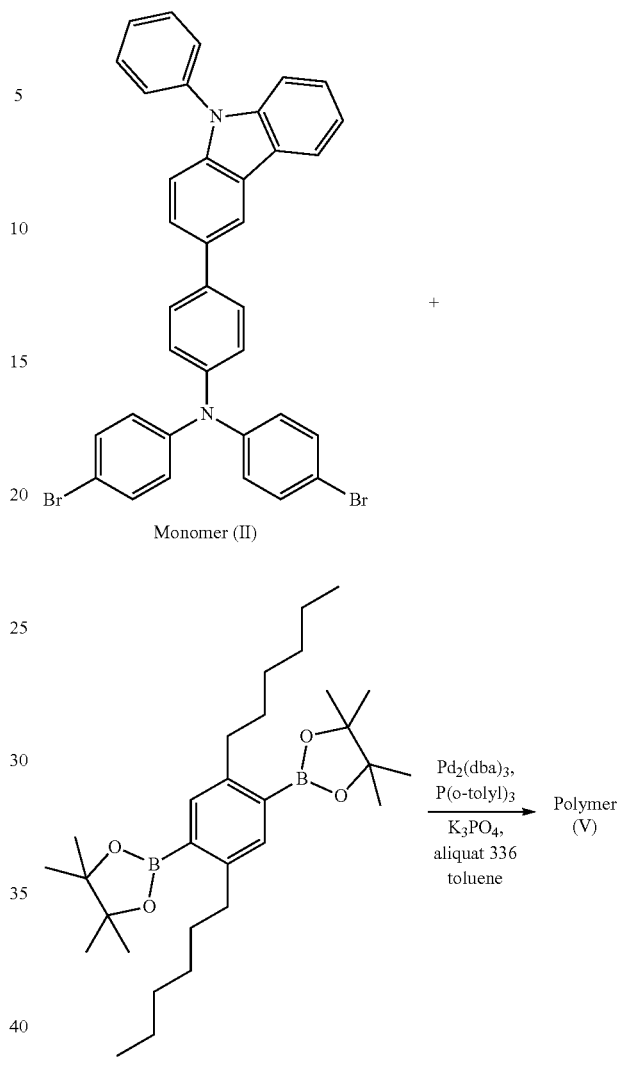

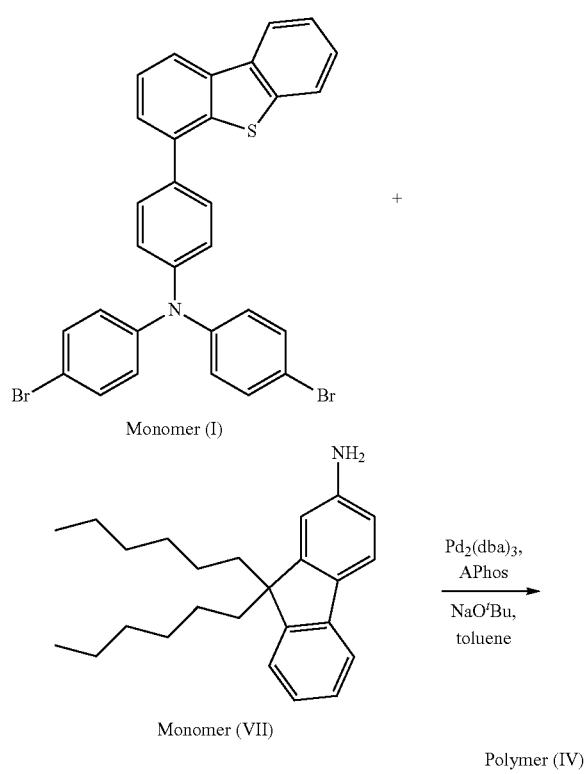

Preparation of Polymer (V)

Monomer (II) (0.26 mmol), Monomer (V) (0.27 mmol), tris(dibenzylideneacetone) dipalladium (Pd$_2$(dba)$_3$) (0.008 mmol), tris(ortho-tolyl)phosphine (P(o-tolyl)$_3$) (0.05 mmol), potassium phosphate (K$_3$PO$_4$) (1.03 mmol), and toluene (1.2 mL) were mixed, obtaining a first solution. Next, toluene (1.2 mL), water (1.2 mL), 1,4-dioxane (1.2 mL) and trioctylmethylammonium chloride (Aliquat 336) were added into the first solution, obtaining a second solution. Next, the second solution was stirred at 100° C. for 18 hours, and then bromobenzene was added into the second solution. The result was stirred at 100° C. for 4 hours. After cooling to room temperature, the result was extracted from toluene and water, and then the organic phase was collected. Next, the organic phase was added into methanol to perform a reprecipitation. The precipitate was washed with methanol, acetone and n-hexane. Finally, the result was purified with column chromatography (with toluene as the extraction solvent), obtaining Polymer (V). The synthesis pathway of the above reaction was as follows:

Preparation of Polymer (VI)

Monomer (I) (0.26 mmol), Monomer (VI) (0.27 mmol), tris(dibenzylideneacetone) dipalladium (Pd$_2$(dba)$_3$) (0.008 mmol), tris(ortho-tolyl)phosphine (P(o-tolyl)$_3$) (0.05 mmol), potassium phosphate (K$_3$PO$_4$) (1.03 mmol), and toluene (1.2 mL) were mixed, obtaining a first solution. Next, toluene (1.2 mL), water (1.2 mL), 1,4-dioxane (1.2 mL) and trioctylmethylammonium chloride (Aliquat 336) were added into the first solution, obtaining a second solution. Next, the second solution was stirred at 100° C. for 18 hours, and then bromobenzene was added into the second solution. The result was stirred at 100° C. for 4 hours. After cooling to room temperature, the result was extracted from toluene and water, and then the organic phase was collected. Next, the organic phase was added into methanol to perform a reprecipitation. The precipitate was washed with methanol, acetone and n-hexane. Finally, the result was purified with column chromatography (with toluene as the extraction solvent), obtaining Polymer (VI).

The synthesis pathway of the above reaction was as follows:

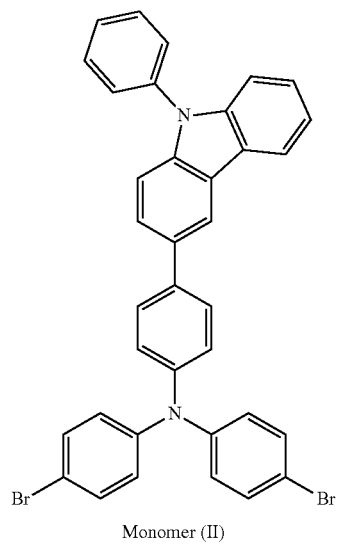

Monomer (II)

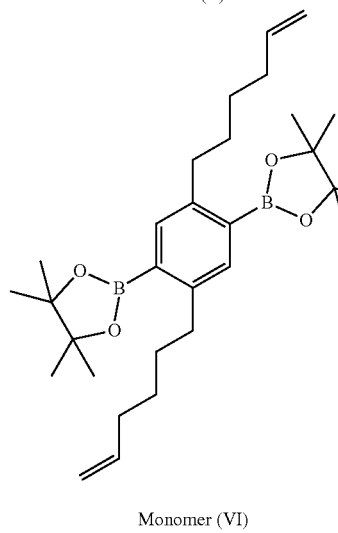

Monomer (VI)

Preparation of Polymer (VII)

Monomer (I) (0.26 mmol), Monomer (III) (0.1 mmol), Monomer (VI) (0.17 mmol), tris(dibenzylideneacetone) dipalladium (Pd$_2$(dba)$_3$) (0.008 mmol), tris(ortho-tolyl) phosphine (P(o-tolyl)$_3$) (0.05 mmol), potassium phosphate (K$_3$PO$_4$) (1.03 mmol), and toluene (1.2 mL) were mixed, obtaining a first solution. Next, toluene (1.2 mL), water (1.2 mL), 1,4-dioxane (1.2 mL) and trioctylmethylammonium chloride (Aliquat 336) were added into the first solution, obtaining a second solution. Next, the second solution was stirred at 100° C. for 18 hours, and then bromobenzene was added into the second solution. The result was stirred at 100° C. for 4 hours. After cooling to room temperature, the result was extracted from toluene and water, and then the organic phase was collected. Next, the organic phase was added into methanol to perform a reprecipitation. The precipitate was washed with methanol, acetone and n-hexane. Finally, the result was purified with column chromatography (with toluene as the extraction solvent), obtaining Polymer (VII).

The synthesis pathway of the above reaction was as follows:

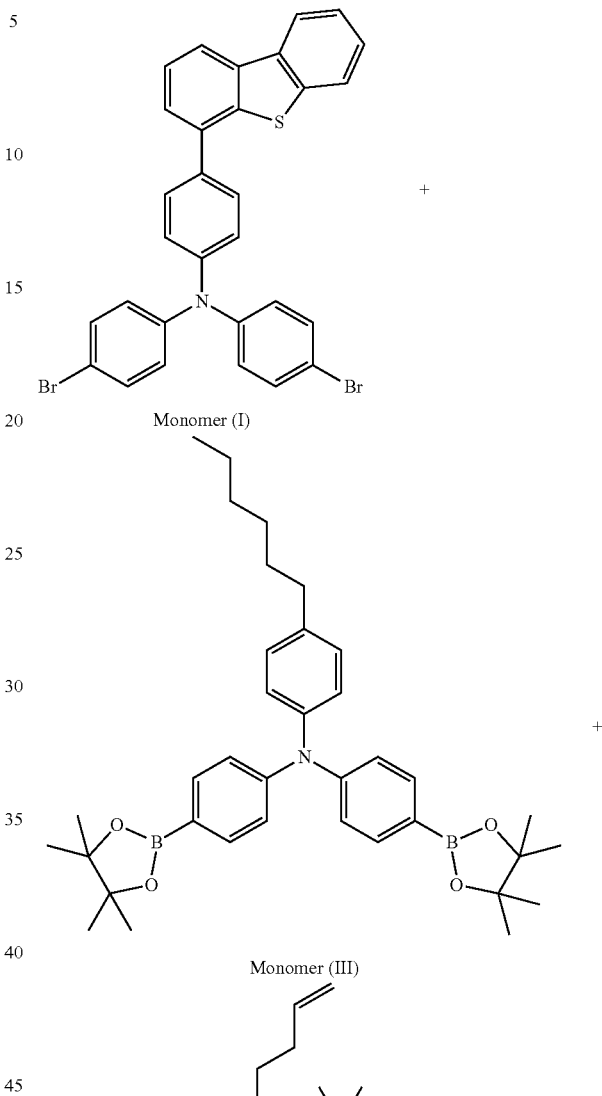

Monomer (III)

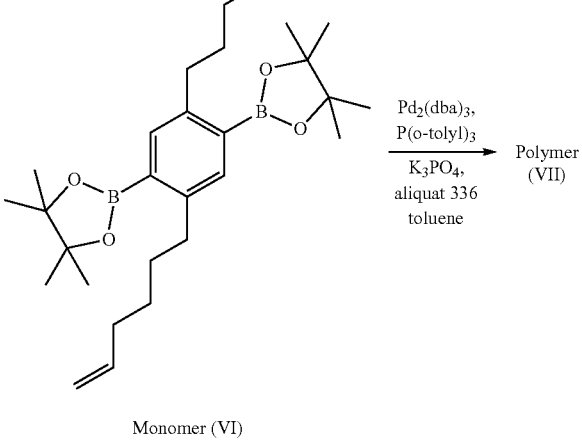

Monomer (VI)

Preparation of Polymer (VIII)

Monomer (II) (0.26 mmol), Monomer (III) (0.1 mmol), Monomer (VIII) (0.17 mmol), tris(dibenzylideneacetone)

dipalladium (Pd$_2$(dba)$_3$) (0.008 mmol), tris(ortho-tolyl) phosphine (P(o-tolyl)$_3$) (0.05 mmol), potassium phosphate (K$_3$PO$_4$) (1.03 mmol), and toluene (1.2 mL) were mixed, obtaining a first solution. Next, toluene (1.2 mL), water (1.2 mL), 1,4-dioxane (1.2 mL) and trioctylmethylammonium chloride (Aliquat 336) were added into the first solution, obtaining a second solution. Next, the second solution was stirred at 100° C. for 18 hours, and then bromobenzene was added into the second solution. The result was stirred at 100° C. for 4 hours. After cooling to room temperature, the result was extracted from toluene and water, and then the organic phase was collected. Next, the organic phase was added into methanol to perform a reprecipitation. The precipitate was washed with methanol, acetone and n-hexane. Finally, the result was purified with column chromatography (with toluene as the extraction solvent), obtaining Polymer (VIII).

The synthesis pathway of the above reaction was as follows:

Monomer (II)

+

Monomer (III)

+

Monomer (VIII)

$\xrightarrow{\text{Pd}_2(\text{dba})_3, \text{P(o-tolyl)}_3, \text{K}_3\text{PO}_4, \text{aliquat 336, toluene}}$ Polymer (VIII)

Preparation of Polymer (XII)

Monomer (I) (0.26 mmol), Monomer (V) (0.1 mmol), Monomer (VI) (0.17 mmol), tris(dibenzylideneacetone) dipalladium (Pd$_2$(dba)$_3$) (0.008 mmol), tris(ortho-tolyl) phosphine (P(o-tolyl)$_3$) (0.05 mmol), potassium phosphate (K$_3$PO$_4$) (1.03 mmol), and toluene (1.2 mL) were mixed, obtaining a first solution. Next, toluene (1.2 mL), water (1.2 mL), 1,4-dioxane (1.2 mL)) and trioctylmethylammonium chloride (Aliquat 336) were added into the first solution, obtaining a second solution. Next, the second solution was stirred at 100° C. for 18 hours, and then bromobenzene was added into the second solution. The result was stirred at 100° C. for 4 hours. After cooling to room temperature, the result was extracted from toluene and water, and then the organic phase was collected. Next, the organic phase was added into methanol to perform a reprecipitation. The precipitate was washed with methanol, acetone and n-hexane. Finally, the result was purified with column chromatography (with toluene as the extraction solvent), obtaining polymer (XII). The synthesis pathway of the above reaction was as follows:

+

Monomer (I)

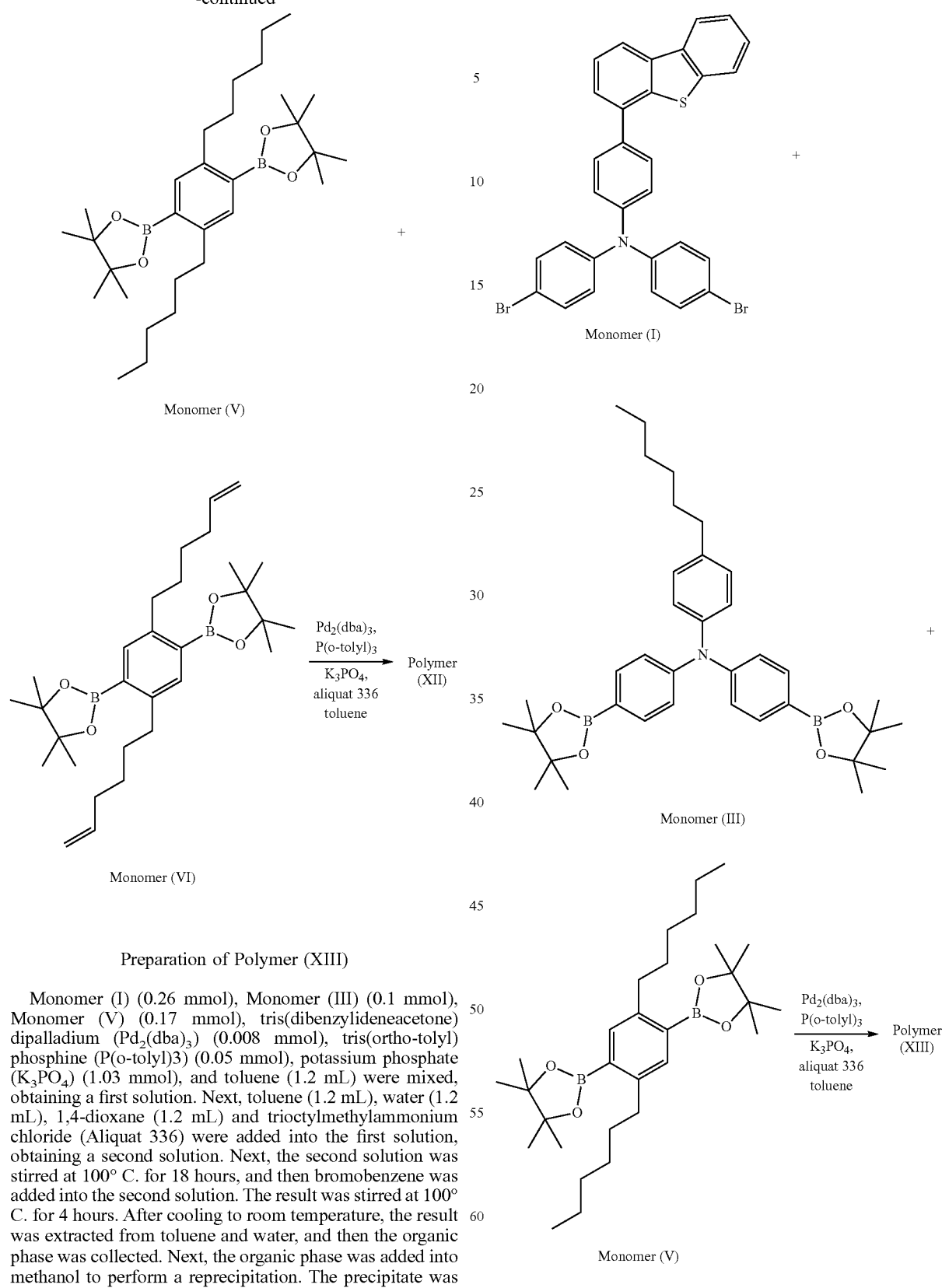

Preparation of Polymer (XIII)

Monomer (I) (0.26 mmol), Monomer (III) (0.1 mmol), Monomer (V) (0.17 mmol), tris(dibenzylideneacetone) dipalladium (Pd$_2$(dba)$_3$) (0.008 mmol), tris(ortho-tolyl) phosphine (P(o-tolyl)3) (0.05 mmol), potassium phosphate (K$_3$PO$_4$) (1.03 mmol), and toluene (1.2 mL) were mixed, obtaining a first solution. Next, toluene (1.2 mL), water (1.2 mL), 1,4-dioxane (1.2 mL) and trioctylmethylammonium chloride (Aliquat 336) were added into the first solution, obtaining a second solution. Next, the second solution was stirred at 100° C. for 18 hours, and then bromobenzene was added into the second solution. The result was stirred at 100° C. for 4 hours. After cooling to room temperature, the result was extracted from toluene and water, and then the organic phase was collected. Next, the organic phase was added into methanol to perform a reprecipitation. The precipitate was washed with methanol, acetone and n-hexane. Finally, the result was purified with column chromatography (with toluene as the extraction solvent), obtaining polymer (XIII). The synthesis pathway of the above reaction was as follows:

Next, The measurement results of nuclear magnetic resonance spectrometry of the polymers disclosed in Examples 1-15 are shown in Table 3.

TABLE 3

| | nuclear magnetic resonance spectrum data |
|---|---|
| Polymer (I) | $^1$H NMR (CDCl$_3$, 500 MHz) δ 7.77-7.72 (m, 5H), 7.55 (d, 3H), 7.46 (d, 1H), 7.40 (d, 1H), 7.3 (d, 6H), 7.23 (d, 2H), 7.18-7.00 (m, 6H), 6.35 (m, 6H), 1.83 (d, 4H), 1.47 (d, 2H), 1.25-1.29 (m, 10H), 0.96 (s, 12H). |
| Polymer (II) | $^1$H NMR (CDCl$_3$, 500 MHz) δ 7.77-7.73 (m, 5H), 7.55 (d, 3H), 7.46 (d, 1H), 7.40 (d, 1H), 7.3 (d, 6H), 7.23 (d, 2H), 7.18-7.00 (m, 10H), 6.87 (d, 2H), 6.35 (m, 6H), 2.55 (d, 2H), 1.83 (d, 4H), 1.62 (d, 2H), 1.47 (d, 2H), 1.33-1.25 (m, 16H), 0.96 (s, 15H). |
| Polymer (III) | $^1$H NMR (CD$_2$Cl$_2$, 500 MHz) δ 7.86-7.73 (m, 7H), 7.55-7.53 (m, 3H), 7.39-7.31 (m, 3H), 7.23 (d, 2H), 7.18 (d, 8H), 6.87 (d, 2H), 6.35 (d, 12H), 2.55 (d, 2H), 1.83 (d, 4H), 1.62 (d, 2H), 1.47 (d, 2H), 1.33-1.25 (m, 16H), 0.96 (s, 15H). |
| Polymer (IV) | $^1$H NMR (CDCl$_3$, 500 MHz) δ 7.86-7.74 (m, 4H), 7.59-7.53 (m, 3H), 7.39-7.29 (m, 5H), 7.23-7.18 (m, 6H), 6.75 (d, 1H), 6.58 (d, 1H), 6.35 (d, 6H), 1.87 (d, 4H), 1.33-1.29 (m, 16H), 0.96 (s, 6H). |
| Polymer (V) | $^1$H NMR (CDCl$_3$, 500 MHz) δ 7.77 (d, 1H), 7.55 (d, 1H), 7.46 (d, 1H), 7.40 (d, 1H), 7.3 (d, 6H), 7.23 (d, 2H), 7.18-7.00 (m, 8H), 6.35 (m, 6H), 2.55 (d, 4H), 1.62 (d, 4H), 1.33-1.29 (m, 12H), 0.96 (s, 6H). |
| Polymer (VI) | $^1$H NMR (CDCl$_3$, 500 MHz) δ 7.86-7.74 (m, 3H), 7.53 (d, 1H), 7.39-7.31 (m, 3H), 7.23 (d, 2H), 7.18-7.13 (m, 6H), 6.35 (d, 6H), 2.55 (d, 4H), 1.62 (d, 4H), 1.33-1.29 (m, 12H), 0.96 (s, 6H). |
| Polymer (VII) | $^1$H NMR (CDCl$_3$, 500 MHz) δ 7.86-7.74 (m, 3H), 7.53 (d, 1H), 7.39-7.31 (m, 3H), 7.23-7.13 (m, 12H), 6.87 (d, 2H), 6.35 (d, 12H), 5.7 (d, 2H), 5.03-4.97 (m, 4H), 2.55 (d, 6H), 1.96 (d, 4H), 1.62 (d, 6H), 1.33-1.29 (m, 10H), 0.96 (s, 9H). |
| Polymer (VIII) | $^1$H NMR (CDCl$_3$, 500 MHz) δ 7.77-7.72 (m, 5H), 7.55 (d, 3H), 7.46 (d, 1H), 7.40 (d, 1H), 7.3 (d, 6H), 7.23 (d, 2H), 7.18-7.00 (m, 10H), 6.87 (d, 2H), 6.35 (m, 12H), 5.7 (d, 2H), 5.03-4.97 (m, 4H), 2.55 (d, 2H), 1.96 (d, 4H), 1.87 (d, 4H), 1.62 (d, 2H), 1.33-1.29 (m, 14H), 0.96 (s, 3H). |
| Polymer (IX) | $^1$H NMR (CDCl$_3$, 500 MHz) δ 7.86-7.74 (m, 5H), 7.75-7.72 (m, 8H), 7.58-7.53 (m, 5H), 7.39-7.31 (m, 3H), 7.23 (d, 2H), 7.18 (d, 4H), 6.35 (d, 6H), 5.7 (d, 2H), 5.03-4.97 (m, 4H), 1.96 (d, 4H), 1.87 (d, 12H), 1.33-1.29 (d, 56H), 0.96 (s, 12H). |
| Polymer (X) | $^1$H NMR (CDCl$_3$, 500 MHz) δ 7.84 (d, 2H), 7.77-7.73 (m, 5H), 7.58-7.55 (m, 3H), 7.46 (d, 1H), 7.40 (d, 1H), 7.3 (d, 6H), 7.23 (d, 2H), 7.18-7.00 (m, 6H), 6.35 (m, 6H), 1.87 (d, 8H), 1.33-1.29 (d, 48H), 0.96 (s, 12H). |
| Polymer (XI) | $^1$H NMR (CDCl$_3$, 500 MHz) δ 7.84 (d, 2H), 7.77-7.73 (m, 5H), 7.58-7.55 (m, 3H), 7.46 (d, 1H), 7.40 (d, 1H), 7.3 (d, 6H), 7.23 (d, 2H), 7.18-7.00 (m, 8H), 6.35 (m, 6H), 5.7 (d, 2H), 5.03-4.97 (m, 4H), 1.96 (d, 4H), 1.87 (d, 8H), 1.62 (d, 4H), 1.33-1.29 (d, 52H), 0.96 (s, 18H). |
| Polymer (XII) | $^1$H NMR (CDCl$_3$, 500 MHz) δ 7.86-7.74 (m, 3H), 7.53 (d, 1H), 7.39-7.31 (m, 3H), 7.23 (d, 2H), 7.18-7.13 (m, 8H), 6.35 (d, 6H), 5.7 (d, 2H), 5.03-4.97 (m, 4H), 2.55 (d, 8H), 1.96 (d, 4H), 1.62 (d, 8H), 1.33-1.29 (m, 16H), 0.96 (s, 12H). |
| Polymer (XIII) | $^1$H NMR (CDCl$_3$, 500 MHz) δ 7.86-7.74 (m, 3H), 7.53 (d, 1H), 7.39-7.31 (m, 3H), 7.23 (d, 2H), 7.18-7.13 (, 10H), 6.87 (d, 2H), 6.35 (d, 12H), 2.55 (d, 6H), 1.62 (d, 6H), 1.33-1.29 (m, 18H), 0.96 (s, 9H). |
| Polymer (XIV) | $^1$H NMR (CDCl$_3$, 500 MHz) δ 7.86-7.74 (m, 3H), 7.53 (d, 1H), 7.43 (d, 2H), 7.39-7.31 (m, 3H), 7.23 (d, 4H), 7.18-7.13 (m, 10H), 6.35 (d, 12H), 2.55 (d, 6H), 1.66-1.62 (m, 6H), 1.33-1.29 (m, 12H), 0.96 (s, 9H). |
| Polymer (XV) | $^1$H NMR (CDCl$_3$, 500 MHz) δ 7.77-7.73 (m, 5H), 7.55 (d, 3H), 7.46 (d, 1H), 7.40 (d, 1H), 7.3 (d, 6H), 7.23 (d, 2H), 7.18-7.00 (m, 12H), 6.63 (d, 1H), 6.35 (m, 12H), 5.61 (d, 1H), 5.18 (d, 1H), 1.83 (d, 4H), 1.47 (d, 2H), 1.29-1.25 (d, 10H), 0.96 (s, 12H). |

Solubility Test

The polymers disclosed in Examples 1-15 and the polymer having the repeating unit of

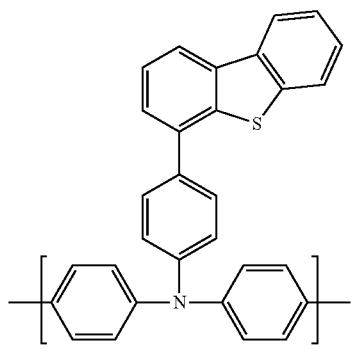

(serving as control group) were individually dissolved in phenylcyclohexane to prepare polymer-containing solutions with various concentration (i.e. 0.5%, 0.8%, 1%, 1.5%, 2%, and 3%), and the soluble degree of the polymers were observed. The results are shown in Table 4:

TABLE 4

|  | 3% | 2% | 1.5% | 1% | 0.8% | 0.5% |
|---|---|---|---|---|---|---|
| Polymer (I) | ◯ | ◯ | ◯ | ◯ | ◯ | ◯ |
| Polymer (II) | ◯ | ◯ | ◯ | ◯ | ◯ | ◯ |
| Polymer (III) | ◯ | ◯ | ◯ | ◯ | ◯ | ◯ |
| Polymer (IV) | ◯ | ◯ | ◯ | ◯ | ◯ | ◯ |
| Polymer (V) | ◯ | ◯ | ◯ | ◯ | ◯ | ◯ |
| Polymer (VI) | ◯ | ◯ | ◯ | ◯ | ◯ | ◯ |
| Polymer (VII) | ◯ | ◯ | ◯ | ◯ | ◯ | ◯ |
| Polymer (VIII) | ◯ | ◯ | ◯ | ◯ | ◯ | ◯ |
| Polymer (IX) | ◯ | ◯ | ◯ | ◯ | ◯ | ◯ |
| Polymer (X) | ◯ | ◯ | ◯ | ◯ | ◯ | ◯ |
| Polymer (XI) | ◯ | ◯ | ◯ | ◯ | ◯ | ◯ |
| Polymer (XII) | ◯ | ◯ | ◯ | ◯ | ◯ | ◯ |
| Polymer (XIII) | ◯ | ◯ | ◯ | ◯ | ◯ | ◯ |
| Polymer (XIV) | ◯ | ◯ | ◯ | ◯ | ◯ | ◯ |
| Polymer (XV) | ◯ | ◯ | ◯ | ◯ | ◯ | ◯ |
| Control group | X | X | X | X | X | ◯ |

(X: undissolvable or partially dissolvable; ◯: completely dissolvable)

As shown in Table 4, since the repeating unit has long-chain alkyl group or alkenyl group, the polymer exhibited improved solubility (of equal to or greater than 3% in phenylcyclohexane) in comparison with control group (without long-chain alkyl group or alkenyl group, having a solubility of 0.5% in phenyl cyclohexane).

Light-Emitting Device

FIG. 1 shows an embodiment of a light-emitting device 10. The light-emitting device 10 includes a substrate 12, a bottom electrode 14, a light-emitting element 16, and a top electrode 18.

According to another embodiment of the disclosure, the light-emitting device can be an organic light-emitting diode (OLED) display device, or Quantum Dot Light Emitting diode (QLED) display device (QLED).

The light-emitting device can be a top-emission, bottom-emission, or dual-emission device. The substrate 12 can be a glass, plastic, or semiconductor substrate. Suitable materials for the bottom and top electrodes can be Li, Mg, Ca, Al, Ag, In, Au, W, Ni, Pt, Cu, indium tin oxide (ITO), indium zinc oxide (IZO), aluminum zinc oxide (AZO), zinc oxide (ZnO), or combination thereof, formed by thermal evaporation, sputtering or Plasma enhanced chemical vapor deposition. Furthermore, at least one of the bottom and top electrodes 14 and 18 is transparent.

According to embodiments of the disclosure, the light-emitting element 16 at least includes a light emitting layer and a charge transport layer, wherein the charge transport layer can be a hole injection layer, a hole transport layer, an electron transport layer, an electron injection layer, or a combination thereof. It should be noted that, according to embodiments of the disclosure, the light-emitting element 16 must include the polymer of the disclosure. Namely, in the light-emitting element 16, at least one layer includes the polymer of the disclosure.

According to some embodiments of the disclosure, the light-emitting element 16 at least includes a light emitting layer, a hole injection layer, a hole transport layer, an electron transport layer, and an electron injection layer. Herein, the hole injection layer includes the polymer of the disclosure.

According to some embodiments of the disclosure, the light-emitting element 16 at least includes a light emitting layer, a hole injection layer, a hole transport layer, an electron transport layer, and an electron injection layer. Herein, the hole transport layer includes the polymer of the disclosure.

In order to clearly disclose the organic light-emitting devices of the disclosure, the following examples (having an emitting layer employing the polymers of the disclosure) are intended to illustrate the disclosure more fully without limiting their scope, since numerous modifications and variations will be apparent to those skilled in this art.

Example 16

A glass substrate with an indium tin oxide (ITO) film with a thickness of 150 nm was provided and then washed with a neutral cleaning agent, acetone, and isopropanol with ultrasonic agitation. After drying with nitrogen flow, the ITO film was subjected to a UV/ozone treatment for 30 min. Next, SHI2520S1 (commercially available from Nissan Chemical Industries, Ltd) serving as hole injection material was coated on the ITO film by a spin coating process (with a rotation rate of 500 rpm for 5 sec and a rotation rate of 2000 rpm for 30 sec and) and baked at 130° C. for 10 min to form a hole injection layer (with a thickness of 40 nm). Next, Polymer (I) serving as hole transport material was coated on the hole injection layer by a spin coating process (with a rotational speed of 500 rpm for 5 sec and a rotational speed of 2000 rpm for 30 sec and) and baked at 130° C. for 10 min to form a hole transport layer (with a thickness of 40 nm). Next, a luminescent host material (commercially available from E-Ray Optoelectronics Technology Co., Ltd with a trade number of EPH-I-06) and luminescent co-host materials (commercially available from E-Ray Optoelectronics Technology Co., Ltd with trade numbers of PER-I-02 and HT-630) (the weight ratio of EPH-I-06, PER-I-02 and HT-630 was 56%:4%:40%) (with a thickness of 60 nm), an electron transport material (commercially available from E-Ray Optoelectronics Technology Co., Ltd with a trade number of EET-785) and 8-hydroxy-quinolinato lithium (LiQ) (the weight ratio of ETM-785 to LiQ was 1:1) (with a thickness of 30 nm) and Al (with a thickness of 120 nm) were subsequently formed on the PEDO:PSS film at $10^{-6}$ torr, obtaining Light-emitting device (I) after encapsulation. The materials and layers of Light-emitting device (I) are described in the following: ITO/SHI2520S1/polymer (I)/EPH-I-06: PER-I-02: HT-630/EET-785: LiQ/Al.

Light-Emitting Device

The FIGURE shows an embodiment of a light-emitting device 10. The light-emitting device 10 includes a substrate 12, a bottom electrode 14, a light-emitting element 16, and a top electrode 18.

Example 17

Example 17 was performed in the same manner as in Example 16 except that Polymer (II) was substituted for Polymer (I), obtaining Light-emitting device (II). The materials and layers of Organic light-emitting device (II) are described in the following: ITO/SHI2520S1/polymer (II)/EPH-I-06: PER-I-02: HT-630/EET-785: LiQ/Al.

Next, the voltage, brightness, luminescent efficiency, external quantum efficiency, luminous wavelength, and C.I.E coordinate of Light-emitting device (II) were measured by a spectra colorimeter and a luminance meter. The results are shown in Table 5.

Example 18

Example 18 was performed in the same manner as in Example 16 except that Polymer (III) was substituted for Polymer (I), obtaining Light-emitting device (III). The materials and layers of Organic light-emitting device (III) are described in the following: ITO/SHI2520S1/polymer (III)/EPH-I-06: PER-I-02: HT-630/EET-785: LiQ/Al.

Next, the voltage, brightness, luminescent efficiency, external quantum efficiency, luminous wavelength, and C.I.E coordinate of Light-emitting device (III) were measured by a spectra colorimeter and a luminance meter. The results are shown in Table 5.

Comparative Example 1

Comparative Example 1 was performed in the same manner as in Example 16 except that EHT-I-02 (with a structure of

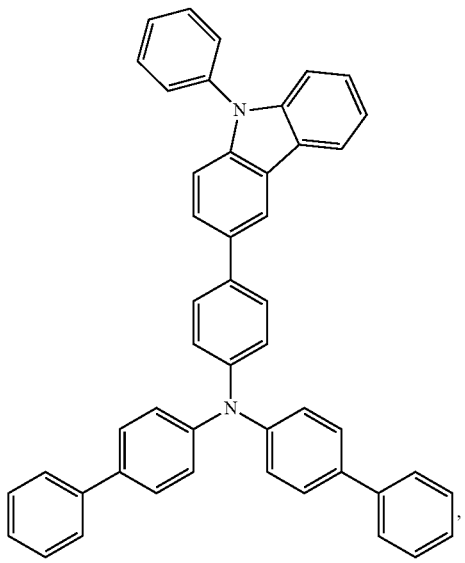 [SMILES: c1ccc(-c2ccc(N(c3ccc(-c4ccccc4)cc3)c3ccc(-c4ccc5c(c4)c4ccccc4n5-c4ccccc4)cc3)cc2)cc1]

and formed by evaporation) was substituted for Polymer (I), obtaining Light-emitting device (IV). The materials and layers of Organic light-emitting device (III) are described in the following: ITO/SHI2520S1/EHT-I-02/EPH-I-06: PER-I-02: HT-630/EET-785: LiQ/Al.

Next, the voltage, brightness, luminescent efficiency, external quantum efficiency, luminous wavelength, and C.I.E coordinate of Light-emitting device (IV) were measured by a spectra colorimeter and a luminance meter. The results are shown in Table 5.

TABLE 5

| | voltage (V) (measured at a brightness of 1000 Cd/m$^2$) | luminescent efficiency (cd/A) | external quantum efficiency (%) | luminous wavelength (nm) | C.I.E coordinate | Formation of hole transport layer |
|---|---|---|---|---|---|---|
| Example 16 | 3.7 | 26.6 | 21.84 | 618.5 | (0.661, 0.338) | spin coating |
| Example 17 | 3.7 | 27.8 | 20.72 | 616.2 | (0.652, 0.346) | spin coating |
| Example 18 | 3.8 | 24.8 | 20.64 | 619.0 | (0.662, 0.337) | spin coating |
| Comparative Example 1 | 3.9 | 24.8 | 20.62 | 618.8 | (0.662, 0.338) | evaporation |

As shown in Table 5, in comparison with the light-emitting device of Comparative Example 1, although the hole transport layer of the light-emitting devices of Examples 16-18 employed the polymer of the disclosure and was formed by a wet process (i.e. spin coating), the driving voltage, brightness, luminescent efficiency and external quantum efficiency of the obtained light-emitting device is close to or better than those of the conventional light-emitting device formed by evaporation. It means that the polymer of the disclosure can substitute for conventional small-molecule materials to serve as hole transport materials.

Example 19

A glass substrate with an indium tin oxide (ITO) film with a thickness of 150 nm was provided and then washed with a neutral cleaning agent, acetone, and isopropanol with ultrasonic agitation. After drying with nitrogen flow, the ITO film was subjected to a UV/ozone treatment for 30 min. Next, Polymer (IV) serving as hole injection material was coated on the ITO film by a spin coating process (with a rotational speed of 500 rpm for 5 sec and a rotational speed of 2000 rpm for 30 sec and) and baked at 130° C. for 10 min to form a hole injection layer (with a thickness of 40 nm). Next, a hole transport material (commercially available from E-Ray Optoelectronics Technology Co., Ltd with a trade number of EHT-I-02) (with a thickness of 40 nm), a luminescent host material (commercially available from E-Ray Optoelectronics Technology Co., Ltd with a trade number of EPH-I-06) and luminescent co-host materials (commercially available from E-Ray Optoelectronics Technology Co., Ltd with trade numbers of PER-I-02 and HT-630) (the weight ratio of EPH-I-06, PER-I-02 and HT-630 was 56%:4%:40%) (with a thickness of 60 nm), an electron transport material (commercially available from E-Ray Optoelectronics Technology Co., Ltd with a trade number of EET-785) and 8-hydroxy-quinolinato lithium (LiQ) (the weight ratio of ETM-785 to LiQ was 1:1) (with a thickness of 30 nm) and Al (with a thickness of 120 nm) were subsequently formed on the PEDO:PSS film at $10^{-6}$ torr, obtaining Light-emitting device (V) after encapsulation. The materials and layers of Light-emitting device (V) are described in the following: ITO/Polymer (IV)/EHT-I-02/EPH-I-06:PER-I-02: HT-630/ EET-785: LiQ/Al.

Next, the voltage, brightness, luminescent efficiency, external quantum efficiency, luminous wavelength, and C.I.E coordinate of Light-emitting device (V) were measured by a spectra colorimeter and a luminance meter. The results are shown in Table 6.

Comparative Example 2

Comparative Example 2 was performed in the same manner as in Example 19 except that SHI2520S1 was substituted for Polymer (IV), obtaining Light-emitting device (VI). The materials and layers of Light-emitting device (VI) are described in the following: ITO/SHI2520S1/ EHT-I-02/EPH-I-06: PER-I-02: HT-630/EET-785: LiQ/Al.

Next, the voltage, brightness, luminescent efficiency, external quantum efficiency, luminous wavelength, and C.I.E coordinate of Light-emitting device (VI) were measured by a spectra colorimeter and a luminance meter. The results are shown in Table 6.

TABLE 6

|  | voltage (V) (measured at a brightness of 1000 Cd/m²) | luminescent efficiency (cd/A) | external quantum efficiency (%) | luminous wavelength (nm) | C.I.E coordinate |
|---|---|---|---|---|---|
| Example 19 | 4.47 | 30.45 | 25.46 | 618.2 | (0.662, 0.337) |
| Comparative Example 2 | 3.46 | 24.04 | 19.92 | 618.6 | (0.663, 0.336) |

As shown in Table 6, the brightness, luminescent efficiency and external quantum efficiency of the light-emitting device as disclosed in Example 19 (with a hole injection layer made of the polymer of the disclosure) are better than those of the light-emitting device of Comparative Example 2. It means that the polymer of the disclosure can serve as hole transport material.

Example 20

A glass substrate with an indium tin oxide (ITO) film with a thickness of 150 nm was provided and then washed with a neutral cleaning agent, acetone, and isopropanol with ultrasonic agitation. After drying with nitrogen flow, the ITO film was subjected to a UV/ozone treatment for 30 min. Next, SHI2520S1 (commercially available from Nissan Chemical Industries, Ltd) serving as hole injection material was coated on the ITO film by a spin coating process (with a rotational speed of 500 rpm for 5 sec and a rotational speed of 2000 rpm for 30 sec and) and baked at 130° C. for 10 min to form a hole injection layer (with a thickness of 40 nm). Next, Polymer (II) serving as hole transport material was coated on the hole injection layer by a spin coating process (with a rotational speed of 500 rpm for 5 sec and a rotational speed of 2000 rpm for 30 sec and) and baked at 130° C. for 10 min to form a hole transport layer (with a thickness of 40 nm). Next, a luminescent host material (commercially available from E-Ray Optoelectronics Technology Co., Ltd with a trade number of EPH-I-06) and luminescent co-host materials (commercially available from E-Ray Optoelectronics Technology Co., Ltd with trade numbers of PER-I-02 and HT-630) (the weight ratio of EPH-I-06, PER-I-02 and HT-630 was 56%:4%:40%) (with a thickness of 60 nm), an electron transport material (commercially available from E-Ray Optoelectronics Technology Co., Ltd with a trade number of EET-785) and 8-hydroxy-quinolinato lithium (LiQ) (the weight ratio of ETM-785 to LiQ was 1:1) (with a thickness of 30 nm) and Al (with a thickness of 120 nm) were subsequently formed on the PEDO:PSS film at $10^{-6}$ torr, obtaining Light-emitting device (VII) after encapsulation. The materials and layers of Light-emitting device (VII) are described in the following: ITO/SHI2520S1/Polymer (II)/EPH-02: IGD5404/EET-785: LiQ/Al.

Next, the voltage, brightness, luminescent efficiency, external quantum efficiency, luminous wavelength, and C.I.E coordinate of Light-emitting device (VII) were measured by a spectra colorimeter and a luminance meter. The results are shown in Table 7.

Comparative Example 3

Comparative Example 3 was performed in the same manner as in Example 20 except that X-HT630 (with a structure of

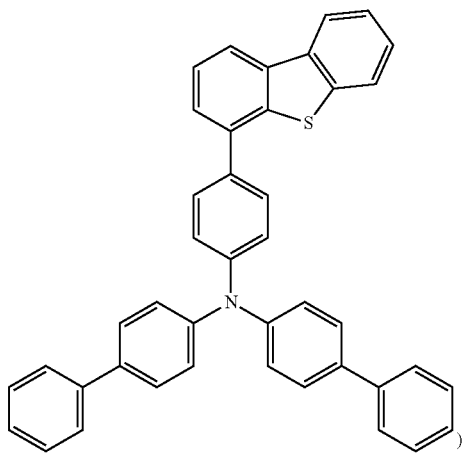 [SMILES: c1ccc(-c2ccc(N(c3ccc(-c4ccccc4)cc3)c3ccc(-c4cccc5c4sc4ccccc45)cc3)cc2)cc1]

)

(commercially available from E-Ray Optoelectronics Technology Co., Ltd) (formed by evaporation) was substituted for Polymer (II), obtaining Light-emitting device (VIII). The materials and layers of Light-emitting device (VIII) are described in the following: ITO/SHI2520S1/X-HT630/EPH-02: IGD5404/EET-785: LiQ/Al Next, the voltage, brightness, luminescent efficiency, external quantum efficiency, luminous wavelength, and C.I.E coordinate of Light-emitting device (VIII) were measured by a spectra colorimeter and a luminance meter. The results are shown in Table 7.

TABLE 7

|  | voltage (V) (measured at a brightness of 1000 Cd/m²) | luminescent efficiency (cd/A) | external quantum efficiency (%) | luminous wavelength (nm) | C.I.E coordinate | voltage (V) (measured a at brightness of 1000 Cd/m²) |
|---|---|---|---|---|---|---|
| Example 20 | 3.1 | 64.47 | 17.84 | 539.9 | (0.418, 0.570) | spin coating |
| Comparative Example 3 | 3.2 | 60.03 | 16.71 | 539.1 | (0.415, 0.571) | spin coating |

As shown in Table 7, in comparison with the light-emitting device as disclosed in Comparative Example 3, although the hole transport layer of the light-emitting device of Example 20 employed the polymer of the disclosure and was formed by a wet process (i.e. spin coating), the driving voltage, brightness, luminescent efficiency and external quantum efficiency of the obtained light-emitting device is close to or better than those of the conventional light-emitting device formed by evaporation. It means that the polymer of the disclosure can substitute for conventional small-molecule materials to serve as hole transport material.

It will be clear that various modifications and variations can be made to the disclosed methods and materials. It is intended that the specification and examples be considered as exemplary only, with the true scope of the disclosure being indicated by the following claims and their equivalents.

What is claimed is:

1. A polymer, which has a first repeating unit, wherein the first repeating unit has a structure represented by Formula (I):

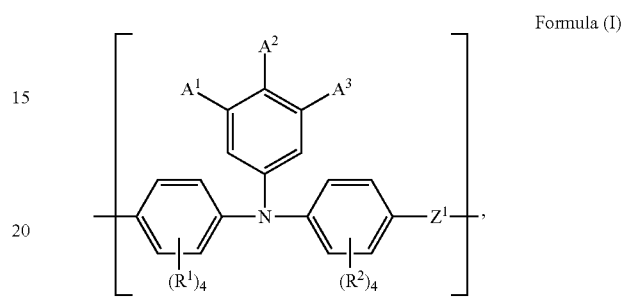

Formula (I)

wherein $A^1$, $A^2$ and $A^3$ are independently hydrogen,

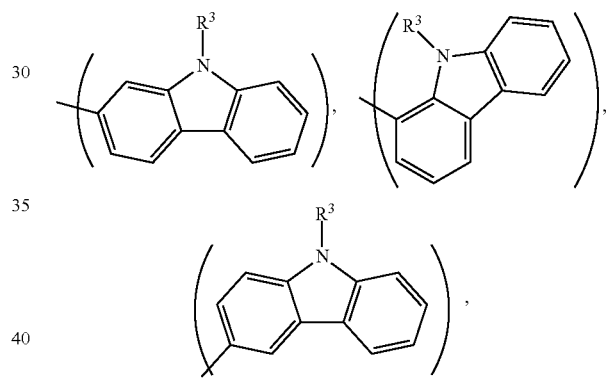

-continued

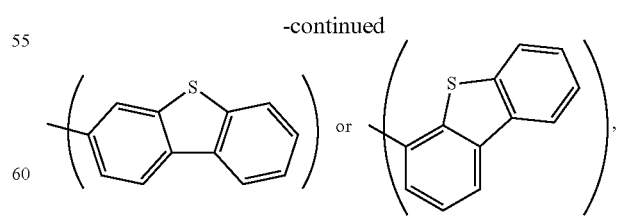

and at least one of $A^1$, $A^2$ and $A^3$ is not hydrogen; $R^1$ and $R^2$ are independently hydrogen, halogen, or $C_{1-2}$ alkyl group; $R^3$ is hydrogen, phenyl group, biphenyl group, naphthyl group; $Z^1$ is

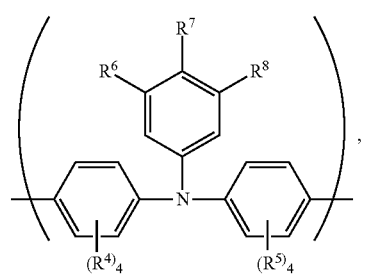

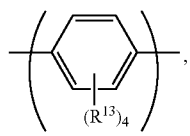

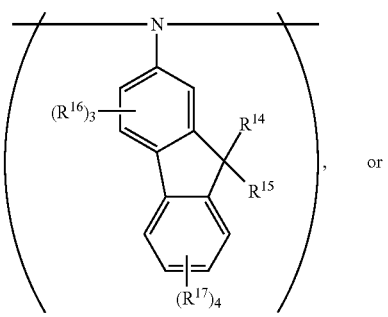

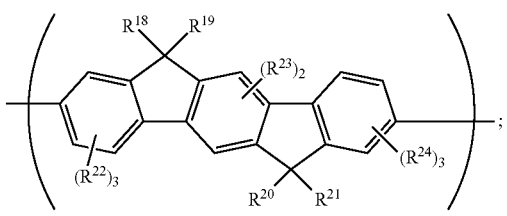

$R^4$, $R^5$, $R^{16}$, $R^{17}$, $R^{22}$, $R^{23}$ and $R^{24}$ are independently hydrogen, halogen, or $C_{1-2}$ alkyl group; $R^6$, $R^7$ and $R^8$ are independently hydrogen,

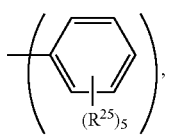

$C_{3-10}$ alkyl group, or $C_{2-10}$ alkenyl group, and at least one of $R^6$, $R^7$ and $R^8$ is not hydrogen; $R^{13}$ is independently hydrogen, $C_{3-10}$ alkyl group, or $C_{2-10}$ alkenyl group, and at least one of $R^{13}$ is not hydrogen; $R^{14}$ and $R^{15}$ are independently hydrogen, $C_{3-10}$ alkyl group, or $C_{2-10}$ alkenyl group, and at least one of $R^{14}$ and $R^{15}$ is not hydrogen; $R^{18}$, $R^{19}$, $R^{20}$ and $R^{21}$ are independently hydrogen, $C_{3-10}$ alkyl group, or $C_{2-10}$ alkenyl group, and at least one of $R^{18}$, $R^{19}$, $R^{20}$ and $R^{21}$ is not hydrogen; and $R^{25}$ is independently hydrogen, $C_{3-10}$ alkyl group, or $C_{2-10}$ alkenyl group, and at least one of $R^{25}$ is not hydrogen.

2. The polymer as claimed in claim 1, wherein the first repeating unit is

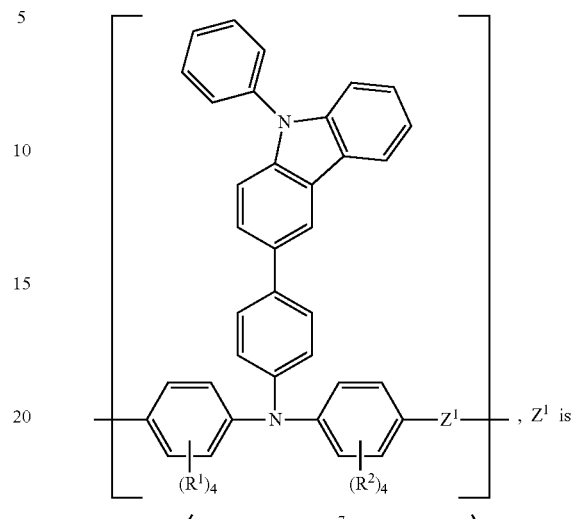, $Z^1$ is

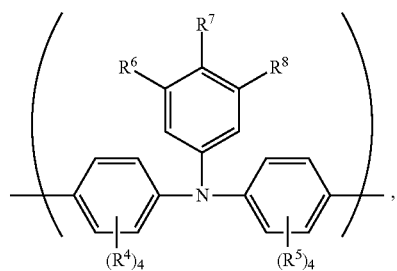

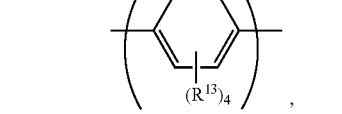

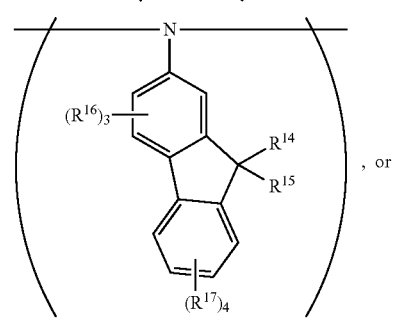, or

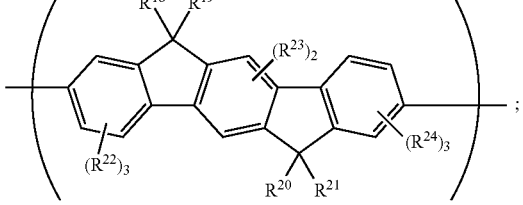

$R^1$ and $R^2$ are independently hydrogen, halogen, or $C_{1-2}$ alkyl group; $R^4$, $R^5$, $R^{16}$, $R^{17}$, $R^{22}$, $R^{23}$ and $R^{24}$ are independently hydrogen, halogen, or $C_{1-2}$ alkyl group; $R^6$, $R^7$ and $R^8$ are independently hydrogen,

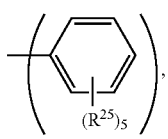

$C_{3-10}$ alkyl group, or $C_{2-10}$ alkenyl group, and at least one of $R^6$, $R^7$ and $R^8$ is not hydrogen; $R^{13}$ is independently hydrogen, $C_{3-10}$ alkyl group, or $C_{2-10}$ alkenyl group, and at least one of $R^{13}$ is not hydrogen; $R^{14}$ and $R^{15}$ are independently hydrogen, $C_{3-10}$ alkyl group, or $C_{2-10}$ alkenyl group, and at least one of $R^{14}$ and $R^{15}$ is not hydrogen; $R^{18}$, $R^{19}$, $R^{20}$ and $R^{21}$ are independently hydrogen, $C_{3-10}$ alkyl group, or $C_{2-10}$ alkenyl group, and at least one of $R^{18}$, $R^{19}$, $R^{20}$ and $R^{21}$ is not hydrogen; and $R^{25}$ is independently hydrogen, $C_{3-10}$ alkyl group, or $C_{2-10}$ alkenyl group, and at least one of $R^{25}$ is not hydrogen.

3. The polymer as claimed in claim 1, wherein the first repeating unit is

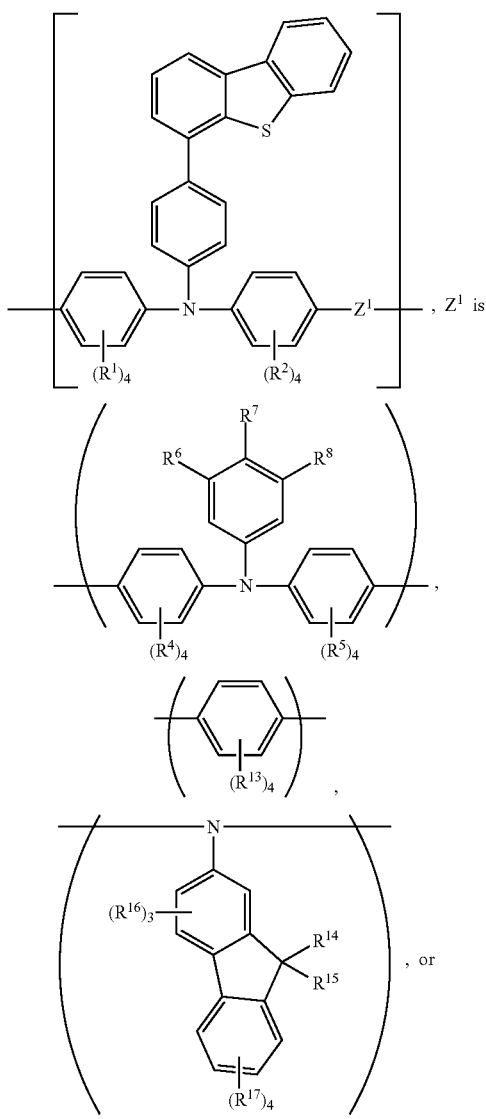

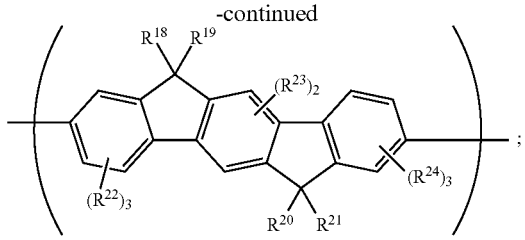

$R^4$, $R^5$, $R^{16}$, $R^{17}$, $R^{22}$, $R^{23}$ and $R^{24}$ are independently hydrogen, halogen, or $C_{1-2}$ alkyl group; $R^6$, $R^7$ and $R^8$ are independently hydrogen,

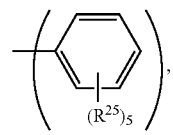

$C_{3-10}$ alkyl group, or $C_{2-10}$ alkenyl group, and at least one of $R^6$, $R^7$ and $R^8$ is not hydrogen; $R^{13}$ is independently hydrogen, $C_{3-10}$ alkyl group, or $C_{2-10}$ alkenyl group, and at least one of $R^{13}$ is not hydrogen; $R^{14}$ and $R^{15}$ are independently hydrogen, $C_{3-10}$ alkyl group, or $C_{2-10}$ alkenyl group, and at least one of $R^{14}$ and $R^{15}$ is not hydrogen; $R^{18}$, $R^{19}$, $R^{20}$ and $R^{21}$ are independently hydrogen, $C_{3-10}$ alkyl group, or $C_{2-10}$ alkenyl group, and at least one of $R^{18}$, $R^{19}$, $R^{20}$ and $R^{21}$ is not hydrogen; and $R^{25}$ is independently hydrogen, $C_{3-10}$ alkyl group, or $C_{2-10}$ alkenyl group, and at least one of $R^{25}$ is not hydrogen.

4. The polymer as claimed in claim 1, wherein the first repeating unit is

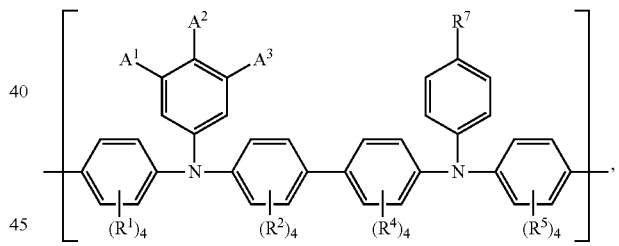

$A^1$, $A^2$ and $A^3$ are independently hydrogen,

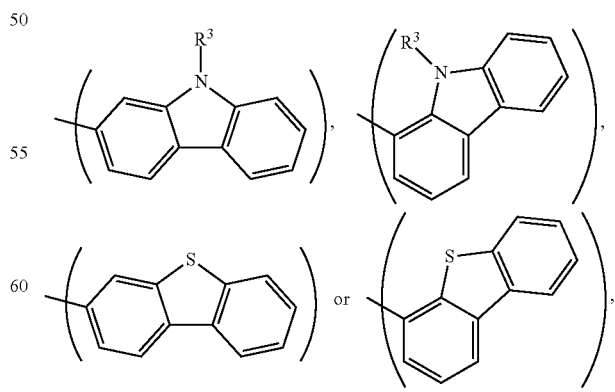

and at least one of $A^1$, $A^2$ and $A^3$ is not hydrogen; $R^1$ and $R^2$ are independently hydrogen, halogen, or $C_{1-2}$ alkyl group;

$R^3$ is hydrogen, phenyl group, biphenyl group, naphthyl group; $R^4$ and $R^5$ are independently hydrogen, halogen, or $C_{1-2}$ alkyl group; $R^7$ is

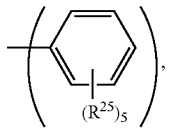

$C_{3-10}$ alkyl group, or $C_{2-10}$ alkenyl group; and $R^{25}$ is independently hydrogen, $C_{3-10}$ alkyl group, or $C_{2-10}$ alkenyl group, and at least one of $R^{25}$ is not hydrogen.

5. The polymer as claimed in claim 1, wherein the first repeating unit is

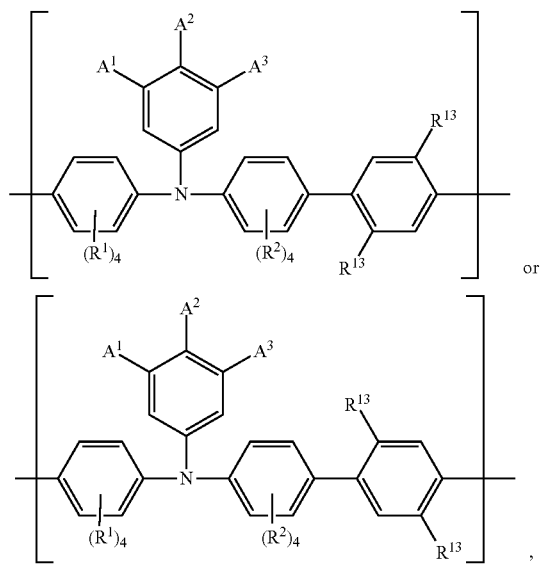

$A^1$ $A^2$ and $A^3$ are independently hydrogen,

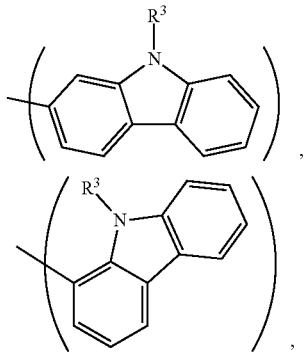

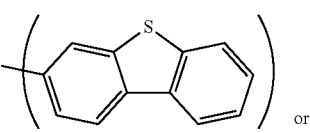

or

-continued

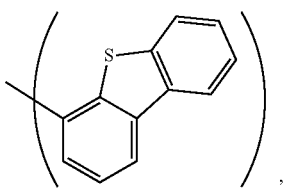

and at least one of $A^1$, $A^2$ and $A^3$ is not hydrogen; $R^1$ and $R^2$ are independently hydrogen, halogen, or $C_{1-2}$ alkyl group; $R^3$ is hydrogen, phenyl group, biphenyl group, naphthyl group; and $R^{13}$ is independently $C_{3-10}$ alkyl group, or $C_{2-10}$ alkenyl group.

6. The polymer as claimed in claim 1, wherein the first repeating unit is

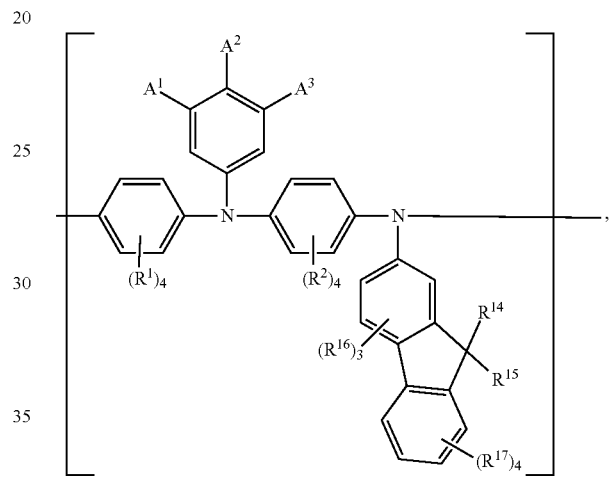

$A^1$, $A^2$ and $A^3$ are independently hydrogen,

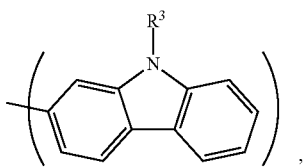

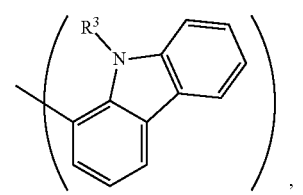

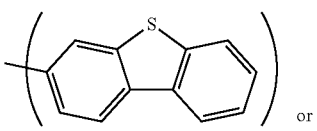

or

-continued

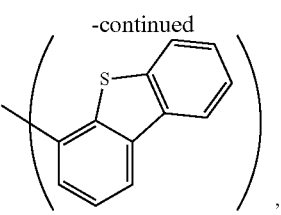

and at least one of $A^1$, $A^2$ and $A^3$ s not hydrogen; $R^1$ and $R^2$ are independently hydrogen, halogen, or $C_{1-2}$ alkyl group; $R^3$ is hydrogen, phenyl group, biphenyl group, naphthyl group; $R^{16}$ and $R^{17}$ are independently hydrogen, halogen, or $C_{1-2}$ alkyl group; and $R^{14}$ and $R^{15}$ are independently $C_{3-10}$ alkyl group, or $C_{2-10}$ alkenyl group.

7. The polymer as claimed in claim 1, wherein the first repeating unit is

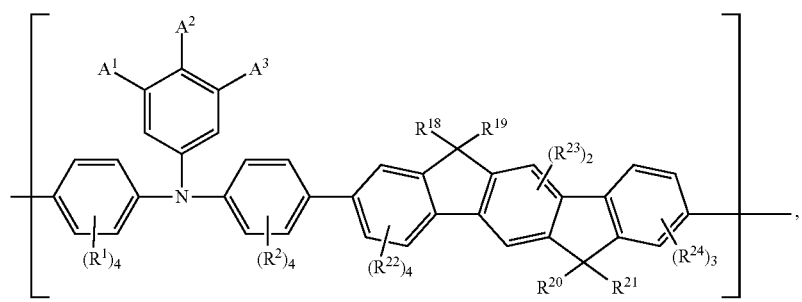

$A^1$, $A^2$, $A^3$ are independently hydrogen,

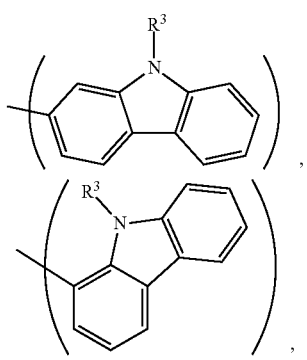

or and at least one of $A^1$, $A^2$ and $A^3$ is not hydrogen; $R^1$ and $R^2$ are independently hydrogen, halogen, or $C_{1-2}$ alkyl group; $R^3$ is hydrogen, phenyl group, biphenyl group, naphthyl group; $R^{22}$, $R^{23}$ and $R^{24}$ are independently hydrogen, halogen, or $C_{1-2}$ alkyl group; and $R^{18}$, $R^{19}$, $R^{20}$ and $R^{21}$ are independently hydrogen, $C_{3-10}$ alkyl group, or $C_{2-10}$ alkenyl group, and at least one of $R^{18}$, $R^{19}$, $R^{20}$ and $R^{21}$ is not hydrogen.

8. The polymer as claimed in claim 1, wherein the polymer further comprises a second repeating unit, wherein the second repeating unit has a structure represented by Formula (II):

Formula (II)

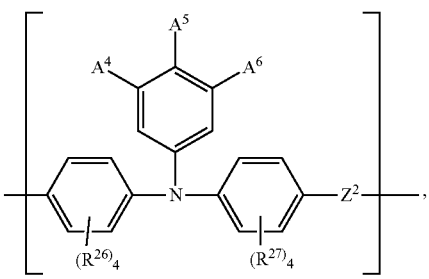

wherein $A^4$, $A^5$ and $A^6$ are independently hydrogen,

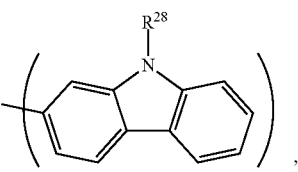

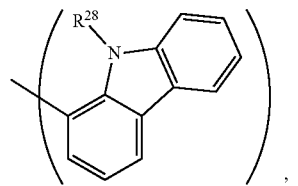

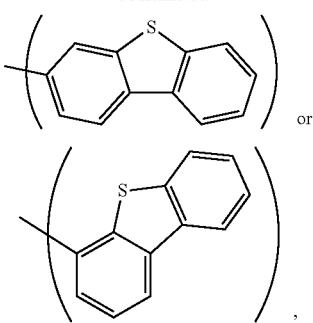 or

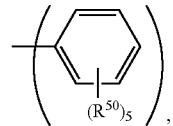, and at least one of A⁴, A⁵ and A⁶ is not hydrogen; R²⁶ and R²⁷ are independently hydrogen, halogen, or C$_{1-2}$ alkyl group; R²⁸ is hydrogen, phenyl group, biphenyl group, naphthyl group; Z² is $C_{3-10}$ alkyl group, or $C_{2-10}$ alkenyl group, and at least one of R³¹, R³² and R³³ is not hydrogen; R³⁸ are independently hydrogen, $C_{3-10}$ alkyl group, or $C_{2-10}$ alkenyl group, and at least one of R³⁸ is not hydrogen; R³⁹ and R⁴⁰ are independently hydrogen, $C_{3-10}$ alkyl group, or $C_{2-10}$ alkenyl group, and at least one of R¹⁴ and R¹⁵ is not hydrogen; R⁴³, R⁴⁴, R⁴⁵ and R⁴⁶ are independently hydrogen, $C_{3-10}$ alkyl group, or $C_{2-10}$ alkenyl group, and at least one of R⁴³, R⁴⁴, R⁴⁵ and R⁴⁶ is not hydrogen; and R⁵⁰ is independently hydrogen, $C_{3-10}$ alkyl group, or $C_{2-10}$ alkenyl group, and at least one of R⁵⁰ is not hydrogen, wherein the first repeating unit is distinct from the second repeating unit.

9. The polymer as claimed in claim 8, wherein the amount ratio of the first repeating unit to the second repeating unit is 1:99 to 99:1.

10. The polymer as claimed in claim 8, wherein the first repeating unit is

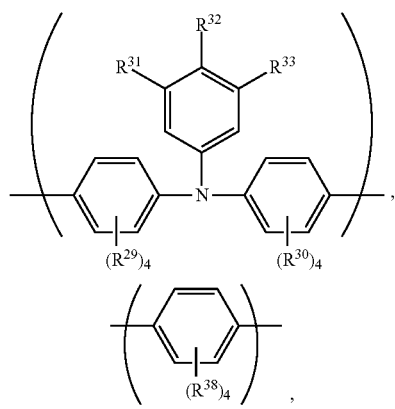,

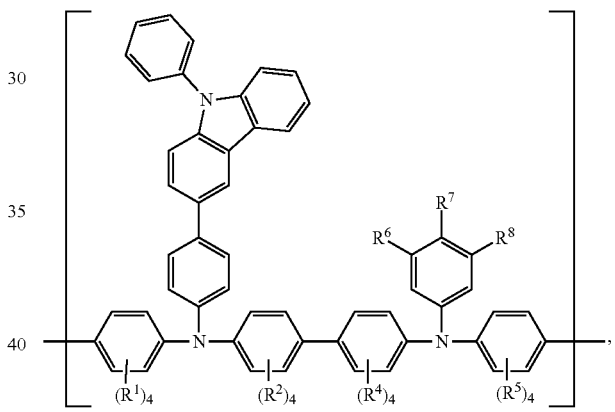

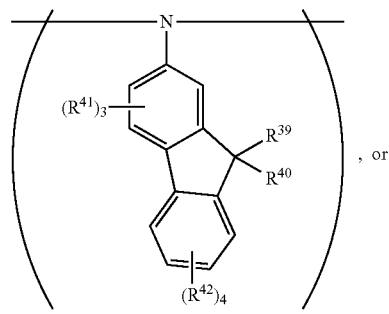, or and the second repeating unit is

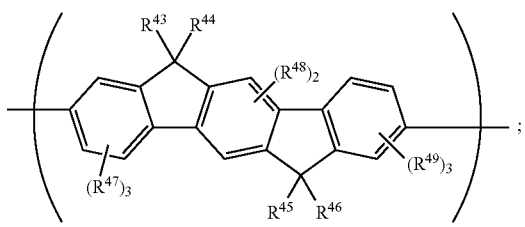;

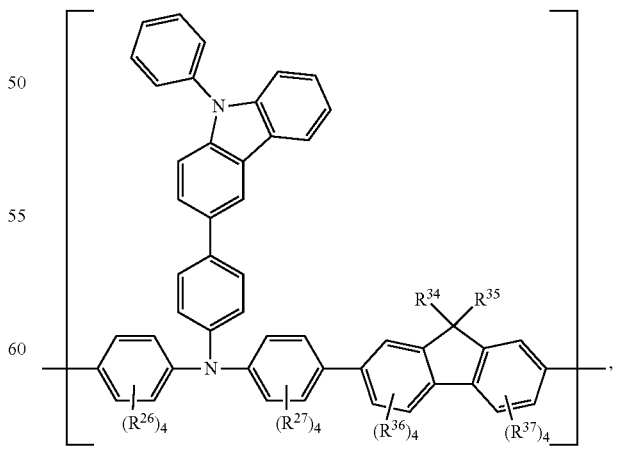,

R²⁹, R³⁰, R⁴¹, R⁴², R⁴⁷, R⁴⁸ and R⁴⁹ are independently hydrogen, halogen, or C$_{1-2}$ alkyl group; R³¹, R³² and R³³ are independently hydrogen, R¹, R², R⁴ and R⁵ are independently hydrogen, halogen, or C$_{1-2}$ alkyl group; R⁶, R⁷ and R⁸ are independently hydrogen,

91

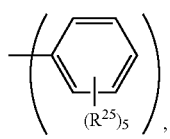

$C_{3-10}$ alkyl group, or $C_{2-10}$ alkenyl group, and at least one of $R^6$, $R^7$ and $R^8$ is not hydrogen; $R^{25}$ is independently hydrogen, $C_{3-10}$ alkyl group, or $C_{2-10}$ alkenyl group, and at least one of $R^{25}$ is not hydrogen; $R^{26}$, $R^{27}$, $R^{36}$ and $R^{37}$ are independently hydrogen, halogen, or $C_{1-2}$ alkyl group; and $R^{34}$ and $R^{35}$ are independently hydrogen, $C_{3-10}$ alkyl group, or $C_{2-10}$ alkenyl group, and at least one of $R^{34}$ and $R^{35}$ is not hydrogen.

11. The polymer as claimed in claim 8, wherein the first repeating unit is

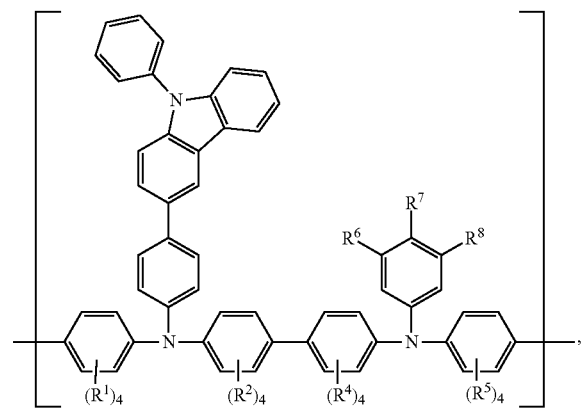

and the second repeating unit is

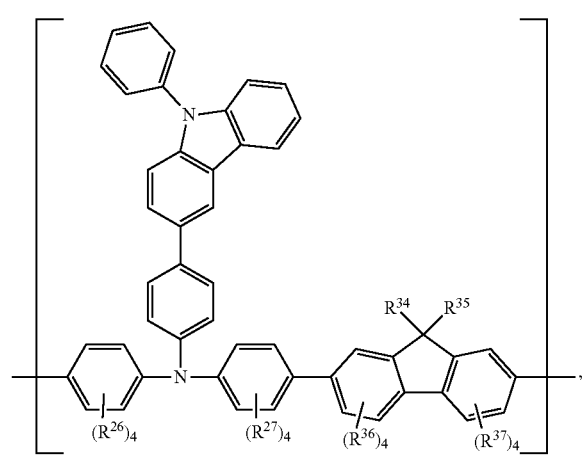

$R^1$, $R^2$, $R^4$ and $R^5$ are independently hydrogen, halogen, or C1-2 alkyl group; $R^6$, $R^7$ and $R^8$ are independently hydrogen,

92

$C_{3-10}$ alkyl group, or $C_{2-10}$ alkenyl group, and at least one of $R^6$, $R^7$ and $R^8$ is not hydrogen; $R^{25}$ is independently hydrogen, $C_{3-10}$ alkyl group, or $C_{2-10}$ alkenyl group, and at least one of $R^{25}$ is not hydrogen; $R^{26}$, $R^{27}$, $R^{36}$ and $R^{37}$ are independently hydrogen, halogen, or C1-2 alkyl group; and $R^{34}$ and $R^{35}$ are independently hydrogen, $C_{3-10}$ alkyl group, or $C_{2-10}$ alkenyl group, and at least one of $R^{34}$ and $R^{35}$ is not hydrogen.

12. The polymer as claimed in claim 8, wherein the first repeating unit is

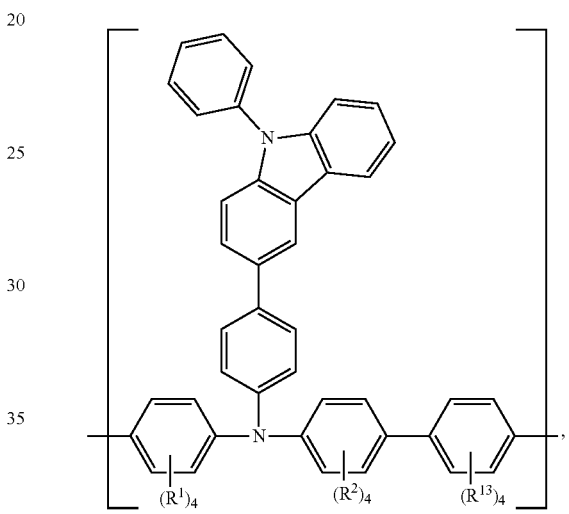

and the second repeating unit is

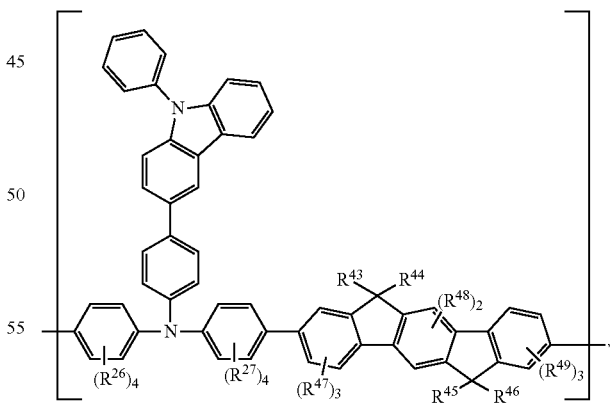

wherein $R^1$ and $R^2$ are independently hydrogen, halogen, or $C_{1-2}$ alkyl group; $R^{13}$ is independently hydrogen, $C_{3-10}$ alkyl group, or $C_{2-10}$ alkenyl group, and at least one of $R^{13}$ is not hydrogen; $R^{26}$, $R^{27}$, $R^{47}$, $R^{48}$ and $R^{49}$ are independently hydrogen, halogen, or $C_{1-2}$ alkyl group; and $R^{43}$, $R^{44}$, $R^{45}$ and $R^{46}$ are independently hydrogen, $C_{3-10}$ alkyl group, or $C_{2-10}$ alkenyl group, and at least one of $R^{43}$, $R^{44}$, $R^{45}$ and $R^{46}$ is not hydrogen.

13. The polymer as claimed in claim 8, wherein the first repeating unit is

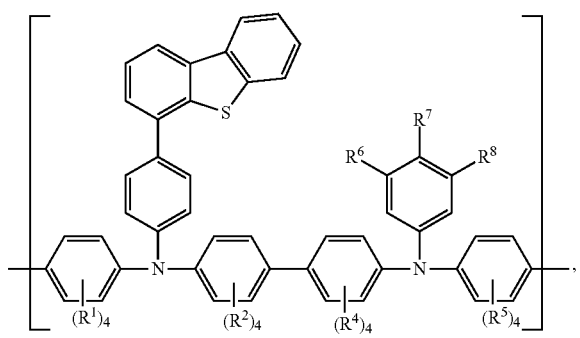

and the second repeating unit is

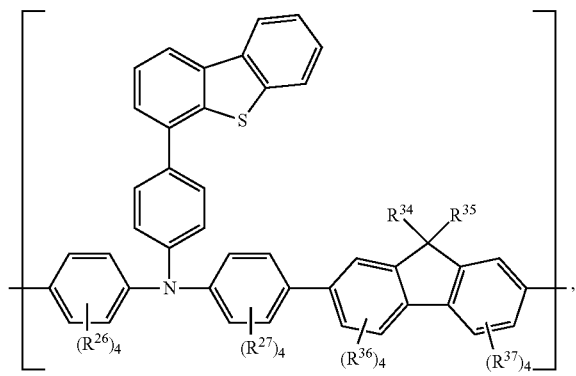

wherein $R^1$, $R^2$, $R^4$ and $R^5$ are independently hydrogen, halogen, or C1-2 alkyl group; $R^6$, $R^7$ and $R^8$ are independently hydrogen,

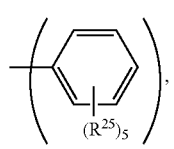

$C_{3-10}$ alkyl group, or $C_{2-10}$ alkenyl group, and at least one of $R^6$, $R^7$ and $R^8$ is not hydrogen; $R^{25}$ is independently hydrogen, $C_{3-10}$ alkyl group, or $C_{2-10}$ alkenyl group, and at least one of $R^{25}$ is not hydrogen; $R^{26}$, $R^{27}$, $R^{36}$ and $R^{37}$ are independently hydrogen, halogen, or $C_{1-2}$ alkyl group; and $R^{34}$ and $R^{35}$ are independently hydrogen, $C_{3-10}$ alkyl group, or $C_{2-10}$ alkenyl group, and at least one of $R^{34}$ and $R^{35}$ is not hydrogen.

14. The polymer as claimed in claim 8, wherein the first repeating unit is

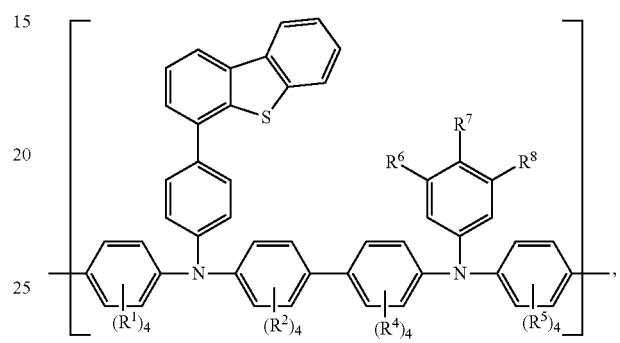

and the second repeating unit is

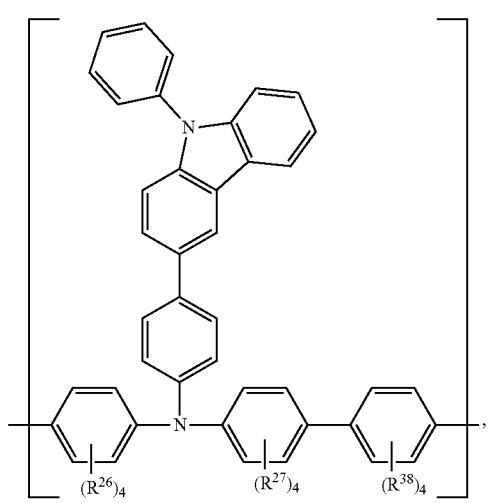

wherein $R^1$, $R^2$, $R^4$ and $R^5$ are independently hydrogen, halogen, or C1-2 alkyl group; $R^6$, $R^7$ and $R^8$ are independently hydrogen,

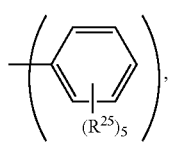

$C_{3-10}$ alkyl group, or $C_{2-10}$ alkenyl group, and at least one of $R^6$, $R^7$ and $R^8$ is not hydrogen; $R^{25}$ is independently hydrogen, $C_{3-10}$ alkyl group, or $C_{2-10}$ alkenyl group, and at least one of $R^{25}$ is not hydrogen; and $R^{38}$ is independently hydrogen, $C_{3-10}$ alkyl group, or $C_{2-10}$ alkenyl group, and at least one of $R^{38}$ is not hydrogen.

15. The polymer as claimed in claim 9, wherein the first repeating unit is

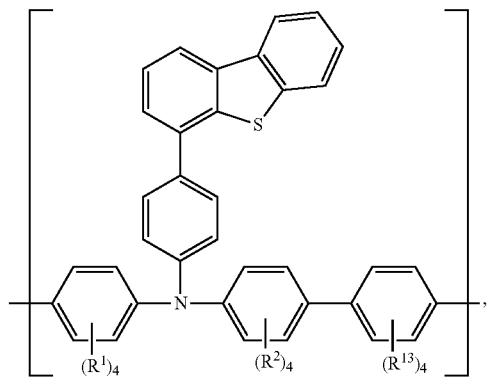

and the second repeating unit is

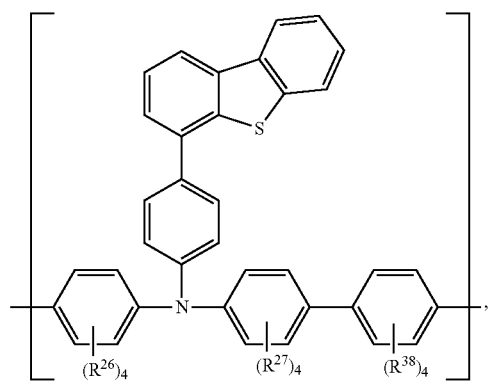

wherein $R^1$ and $R^2$ are independently hydrogen, halogen, or $C_{1-2}$ alkyl group; $R^{13}$ is independently hydrogen, $C_{3-10}$ alkyl group, or $C_{2-10}$ alkenyl group, and at least one of $R^{13}$ is not hydrogen; $R^{26}$ and $R^{27}$ are independently hydrogen, halogen, or $C_{1-2}$ alkyl group; and $R^{38}$ is independently hydrogen, $C_{3-10}$ alkyl group, or $C_{2-10}$ alkenyl group, and at least one of $R^{38}$ is not hydrogen.

16. A light-emitting device, comprising:
a pair of electrodes; and
a light-emitting element disposed between the electrodes, wherein the light-emitting element comprises the polymer as claimed in claim 1.

* * * * *